United States Patent
Iida et al.

(10) Patent No.: US 11,133,420 B2
(45) Date of Patent: Sep. 28, 2021

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Yuta Iida, Kanagawa (JP); Ryota Hodo, Kanagawa (JP); Kentaro Sugaya, Kanagawa (JP); Ryu Komatsu, Kanagawa (JP); Toshiya Endo, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/954,585

(22) PCT Filed: Dec. 19, 2018

(86) PCT No.: PCT/IB2018/060303
§ 371 (c)(1),
(2) Date: Jun. 17, 2020

(87) PCT Pub. No.: WO2019/130161
PCT Pub. Date: Jul. 4, 2019

(65) Prior Publication Data
US 2020/0335630 A1    Oct. 22, 2020

(30) Foreign Application Priority Data
Dec. 27, 2017    (JP) .............................. JP2017-251585

(51) Int. Cl.
*H01L 29/786* (2006.01)
*H01L 27/105* (2006.01)
(Continued)

(52) U.S. Cl.
CPC ...... *H01L 29/7869* (2013.01); *H01L 21/0228* (2013.01); *H01L 21/02181* (2013.01);
(Continued)

(58) Field of Classification Search
CPC ................. H01L 29/7869; H01L 29/24; H01L 29/66969; H01L 29/78648;
(Continued)

(56) References Cited

U.S. PATENT DOCUMENTS 9,530,856 B2    12/2016  Miyairi
9,698,277 B2    7/2017   Yamazaki et al.
(Continued)

FOREIGN PATENT DOCUMENTS

CN    105849875 A    8/2016
CN    107004722 A    8/2017
(Continued)

OTHER PUBLICATIONS

International Search Report (Application No. PCT/IB2018/060303) dated Mar. 19, 2019.
(Continued)

*Primary Examiner* — Tong-Ho Kim
(74) *Attorney, Agent, or Firm* — Fish & Richardson P.C.

(57) ABSTRACT

A semiconductor device with high on-state current is provided. The semiconductor device including a first oxide; a first conductor and a second conductor that are positioned over the first oxide; a third conductor positioned to cover the first conductor; a fourth conductor positioned to cover the second conductor; a first insulator having an opening overlapping with a region between the third conductor and the fourth conductor; a fifth conductor positioned in the opening; a second insulator positioned between the fifth conductor, and the first oxide and the first insulator; a second oxide positioned between the second insulator, and the first oxide
(Continued)

and the first insulator; and a third insulator that is positioned between the second oxide, and the third conductor and the fourth conductor, and the first insulator and does not overlap with the first oxide in the region sandwiched between the third conductor and the fourth conductor, where the third conductor and the fourth conductor each have a region overlapping with the fifth conductor.

15 Claims, 22 Drawing Sheets

(51) Int. Cl.
    *H01L 27/12*     (2006.01)
    *H01L 29/24*     (2006.01)
    *H01L 21/02*     (2006.01)
    *H01L 21/443*     (2006.01)
    *H01L 29/66*     (2006.01)

(52) U.S. Cl.
    CPC ...... *H01L 21/02565* (2013.01); *H01L 21/443* (2013.01); *H01L 27/1052* (2013.01); *H01L 27/124* (2013.01); *H01L 27/1207* (2013.01); *H01L 27/1225* (2013.01); *H01L 27/1255* (2013.01); *H01L 29/24* (2013.01); *H01L 29/66969* (2013.01); *H01L 29/78648* (2013.01); *H01L 29/78696* (2013.01)

(58) Field of Classification Search
    CPC ........... H01L 29/78696; H01L 27/1052; H01L 27/1207; H01L 27/1225; H01L 27/124; H01L 27/1255; H01L 21/02181; H01L 21/0228; H01L 21/02565; H01L 21/443
    USPC ......................................................... 257/43
    See application file for complete search history.

(56) References Cited

U.S. PATENT DOCUMENTS

| | | |
|---|---|---|
| 9,865,712 B2 | 1/2018 | Okamoto et al. |
| 9,954,112 B2 | 4/2018 | Asami et al. |
| 9,954,113 B2 | 4/2018 | Shimomura et al. |
| 9,966,473 B2 | 5/2018 | Endo |
| 1,018,153 A1 | 1/2019 | Sasagawa et al. |
| 10,290,745 B2 | 5/2019 | Yamazaki et al. |
| 10,446,671 B2 | 10/2019 | Okamoto et al. |
| 10,546,958 B2 | 1/2020 | Endo |
| 2015/0187898 A1 | 7/2015 | Miyairi |
| 2016/0172500 A1 | 6/2016 | Yamazaki et al. |
| 2016/0260822 A1 | 9/2016 | Okamoto et al. |
| 2016/0336454 A1 | 11/2016 | Endo |
| 2016/0372606 A1 | 12/2016 | Ito et al. |
| 2017/0025548 A1 | 1/2017 | Yamazaki |
| 2019/0378918 A1 | 12/2019 | Okamoto et al. |
| 2021/0119052 A1* | 4/2021 | Yamazaki ............... H01L 29/22 |

FOREIGN PATENT DOCUMENTS

| | | |
|---|---|---|
| JP | 2015-144251 A | 8/2015 |
| JP | 2016-157937 A | 9/2016 |
| JP | 2016-167584 A | 9/2016 |
| JP | 2016157937 A * | 9/2016 |
| JP | 2016-197708 A | 11/2016 |
| JP | 2016-213468 A | 12/2016 |
| JP | 2018-022713 A | 2/2018 |
| KR | 2016-0102196 A | 8/2016 |
| KR | 2018-0020157 A | 2/2018 |
| TW | 201533903 | 9/2015 |
| TW | 201633548 | 9/2016 |
| TW | 201642472 | 12/2016 |
| TW | 201707215 | 2/2017 |
| TW | 201709346 | 3/2017 |
| WO | WO-2015/097633 | 7/2015 |
| WO | WO-2016/092427 | 6/2016 |
| WO | WO-2016/139548 | 9/2016 |
| WO | WO-2016/203354 | 12/2016 |

OTHER PUBLICATIONS

Written Opinion (Application No. PCT/IB2018/060303) dated Mar. 19, 2019.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

\* cited by examiner

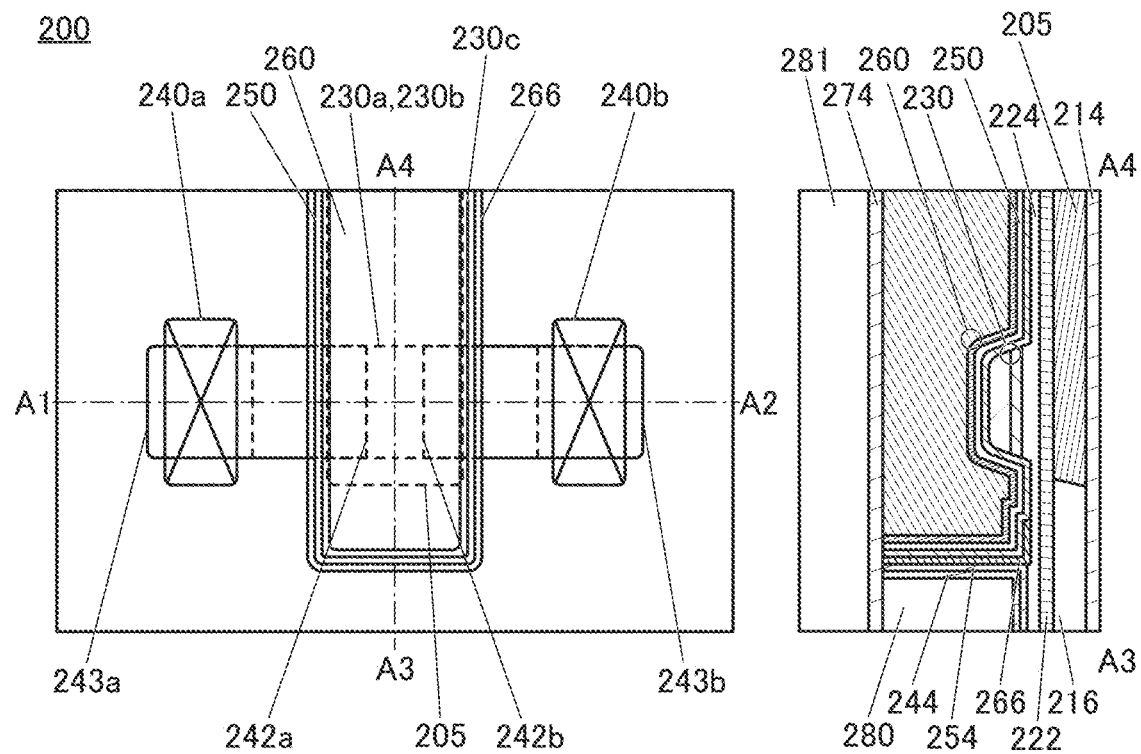
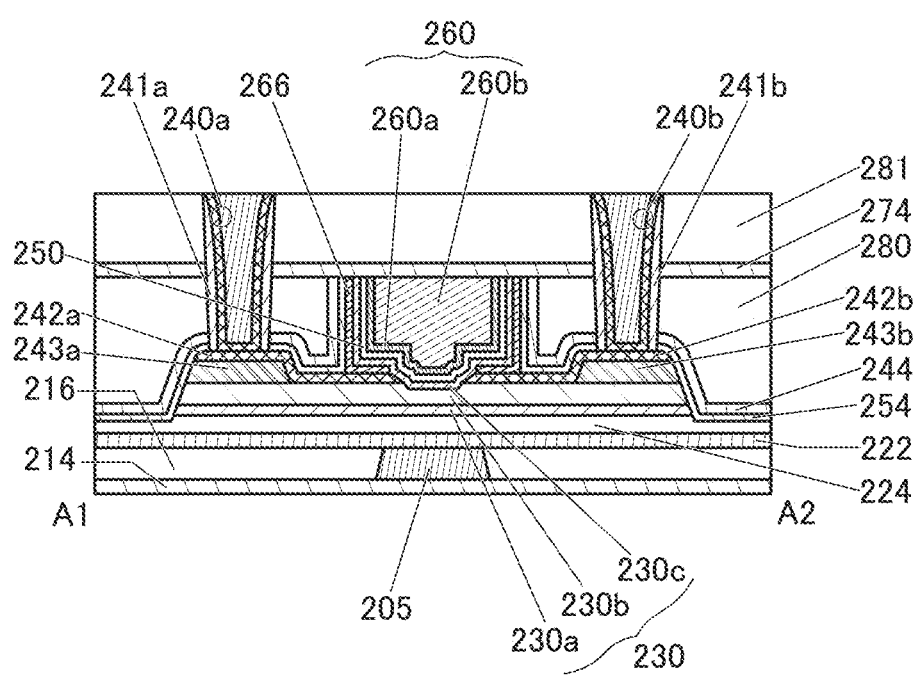

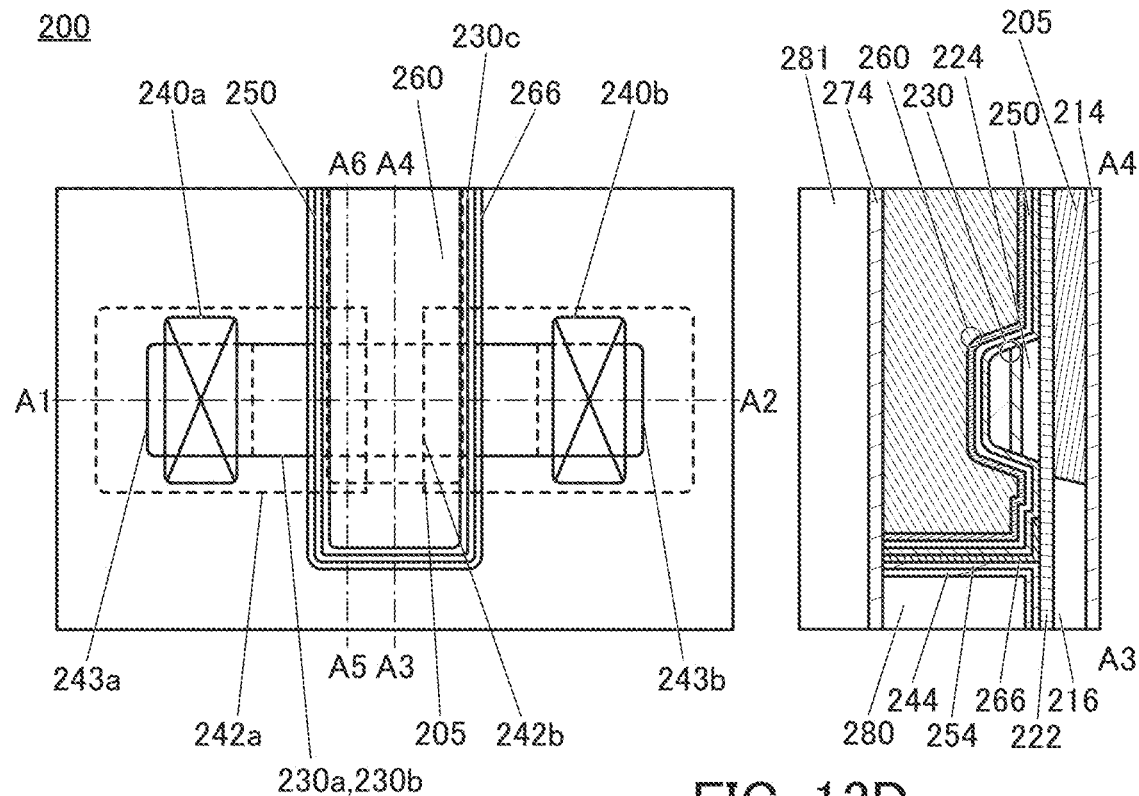
FIG. 13A
FIG. 13C
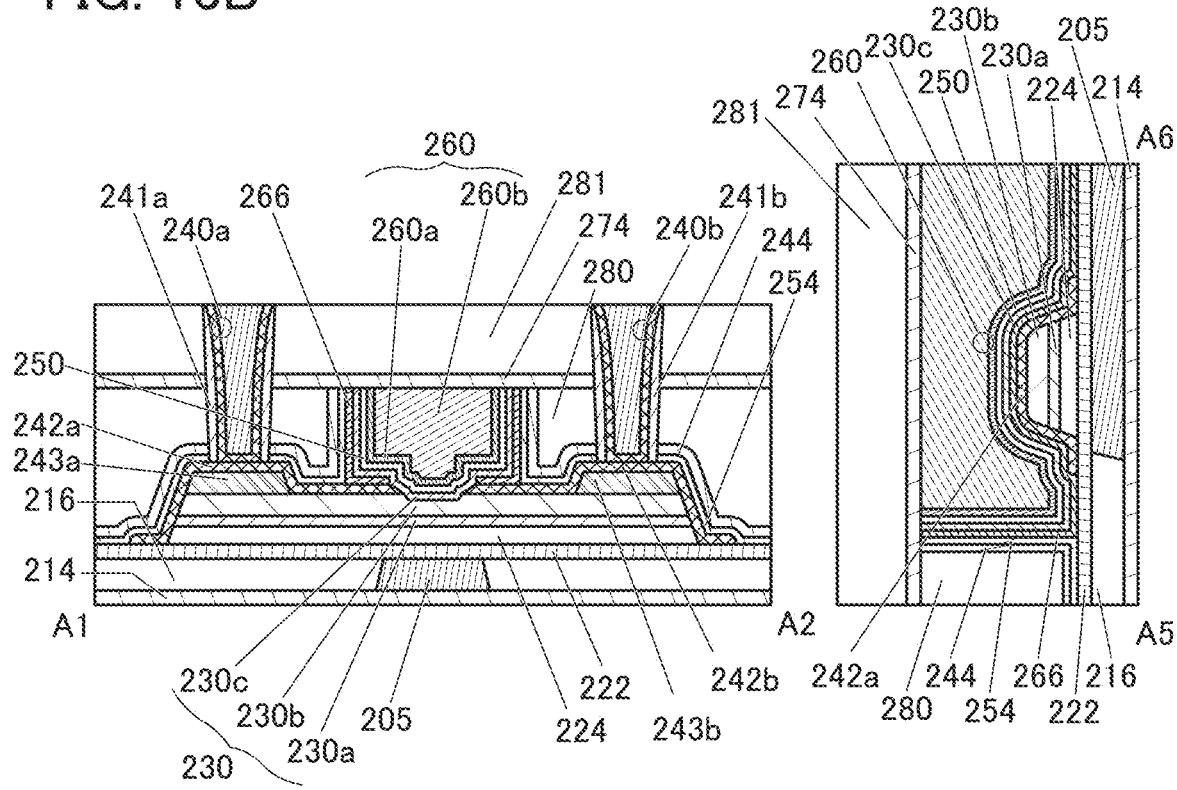
FIG. 13B
FIG. 13D

FIG. 19A
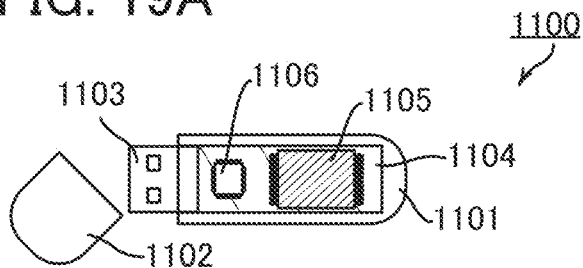
FIG. 19B   FIG. 19C
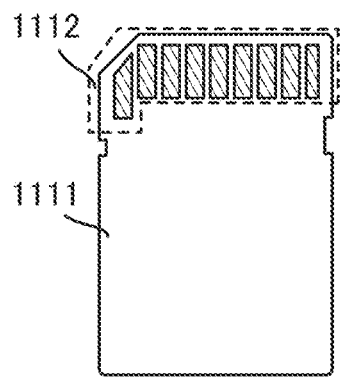 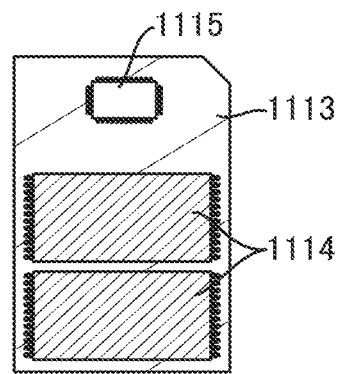
FIG. 19D   FIG. 19E
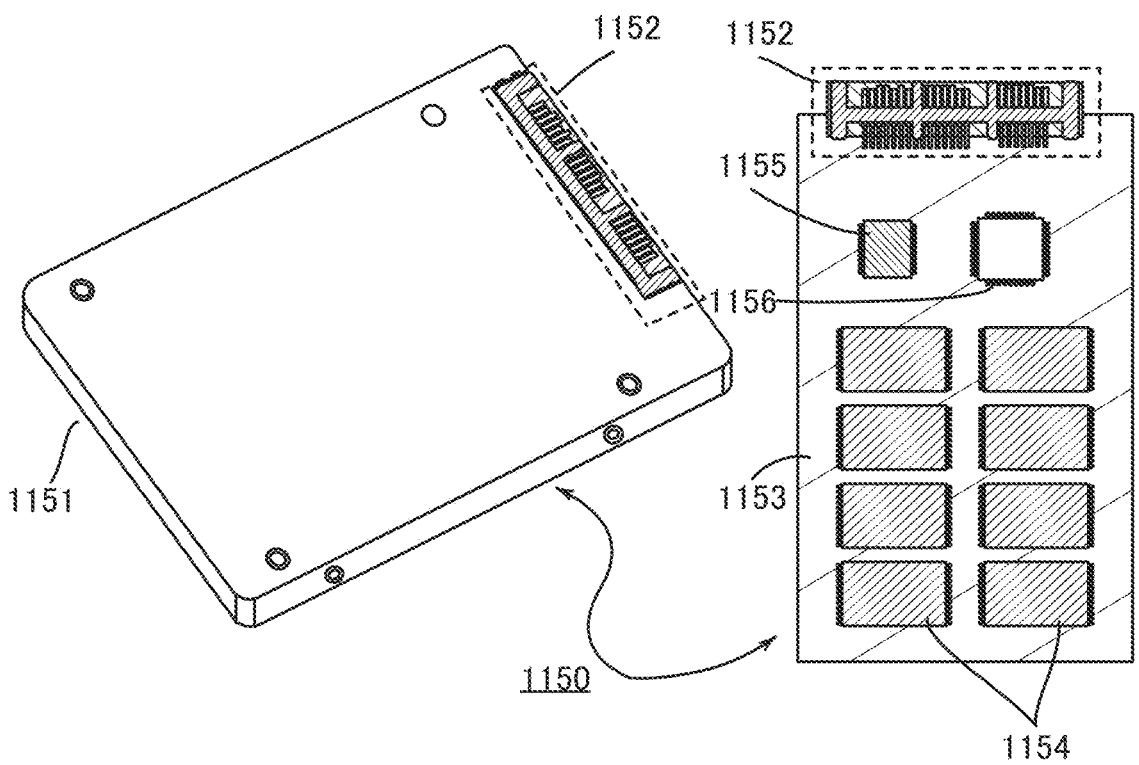

FIG. 20A
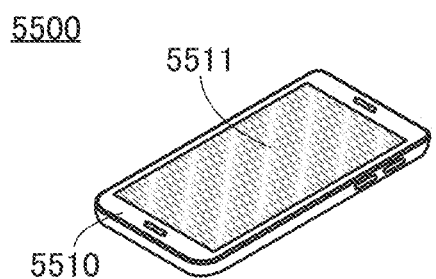
FIG. 20B
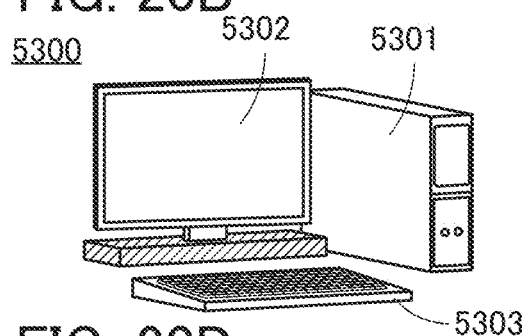
FIG. 20C
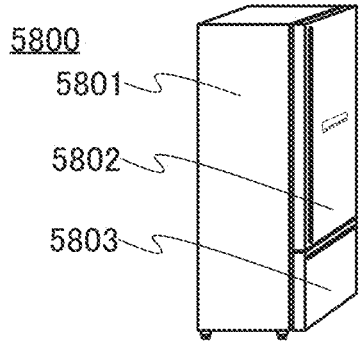
FIG. 20D
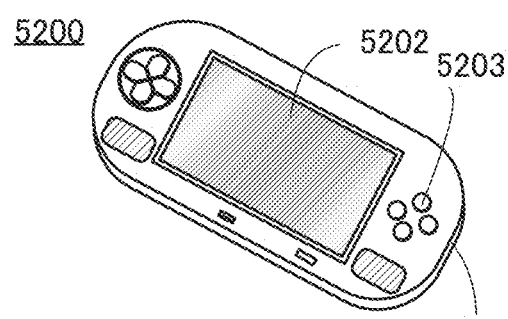
FIG. 20E1
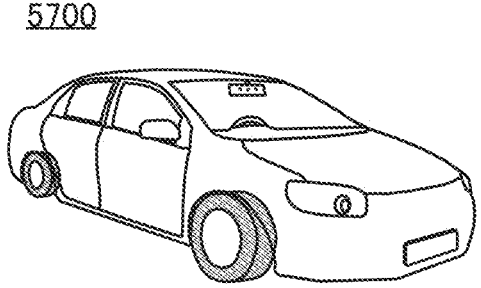
FIG. 20E2
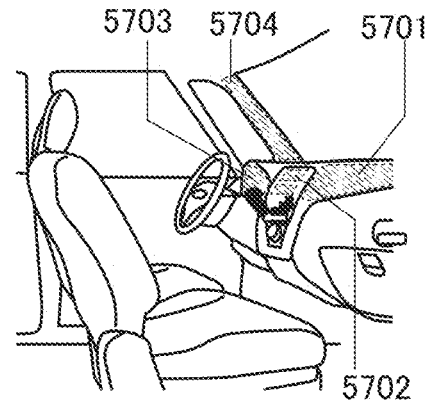
FIG. 20F
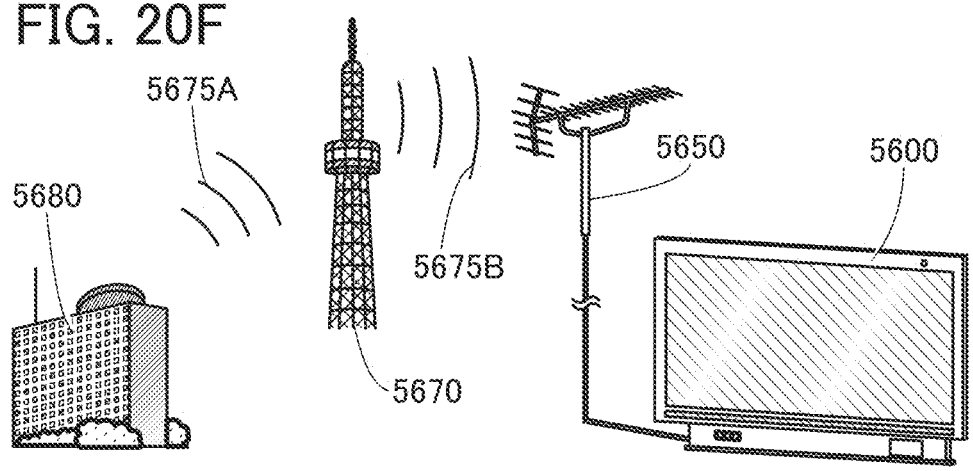

SEMICONDUCTOR DEVICE AND METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2018/060303, filed on Dec. 19, 2018, which is incorporated by reference and claims the benefit of a foreign priority application filed in Japan on Dec. 27, 2017, as Application No. 2017-251585.

TECHNICAL FIELD

One embodiment of the present invention relates to a semiconductor device and a method for manufacturing the semiconductor device. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

As semiconductor thin films applicable to the transistors, silicon-based semiconductor materials have been widely known, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Documents 1 to 3). In Non-Patent Documents 1 and 2, a technique for forming a transistor using an oxide semiconductor having the CAAC structure is disclosed. Moreover, Non-Patent Documents 4 and 5 disclose that a fine crystal is included even in an oxide semiconductor which has lower crystallinity than an oxide semiconductor having the CAAC structure or the nc structure.

In addition, a transistor which includes IGZO as an active layer has an extremely low off-state current (see Non-Patent Document 6), and an LSI and a display utilizing the characteristics have been reported (see Non-Patent Documents 7 and 8).

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

[Non-Patent Document 3] S. Ito et al., "The Proceedings of AM-FPD'13 Digest of Technical Papers", 2013, p. 151-154

[Non-Patent Document 4] S. Yamazaki et al., "ECS Journal of Solid State Science and Technology", 2014, volume 3, issue 9, p. Q3012-Q3022

[Non-Patent Document 5] S. Yamazaki, "ECS Transactions", 2014, volume 64, issue 10, p. 155-164

[Non-Patent Document 6] K. Kato et al., "Japanese Journal of Applied Physics", 2012, volume 51, p. 021201-1-021201-7

[Non-Patent Document 7] S. Matsuda et al., "2015 Symposium on VLSI Technology Digest of Technical Papers", 2015, p. T216-T217

[Non-Patent Document 8] S. Amano et al., "SID Symposium Digest of Technical Papers", 2010, volume 41, issue 1, p. 626-629

SUMMARY OF THE INVENTION

Problems to be Solved by the Invention

An object of one embodiment of the present invention is to provide a highly reliable semiconductor device. Another object of one embodiment of the present invention is to provide a semiconductor device with high on-state current. Another object of one embodiment of the present invention is to provide a semiconductor device with high frequency characteristics. Another object of one embodiment of the present invention is to provide a semiconductor device that can be miniaturized or highly integrated. Another object of one embodiment of the present invention is to provide a semiconductor device with favorable electrical characteristics. Another object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a semiconductor device capable of reducing power consumption. An object of one embodiment of the present invention is to provide a novel semiconductor device.

Note that the descriptions of these objects do not disturb the existence of other objects. One embodiment of the present invention does not have to achieve all the objects. Other objects will be apparent from and can be derived from the description of the specification, the drawings, the claims, and the like.

Means for Solving the Problems

One embodiment of the present invention is a semiconductor device including a first oxide; a first conductor and a second conductor that are positioned to be separated from each other over the first oxide; a third conductor that is positioned to be in contact with a top surface and a side surface of the first conductor and a top surface of the first oxide; a fourth conductor that is positioned to be in contact with a top surface and a side surface of the second conductor and the top surface of the first oxide; a first insulator that is positioned over the third conductor and the fourth conductor and has an opening overlapping with a region between the third conductor and the fourth conductor; a fifth conductor positioned in the opening; a second oxide that is positioned between the fifth conductor and the first oxide, the third conductor, the fourth conductor, and the first insulator; a second insulator that is positioned between the second oxide and the fifth conductor; and a third insulator that is positioned between the second oxide and the third conductor, the fourth conductor, and the first insulator and does not overlap with the first oxide in the region sandwiched between the third conductor and the fourth conductor, where the third conductor and the fourth conductor each have a region overlapping with the fifth conductor.

In the above, it is preferable that a fourth insulator be positioned between the first insulator and the first oxide, the first conductor, the second conductor, the third conductor, the fourth conductor, and the third insulator, and that the fourth insulator has lower oxygen-transmitting properties than the first insulator.

In the above, it is preferable that the fifth conductor be positioned to face the side surface of the first oxide so that the second oxide and the second insulator are positioned between the fifth conductor and the side surface of the first oxide. Furthermore, in the above, it is preferable that the thickness of third conductor be smaller than that of the first conductor and the thickness of the fourth conductor be thinner than that of the second conductor. Furthermore, in the above, the thickness of the first oxide in the region that does not overlap with the third conductor or the fourth conductor may be smaller than that of a region that overlaps with the third conductor or the fourth conductor.

Furthermore, in the above, the first oxide preferably includes In, an element M (M is Al, Ga, Y, or Sn), and Zn. Furthermore, in the above, the second oxide preferably includes an element M(M is Al, Ga, Y, or Sn), and Zn. Moreover, in the above, the second oxide may include In, an element M(M is Al, Ga, Y, or Sn), and Zn, and an atomic ratio of In to the element M in the second oxide may be lower than an atomic ratio of In to the element M in the first oxide. Moreover, in the above, the second oxide may include a first layer and a second layer over the first layer, the first layer may contain substantially the same composition as the second oxide, and the second layer may include a region whose In concentration is lower than that in the second oxide.

Another embodiment of the present invention is a method for manufacturing a semiconductor device including the following steps of: forming a first insulating film, a second insulating film, a first oxide film, a second oxide film, and a first conductive film in this order over a substrate; removing a part of the first conductive film to form a first conductor; forming a second conductive film over the second oxide film and the first conductor; processing the first oxide film, the second oxide film, the first conductor, and the second conductive film into an island shape to form a first oxide, a second oxide over the first oxide, a second conductor and a third conductor over the second oxide, and a fourth conductor over the second oxide, the second conductor, and the third conductor; forming a dummy gate layer that is over the fourth conductor and positioned between the second conductor and the third conductor; forming a third insulating film to cover the first oxide, the second oxide, the second conductor, the third conductor, the fourth conductor, and the dummy gate layer; forming a fourth insulating film over the third insulating film; removing parts of the third insulating film and the fourth insulating film until an upper part of the dummy gate layer is exposed; removing the dummy gate layer to form an opening; forming a fifth insulating film over the third insulating film, the fourth insulating film, and the fourth conductor; forming a dummy film over the fifth insulating film; removing parts of the fifth insulating film and the dummy film by anisotropic etching using an etching gas containing fluorine and carbon, thereby forming a first insulator in contact with a top surface of the fourth conductor and a side surface of the third insulating film, forming a dummy layer over the first insulator, and depositing a by-product over the dummy layer; removing a part of the fourth conductor using the first insulator, the dummy layer, and the by-product as a mask to form a fifth conductor and a sixth conductor; removing the dummy layer and the by-product by wet etching; forming a third oxide film, a sixth insulating film, and a third conductive film in this order so as to be embedded in the opening; and removing parts of the third oxide film, the sixth insulating film, and the third conductive film until an upper part of the third insulating film is exposed.

In the above, the fifth insulating film may be deposited by an ALD method and may be an oxide containing hafnium. Furthermore, in the above, the dummy film may be deposited by an ALD method and may be an oxide containing aluminum. Furthermore, in the above, the by-product may contain aluminum, fluorine, and carbon. Furthermore, in the above, an upper part of the second oxide which is sandwiched between the fifth conductor and the sixth conductor may be removed. Furthermore, in the above, the first insulating film, the second insulating film, the first oxide film, the second oxide film, and the first conductive film may be deposited without being exposed to the air with use of a multi-chamber deposition apparatus.

Effect of the Invention

According to one embodiment of the present invention, it is possible to provide a highly reliable semiconductor device. Alternatively, according to one embodiment of the present invention, it is possible to provide a semiconductor device with high on-state current. Alternatively, according to one embodiment of the present invention, it is possible to provide a semiconductor device with high frequency characteristics. Alternatively, according to one embodiment of the present invention, it is possible to provide a semiconductor device that can be miniaturized or highly integrated. Alternatively, according to one embodiment of the present invention, it is possible to provide a semiconductor device with favorable electrical characteristics. Alternatively, according to one embodiment of the present invention, it is possible to provide a semiconductor device with high productivity.

Alternatively, it is possible to provide a semiconductor device capable of retaining data for a long time. Alternatively, it is possible to provide a semiconductor device capable of high-speed data writing. Alternatively, it is possible to provide a semiconductor device with high design flexibility. Alternatively, it is possible to provide a semiconductor device capable of reducing power consumption. Alternatively, it is possible to provide a novel semiconductor device.

Note that the descriptions of the effects do not disturb the existence of other effects. One embodiment of the present invention does not have to have all of these effects. Effects other than these will be apparent from the description of the specification, the drawings, the claims, and the like and the effects other than these can be derived from the description of the specification, the drawings, the claims, and the like.

BRIEF DESCRIPTION OF THE DRAWINGS

[FIGS. 1A to 1C] A top view and cross-sectional views of a semiconductor device according to one embodiment of the present invention.

[FIGS. 13A to 13D] A top view and cross-sectional views of a semiconductor device according to one embodiment of the present invention.

[FIGS. 19A to 19E] Schematic views of a memory device according to one embodiment of the present invention.

[FIGS. 20A, 20B, 20C, 20D, 20E1, 20E2, and 20F] Views each illustrating an electronic device according to one embodiment of the present invention.

MODE FOR CARRYING OUT THE INVENTION

Figure 2A:
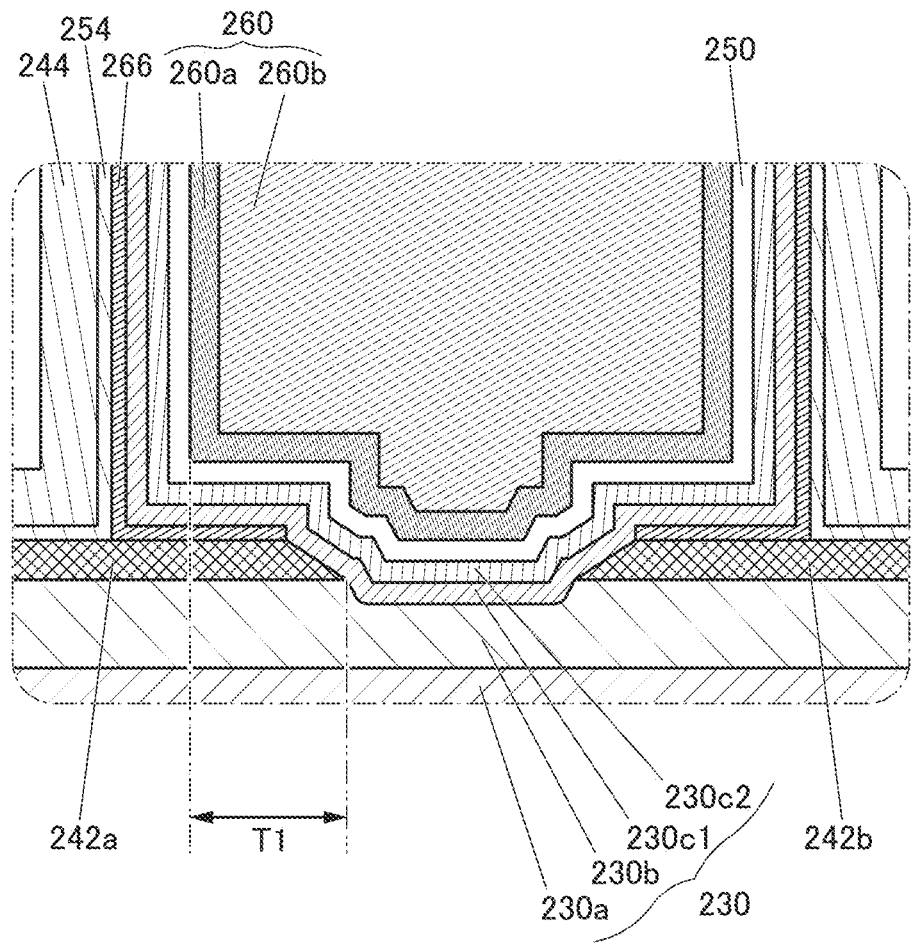
[FIGS. 2A and 2B] Cross-sectional views of a semiconductor device according to one embodiment of the present invention.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In addition, in the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

In addition, particularly in a top view (also referred to as a plan view), a perspective view, or the like, the description of some components might be omitted for easy understanding of the invention. Furthermore, some hidden lines and the like might be omitted.

In addition, in this specification and the like, ordinal numbers such as "first" and "second" are used for convenience and do not denote the order of steps or the stacking order of layers. Therefore, for example, description can be made by replacing "first" with "second," "third," or the like as appropriate. In addition, the ordinal numbers in this specification and the like do not correspond to the ordinal numbers which are used to specify one embodiment of the present invention in some cases.

In addition, in this specification and the like, terms for describing arrangement, such as "over" and "below," are used for convenience to describe the positional relationship between components with reference to drawings. Furthermore, the positional relationship between components is changed as appropriate in accordance with a direction in which the components are described. Thus, terms for the description are not limited to terms used in the specification, and description can be made appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text.

Here, X and Y each denote an object (e.g., a device, an element, a circuit, a wiring, an electrode, a terminal, a conductive film, or a layer).

In this specification, in the case where the atomic ratio of constituent elements of an oxide, a metal oxide, a compound, or the like is shown, the vicinity of the atomic ratio is also included in some cases, unless otherwise specified. Here, the vicinity of the atomic ratio includes values higher than or equal to 50% and lower than or equal to 150% of each value showing the number of atoms. For example, in the case of the atomic ratio of [A]:[B]=2:1, the vicinity of the proportion of [A] includes a value more than or equal to 1 and less than or equal to 3, and the vicinity of the proportion of [B] includes a value more than or equal to 0.5 and less than or equal to 1.5. The vicinity of the atomic ratio also includes values higher than or equal to 80% and lower than or equal to 120% of each value showing the number of atoms. For example, in the case of the atomic ratio of [A]:[B]=2:1, the vicinity of the proportion of [A] includes a value more than or equal to 1.6 and less than or equal to 2.4, and the vicinity of the proportion of [B] includes a value more than or equal to 0.8 and less than or equal to 1.2. The vicinity of the atomic ratio also includes values higher than or equal to 90% and lower than or equal to 110% of each value showing the number of atoms. For example, in the case of the atomic ratio of [A]: [B]=2:1, the vicinity of the proportion of [A] includes a value more than or equal to 1.8 and less than or equal to 2.2, and the vicinity of the proportion of [B] includes a value more than or equal to 0.9 and less than or equal to 1.1.

Furthermore, functions of a source and a drain might be interchanged with each other when a transistor of opposite polarity is employed or when the direction of current is changed in circuit operation, for example. Therefore, the terms "source" and "drain" can sometimes be interchanged with each other in this specification and the like.

Note that in this specification and the like, depending on transistor structures, channel width in a region where a channel is actually formed (hereinafter also referred to as effective channel width) is different from channel width shown in a top view of a transistor (hereinafter also referred to as apparent channel width) in some cases. For example, when a gate electrode covers a side surface of a semiconductor, effective channel width is greater than apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, effective channel width is greater than apparent channel width.

In such a case, effective channel width is sometimes difficult to estimate by actual measurement. For example, estimation of effective channel width from a design value requires assumption that the shape of a semiconductor is known. Accordingly, in the case where the shape of a semiconductor is not known accurately, it is difficult to measure effective channel width accurately.

Furthermore, in this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor might be increased or crystallinity might be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by the mixing of impurities, for example. Furthermore, when the semiconductor is silicon, examples of the impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In addition, in this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification, a barrier film means a film having a function of inhibiting the passage of oxygen and impurities such as water and hydrogen; in the case where the barrier film has conductivity, the barrier film is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS FET or an OS transistor is stated, the OS FET or the OS transistor can also be referred to as a transistor including an oxide or an oxide semiconductor.

In addition, in this specification and the like, "normally off" means that current per micrometer of channel width flowing through a transistor when a potential is not applied to a gate or a ground potential is applied to the gate is lower than or equal to $1 \times 10^{-20}$ A at room temperature, lower than or equal to $1 \times 10^{-18}$ A at 85° C., or lower than or equal to $1 \times 10^{-16}$ A at 125° C.

Embodiment 1

Specific structure examples of a semiconductor device described in the above embodiment are described below with reference to FIG. 1 to FIG. 12.

<Configuration Example of Semiconductor device>

FIG. 1(A), FIG. 1(B), and FIG. 1(C) are a top view and cross-sectional views of a transistor 200 according to one embodiment of the present invention and the periphery of the transistor 200. In addition, FIG. 2 is an enlarged view of the transistor 200.

Figure 2B:
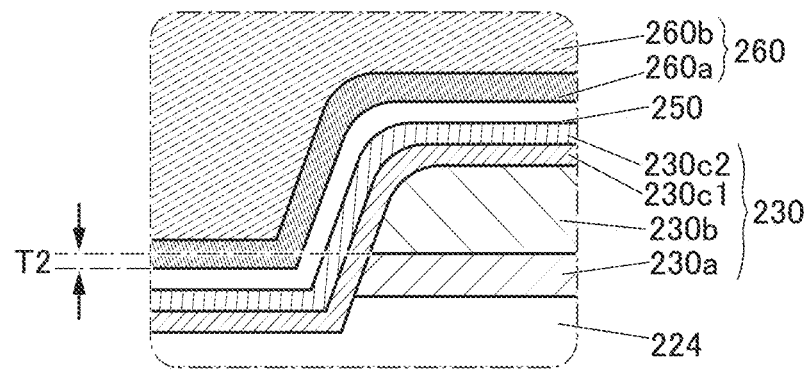

FIG. 1(A) is a top view of a semiconductor device including the transistor 200. In addition, FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. In addition, FIG. 1(C) is a cross-sectional view of a portion indicated by a dashed-dotted line A3-A4 in FIG. 1(A), and is a cross-sectional view in the channel width direction of the transistor 200. Note that for clarity of the drawing, some components are not illustrated in the top view of FIG. 1(A). Furthermore, FIG. 2(A) is an enlarged view of an oxide 230c and vicinity thereof in FIG. 1(B), and FIG. 2(B) is an enlarged view of an oxide 230 and a conductor 260, and vicinity thereof in FIG. 1(C).

[Transistor 200]

As shown in FIG. 1, the transistor 200 includes an oxide 230a that is positioned over a substrate (not illustrated); the oxide 230b that is positioned over the oxide 230a; a conductor 243a and a conductor 243b that are positioned to be separated from each other over the oxide 230b; a conductor 242a that is positioned to be in contact with a top surface and a side surface of the conductor 243a and a top surface of the oxide 230b; a conductor 242b that is positioned to be in contact with a top surface and a side surface of the conductor 243b and the top surface of the oxide 230b; an insulator 280 that is positioned over the conductor 242a and the conductor 242b and has an opening overlapping with a region between the conductor 242a and the conductor 242b; a conductor 260 positioned in the opening; an oxide 230c that is positioned between the conductor 260 and the oxide 230b, the conductor 242a, the conductor 242b, and the insulator 280; an insulator 250 that is positioned between the oxide 230c and the conductor 260; and an insulator 266 that is positioned between the oxide 230c and the conductor 242a, the conductor 242b, and the insulator 280. Here, the insulator 266 does not overlap with the oxide 230b in a region sandwiched between the conductor 242a and the conductor 242b.

Note that in the following description, the oxide 230a, the oxide 230b, and the oxide 230c might be collectively referred to as an oxide 230. In addition, the conductor 242a and the conductor 242b might be collectively referred to as a conductor 242. In addition, the conductor 243a and the conductor 243b might be collectively referred to as a conductor 243. In addition, as illustrated in FIG. 1, the conductor 260 preferably has a stacked structure including the conductor 260a provided in the insulator 250 and the conductor 260b embedded in the conductor 260a.

Note that although a structure of the transistor 200 in which three layers of the oxide 230a, the oxide 230b, and the oxide 230c are stacked in a region where a channel is formed (hereinafter also referred to as a channel formation region) and its vicinity is illustrated, the present invention is not limited thereto. For example, a two-layer structure of the oxide 230b and the oxide 230c or a stacked-layer structure of four or more layers may be employed. Alternatively, each of the oxide 230a, the oxide 230b, and the oxide 230c may have a stacked-layer structure of two or more layers. In this embodiment, as illustrated in FIG. 2, an example in which the oxide 230c has a stacked-layer structure of two layers of an oxide 230c1 and an oxide 230c2 over the oxide 230c1 is illustrated.

As illustrated in FIG. 1, an insulator 244 and an insulator 254 are preferably provided between the insulator 280, and an insulator 224, the oxide 230a, the oxide 230b, the conductor 242a, the conductor 242b, the conductor 243a, the conductor 243b, and the insulator 266. Here, as illustrated in FIGS. 1(B) and 1(C), the insulator 254 is preferably in contact with a side surface of the insulator 266, a top surface and a side surface of the conductor 242, a side surface of the conductor 243, side surfaces of the oxide 230a and the oxide 230b, and a top surface of the insulator 224. The insulator 244 is preferably provided in contact with the top surface of the insulator 254. The insulators 254 and 244 have a region positioned between the insulator 280 and the conductors 242a and 243a and a region between the insulator 280 and the conductors 242b and 243b. Alternatively, only one of the insulator 244 and the insulator 254 may be provided.

An insulator 274 is preferably provided over a top surface of the conductor 260, a top surface of the insulator 250, a top surface of the oxide 230c, a top surface of the insulator 266, a top surface of the insulator 254, a top surface of the insulator 244, and a top surface of the insulator 280. In addition, an insulator 281 functioning as an interlayer film is preferably provided over the insulator 274.

It is preferable that an insulator 222, the insulator 254, the insulator 244, and the insulator 274 have a function of inhibiting diffusion of hydrogen (e.g., at least one of a hydrogen atom, a hydrogen molecule, and the like). For example, the insulator 222, the insulator 254, the insulator 244, and the insulator 274 preferably have lower hydrogen permeability than the insulator 224, the insulator 250, and the insulator 280. In addition, it is preferable that the insulator 222, the insulator 254, and the insulator 244 have a function of inhibiting diffusion of oxygen (e.g., at least one of an oxygen atom, an oxygen molecule, and the like). For example, the insulator 222, the insulator 254, and the insulator 244 preferably have lower oxygen permeability than the insulator 224, the insulator 250, and the insulator 280.

In addition, it is preferable that the transistor 200 include an insulator 214 provided over the substrate (not illustrated); a conductor 205 provided over the insulator 214; an insulator 216 provided over the insulator 214 to be in contact with a side surface of the conductor 205; the insulator 222 provided over the insulator 216 and the conductor 205; and the insulator 224 provided over the insulator 222. At this time, the insulator 222 is preferably provided to be in contact with a top surface of the conductor 205 and a top surface of the insulator 216. The oxide 230a is preferably provided over the insulator 224.

In addition, a conductor 240 (a conductor 240a and a conductor 240b) that is electrically connected to the transistor 200 and functions as a plug is preferably provided. Note that an insulator 241 (an insulator 241a and an insulator 241b) is provided in contact with a side surface of the conductor 240 functioning as a plug. In other words, the insulator 241 is provided in contact with an inner wall of the opening in the insulator 254, the insulator 244, the insulator 280, the insulator 274, and the insulator 281. Alternatively, a structure may be employed in which a first conductor of the conductor 240 is provided in contact with a side surface of the insulator 241 and a second conductor of the conductor 240 is provided on the inner side of the first conductor. Here, a top surface of the conductor 240 and a top surface of the insulator 281 can be substantially level with each other. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a component has a stacked-layer structure, layers may be distinguished by ordinal numbers corresponding to the formation order.

In addition, in the transistor 200, as the oxide 230 (the oxide 230a, the oxide 230b, and the oxide 230c) that includes the channel formation region, a metal oxide functioning as an oxide semiconductor (hereinafter also referred to as an oxide semiconductor) is preferably used. For example, it is preferable to use a metal oxide having a bandgap more than or equal to 2 eV, preferably more than or equal to 2.5 eV as the metal oxide to be the channel formation region of the oxide 230. With use of a metal oxide having such a wide bandgap, the leakage current in a non-conduction state (off-state current) of the transistor can be extremely reduced. With use of such a transistor, a semiconductor device with low power consumption can be provided.

For example, as the oxide 230, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used for the element M. Furthermore, indium oxide, zinc oxide, an In—Ga oxide, an In—Zn oxide, a Ga—Zn oxide, or gallium oxide may be used as the oxide 230.

When impurity such as hydrogen exists in an oxide semiconductor, the carrier density is increased and the resistance is reduced in some cases. For example, there is a possibility that hydrogen entered in oxygen vacancy in the oxide semiconductor functions as a donor, thereby causing a normally-on transistor. Furthermore, there is a possibility that stress caused by a voltage and a high temperature makes hydrogen move in the oxide semiconductor, whereby electric characteristics of the transistor are changed.

Moreover, when excess oxygen is supplied to the oxide 230, the structure of the excess oxygen in the oxide 230 might be changed by the stress such as a voltage or a high temperature. Thus, the transistor including the oxide 230 might have unstable electrical characteristics or lower reliability.

However, in the transistor 200 shown in this embodiment, the insulator 224, the insulator 250, and the oxide 230 are covered with the insulator 222, the insulator 254, the insulator 244, and the insulator 274 having a barrier property against oxygen and impurities such as hydrogen as described above. Thus, in the transistor 200, the insulator 224, the oxide 230, and the insulator 250 are separated from the insulator 280 and the insulator 281 with the insulator 222, the insulator 254, the insulator 244, and the insulator 274. This can inhibit entry of impurities such as hydrogen and excess oxygen from the outside of the transistor 200, resulting in favorable electrical characteristics and high reliability of the transistor 200.

Here, the conductor 260 functions as a gate electrode of the transistor, and the conductor 242a, the conductor 243a, the conductor 242b, and the conductor 243b each function as a source electrode or a drain electrode. The oxide 230 includes a channel formation region in a region between the conductor 242a and the conductor 242b and includes a source region and a drain region in the vicinity of a region overlapping with the conductor 242a (the conductor 242b) so that the channel formation region is sandwiched between the source region and the drain region. Note that the source region and/or the drain region may have a shape in which the source region and/or the drain region extends inward from the conductor 242a (the conductor 242b). Note that the channel formation region of the transistor 200 is formed not only in the oxide 230b but also in the vicinity of the interface between the oxide 230b and the oxide 230c and/or in the oxide 230c, in some cases.

The conductor 260 is formed to be embedded in the opening of the insulator 280. Here, the positions of the conductor 260, the conductor 242a, and the conductor 242b with respect to the opening of the insulator 280 are selected in a self-aligned manner. That is, in the transistor 200, the gate electrode can be provided between the source electrode and the drain electrode in a self-aligned manner. Therefore, the conductor 260 can be formed without an alignment margin, resulting in a reduction in the area occupied by the transistor 200. Accordingly, miniaturization and high integration of the semiconductor device can be achieved.

Here, as illustrated in FIG. 2(A), the conductor 242a and the conductor 242b each have a region overlapping with the conductor 260 with the insulator 266, the oxide 230c, and the insulator 250 provided therebetween. In the oxide 230, a region overlapping with the region functions as what is called an overlap region (also referred to as an Lov region). Hereinafter, the length of the Lov region in the channel length direction is T1. For example, T1 is greater than or equal to 5 nm and less than or equal to 60 nm, preferably greater than or equal to 10 nm and less than or equal to 40 nm, further preferably greater than or equal to 10 nm and less than or equal to 20 nm.

Since there is the region where the conductor 260 overlaps with the conductor 242, an offset between the conductor 260 and the conductor 242 can be eliminated. Thus, an improvement in controllability of the transistor by a gate electric field applied to the conductor 260 can be expected.

Furthermore, when the conductors 242a and 242b overlap with the conductor 260, the distance between the conductor 242a and the conductor 242b is shorter than the length of the opening formed in the insulator 280, the insulator 244, and the insulator 254. Accordingly, the channel length of the transistor 200 can be made shorter.

Furthermore, the thickness of the conductor 242 is preferably smaller than at least the thickness of the conductor 243. By reducing the thickness of the conductor 242 in this manner, the distance between the oxide 230b and the conductor 260 in the Lov region and the vicinity thereof can be made small.

Since the transistor 200 has the above-described structure, the contribution of the gate electric field applied by the conductor 260 can be increased also in regions of the oxide 230 that are in the vicinity of the conductor 242a and the conductor 242b. As a result, the on-state current, the S value, and the frequency characteristics of the transistor can be improved.

In addition, the conductor 243a (the conductor 243b) is preferably provided to overlap with the conductor 240a (the conductor 240b). Furthermore, the thickness of the conductor 243 is preferably larger than at least the thickness of the conductor 242. With this structure, the conductor 243a (the conductor 243b) is provided in a bottom portion of the opening, and thus the oxide 230b can be prevented from being overetched in the etching for forming the opening where the conductor 240a (the conductor 240b) is embedded.

In addition, the insulator 266 is provided in contact with the top surface of the conductor 242. The insulator 266 includes a region positioned between the conductor 242a and the conductor 260 and a region between the conductor 242b and the conductor 260. As details are made later, the insulator 266 functions as part of a mask used for the separation of the conductor 242a and the conductor 242b. Thus, the end portion of the bottom surface of the insulator 266 on the conductor 260 side is substantially aligned with an end portion of the top surface of the conductor 242a (conductor 242b) on the conductor 260 side in some cases.

Accordingly, a semiconductor device including a transistor with high on-state current can be provided. Alternatively, a semiconductor device including a transistor with high frequency characteristics can be provided. Alternatively, a semiconductor device that has stable electrical characteristics with reduced variations in electrical characteristics and higher reliability can be provided. Alternatively, a semiconductor device including a transistor with low off-state current can be provided.

The detailed structure of the semiconductor device including the transistor 200 according to one embodiment of the present invention is described below.

The conductor 205 is provided to overlap with the oxide 230 and the conductor 260. Furthermore, the conductor 205 is preferably provided to be embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This allows the improvement in favorable planarity of the insulator 224 formed over the conductor 205 and the increase in crystallinity of the oxide 230a, the oxide 230b and the oxide 230c.

Here, the conductor 260 sometimes functions as a first gate (also referred to as top gate) electrode. Alternatively, the conductor 205 sometimes functions as a second gate (also referred to as bottom gate) electrode. In that case, $V_{th}$ of the transistor 200 can be controlled by changing a potential applied to the conductor 205 independently of a potential applied to the conductor 260. In particular, $V_{th}$ of the transistor 200 can be higher than 0 V and the off-state current can be reduced by applying a negative potential to the conductor 205. Thus, drain current when a potential applied to the conductor 260 is 0 V can be lower in the case where a negative potential is applied to the conductor 205 than in the case where the negative potential is not applied to the conductor 205.

In addition, the conductor 205 is preferably provided larger than the channel formation region of the oxide 230. As illustrated in FIG. 1(C), it is particularly preferable that the conductor 205 also extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction.

Since the above-described structure is included, the channel formation region of the oxide 230 can be electrically surrounded by the electric field of the conductor 260 functioning as the first gate electrode and the electric field of the conductor 205 functioning as the second gate electrode.

Furthermore, as illustrated in FIG. 1(C), the conductor 205 is extended to function as a wiring as well. However, without limitation to this structure, a structure where a conductor functioning as a wiring is provided below the conductor 205 may be employed.

Moreover, a conductive material containing tungsten, copper, or aluminum as its main component is preferably used for the conductor 205. Note that the conductor 205 is illustrated as a single layer but may have a stacked-layer structure, for example, stacked layers of the above conductive material, and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom (a conductor through which the above impurities are less likely to pass) may be used below the conductor 205. Alternatively, it is preferable to use a conductor having a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the above impurities and oxygen.

When a conductor having a function of inhibiting oxygen diffusion is used below the conductor 205, the conductivity of the conductor 205 can be inhibited from being lowered because of oxidation. As the conductor having a function of inhibiting oxygen diffusion, for example, tantalum, tantalum nitride, ruthenium, ruthenium oxide, or the like is preferably used. Accordingly, a first conductor of the conductor 205 may be a single layer or stacked layers of the above conductive materials.

The insulator 214 preferably functions as a barrier insulating film that inhibits the mixing of impurities such as water or hydrogen into the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom (an insulating material through which the above impurities are less likely to pass). Alternatively, it is preferable to use an insulating material that has a function of inhibiting diffusion of oxygen (e.g., at least one of oxygen atoms, oxygen molecules, and the like) (through which the above oxygen is less likely to pass).

For example, aluminum oxide, silicon nitride, or the like is preferably used for the insulator 214. Accordingly, impurities such as water or hydrogen can be inhibited from being diffused into the transistor 200 side from the substrate side through the insulator 214. In addition, oxygen contained in the insulator 224 and the like can be prevented from being diffused to the substrate side of the insulator 214.

The insulator 214 may have a stacked-layer structure. For example, a stacked-layer structure of an aluminum oxide film and a silicon nitride film is suitably used for the insulator 214. With the aluminum oxide film, oxygen can be supplied to a lower part of the insulator 214. Furthermore, diffusion of impurities such as hydrogen and water that enter the transistor 200 side from the substrate side can be suppressed by the silicon nitride film. Note that there is no particular limitation on the stacking order of the aluminum oxide film and the silicon nitride film. For example, any one of a stacked structure in which an aluminum oxide film is provided over an aluminum nitride film and a stacked structure where an aluminum nitride film is provided over an aluminum oxide film can be used.

In addition, the permittivity of the insulator 216, the insulator 280, and the insulator 281 each functioning as an interlayer film is preferably lower than that of the insulator 214. When a material with a low dielectric constant is used for the interlayer film, the parasitic capacitance generated between wirings can be reduced. For each of the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 222 and the insulator 224 each have a function of a gate insulator.

Here, it is preferable that oxygen be released from the insulator 224 in contact with the oxide 230 by heating. In this specification, oxygen that is released by heating is referred to as excess oxygen in some cases. For example, for the insulator 224, silicon oxide, silicon oxynitride, or the like is used as appropriate. When an insulator containing oxygen is provided in contact with the oxide 230, oxygen vacancies in the oxide 230 can be reduced and the reliability of the transistor 200 can be improved.

It is preferable to use an insulator with a low In concentration as the insulator 224. When the oxide 230a in contact with the insulator 224 contains In, In might be diffused into the insulator 224. Negative electric charge is trapped by In, which is a metal, in the insulator 224. This might affect transistor characteristics and variations in transistor characteristics, and for example, might cause a positive shift in the threshold voltage of the transistor and an increase in the S value. For example, in the case where the threshold voltage of the transistor is positively shifted and the transistor exhibits normally-off characteristics, higher drive voltage is needed, which makes it difficult to perform low-voltage driving. In that case, the power consumption of the transistor and an electronic device including the transistor is increased.

Thus, for example, the concentration of In contained in the insulator 224 is preferably lower than or equal to $1.0 \times 10^{19}$ atoms/$cm^3$, further preferably lower than or equal to $1.0 \times 10^{18}$ atoms/$cm^3$, still further preferably lower than or equal to $1.0 \times 10^{17}$ atoms/$cm^3$. Alternatively, it is preferable that the oxide 230a in contact with the insulator 224 be an oxide that does not contain In. For example, it is preferable that an oxide of the element M (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like), an M-Zn oxide, or a stack including an M-Zn oxide and an In-M-Zn oxide over the M-Zn oxide be used as the oxide 230a. Specifically, it is preferable to use gallium oxide, a Ga—Zn oxide, or a stack including a Ga—Zn oxide and an In—Ga—Zn oxide over the Ga—Zn oxide as the oxide 230a.

As the insulator 224, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/$cm^3$, preferably greater than or equal to $1.0 \times 10^{19}$ atoms/$cm^3$, further preferably greater than or equal to $2.0 \times 10^{19}$ atoms/$cm^3$ or greater than or equal to $3.0 \times 10^{20}$ atoms/$cm^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In addition, as illustrated in FIG. 1(C), the insulator 224 in a region overlapping with neither the insulator 254 nor the oxide 230b sometimes has smaller thickness than the insulator 224 in the other regions. In the insulator 224, the region overlapping with neither the insulator 254 nor the oxide 230b preferably has thickness with which released oxygen can be adequately diffused.

Like the insulator 214 and the like, the insulator 222 preferably functions as a barrier insulating film that inhibits the mixing of impurities such as water or hydrogen into the transistor 200 from the substrate side. For example, the insulator 222 preferably has lower hydrogen permeability than the insulator 224. When the insulator 224, the oxide 230, the insulator 250, and the like are surrounded by the insulator 222, the insulator 254, the insulator 244, and the insulator 274, impurities such as water or hydrogen can be inhibited from entering the transistor 200 from the outside.

It is preferable that the insulator 222 have a function of inhibiting diffusion of oxygen (e.g., at least one of an oxygen atom, an oxygen molecule, and the like) (through which oxygen is less likely to pass). For example, the insulator 222 preferably has lower oxygen permeability than the insulator 224. When the insulator 222 has a function of inhibiting diffusion of oxygen or impurities, oxygen contained in the oxide 230 can be inhibited from being diffused into the substrate side, which is preferable. Furthermore, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and the mixing of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used for the insulator 222. As miniaturization and high integration of the transistor progress, a problem such as leakage current may arise because of a thinner gate insulator. When a high-k material is used for an insulator functioning as the gate insulator, a gate potential during operation of the transistor can be reduced while the physical thickness of the gate insulator is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The oxide 230 includes the oxide 230a, the oxide 230b over the oxide 230a, and the oxide 230c over the oxide 230b. The oxide 230a and the oxide 230b are formed in island shapes and are provided over the insulator 224. As illustrated in FIG. 1(B) and FIG. 1(C), the oxide 230c is provided along the bottom surface and the side surface of the insulator 250 in the opening provided in the insulator 280, and is further in contact with the side surface and the top surface of the insulator 266 and the side surfaces of the conductors 242a and 242b. In addition, as illustrated in FIG. 1(C), the oxide 230c is provided to be in contact with a top surface and a side surface of the oxide 230b and a side surface of the oxide 230a in the opening.

Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure of oxides that differ in the atomic ratio of metal atoms. Specifically, the atomic ratio of the element M to the constituent elements in the metal oxide used as the oxide 230a is preferably higher than the atomic ratio of the element M to the constituent elements in the metal oxide used as the oxide 230b. In addition, the atomic ratio of the element M to In in the metal oxide used as the oxide 230a is preferably higher than the atomic ratio of the element M to In in the metal oxide used as the oxide 230b. Furthermore, the atomic ratio of In to the element M in the metal oxide used as the oxide 230b is preferably higher than the atomic ratio of In to the element M in the metal oxide used as the oxide 230a. Moreover, a metal oxide that can be used as the oxide 230a or the oxide 230b may be used as the oxide 230c.

The oxide 230c preferably includes a region which does not contain In or a region which has low In concentration. In the case where the oxide 230c does not contain In, a metal oxide such as a M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, in the case where the oxide 230c has a region with low In concentration, the atomic ratio of In to the element M in the metal oxide used as the oxide 230c is preferably lower than the atomic ratio of In to the element M in the metal oxide used as the oxide 230b. In the case where the oxide 230c has a stacked-layer structure of the oxide 230c1 and the oxide 230c2 as illustrated in FIG. 2(A), a metal oxide having a composition substantially equivalent to that of the oxide 230b is used for the oxide 230c1, and a metal oxide including a region having a smaller In concentration than the oxide 230b is used for the oxide 230c2.

The oxide 230 (the oxide 230a, the oxide 230b, and the oxide 230c) preferably has crystallinity, and in particular, a CAAC-OS is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

In addition, the energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To change the energy level gradually, the densities of defect states in mixed layers formed at an interface between the oxide 230a and the oxide 230b and an interface between the oxide 230b and the oxide 230c are preferably made low.

Specifically, when the oxide 230a and the oxide 230b or the oxide 230b and the oxide 230c contain at least one common element in addition to oxygen, a mixed layer with a low density of defect states can be formed. Structures and materials of the oxide 230a, the oxide 230b, and the oxide 230c are described below. Note that the atomic ratio of metal elements contained in the oxide is the atomic ratio in a sputtering target or the atomic ratio in the metal oxide formed over the substrate.

<Oxide 230a>

An In—Ga—Zn oxide, a Ga—Zn oxide, or gallium oxide can be used as the oxide 230a. Specifically, a metal oxide of In:Ga:Zn=1:3:4 [atomic ratio], In:Ga:Zn=1:1:0.5 [atomic ratio], Ga:Zn=2:1 [atomic ratio], or Ga:Zn=2:5 [atomic ratio], or a metal oxide such as gallium oxide is used as the oxide 230a. Alternatively, the oxide 230a may have a stacked-layer structure of a first layer (an oxide 230a1) and a second layer (an oxide 230a2) over the oxide 230a1. However, the stacked-layer structure is not limited thereto, and the number of stacked layers may be two or more. In the case where the oxide 230a has a stacked-layer structure, the bandgap of the first layer is preferably wider than that of the second layer. Specifically, when the oxide 230a has a stacked-layer structure of the oxide 230a1 and the oxide 230a2 over the oxide 230a1, a metal oxide of Ga:Zn=2:1

[atomic ratio] or Ga:Zn=2:5 [atomic ratio], or gallium oxide can be used as the oxide 230a1. Note that an oxide that does not contain In is suitably used as the oxide 230a1. In addition, a metal oxide of In:Ga:Zn=4:2:3 [atomic ratio] or In:Ga:Zn=3:1:2 [atomic ratio] can be used as the oxide 230a2.

<Oxide 230b>

An In—Ga—Zn oxide can be used as the oxide 230b. Specifically, a metal oxide of In:Ga:Zn=4:2:3 [atomic ratio] or In:Ga:Zn=3:1:2 [atomic ratio] can be used as the oxide 230b.

<Oxide 230c>

An In—Ga—Zn oxide, a Ga—Zn oxide, or gallium oxide can be used as the oxide 230c. Specifically, a metal oxide of In:Ga:Zn=1:3:4 [atomic ratio], In:Ga:Zn=1:1:0.5 [atomic ratio], Ga:Zn=2:1 [atomic ratio], or Ga:Zn=2:5 [atomic ratio], or a metal oxide such as gallium oxide is used as the oxide 230c. Alternatively, the oxide 230c may have a stacked-layer structure of a first layer (the oxide 230c1) and a second layer (the oxide 230c2) over the oxide 230c1. However, the stacked-layer structure is not limited thereto, and the number of stacked layers may be two or more. In the case where the oxide 230c has a stacked-layer structure, the bandgap of the second layer is preferably wider than that of the first layer. Specifically, when the oxide 230c has a stacked-layer structure of the oxide 230c1 and the oxide 230c2 over the oxide 230c1, a metal oxide of In:Ga:Zn=4:2:3 [atomic ratio] or In:Ga:Zn=3:1:2 [atomic ratio] can be used as the oxide 230c1. In addition, a metal oxide of Ga:Zn=2:1 [atomic ratio] or Ga:Zn=2:5 [atomic ratio], or gallium oxide can be used as the oxide 230c2. Note that an oxide that does not contain In is suitably used as the oxide 230c2.

Note that the oxide 230a and the oxide 230c each preferably have the above stacked-layer structure. In other words, in the above stacked-layer structure, the oxide that is in contact with the insulator (the insulator 224 or the insulator 250) can also be regarded as an oxide that does not contain In.

When an oxide that does not contain In is used as the oxide 230a1, diffusion of In into the insulator 224 can be inhibited. In addition, when an oxide that does not contain In is used as the oxide 230c2, diffusion of In into the insulator 250 can be inhibited. Note that since the insulator 224 and the insulator 250 each function as a gate insulator, the transistor may have poor characteristics in the case of the diffusion of In. Therefore, when an oxide that does not contain In is used as the oxide that is in contact with the insulator (the insulator 224 or the insulator 250), a highly reliable semiconductor device can be provided.

In addition, when the oxide 230a, the oxide 230b, and the oxide 230c have the above structures, the oxide 230b serves as a main carrier path. Furthermore, when the oxide 230a and the oxide 230c have the above stacked-layer structures, an excellent effect of lowering the densities of defect states at the interface between the oxide 230a and the oxide 230b and the interface between the oxide 230b and the oxide 230c can be obtained. Thus, the influence of interface scattering on carrier conduction is small, and the transistor 200 can have high on-state current and high frequency characteristics.

Note that the case where the oxide 230a and the oxide 230c each have a stacked-layer structure is described above as an example; however, one embodiment of the present invention is not limited thereto. The case where either one of the oxide 230a and the oxide 230c has a stacked-layer structure is also acceptable.

In addition, as illustrated in FIG. 1(B), the oxide 230b in a region that does not overlap with the conductor 242 sometimes has smaller thickness than the oxide 230b in a region overlapping with the conductor 242. The thin region in the oxide 230b is formed when part of the top surface of the oxide 230b is removed at the time of forming the conductor 242a and the conductor 242b. When a conductive film to be the conductor 242 is deposited, a low-resistance region is sometimes formed on the top surface of the oxide 230b in the vicinity of an interface with the conductive film. Removal of the low-resistance region between the conductor 242a and the conductor 242b on the top surface of the oxide 230b in the above manner can prevent the region from serving as part of the channel. Furthermore, although not illustrated, the oxide 230b in a region that does not overlap with the conductor 243 sometimes has smaller thickness than the oxide 230b in a region overlapping with the conductor 243. The thin region in the oxide 230b is formed when part of the top surface of the oxide 230b is removed at the time of forming the conductor 243a and the conductor 243b. That is, the oxide 230b sometimes includes a region having a first thickness, a region having a second thickness, and a region having a third thickness that are different from each other.

The conductor 243 (the conductor 243a and the conductor 243b) and the conductor 242 (the conductor 242a and the conductor 242b) functioning as the source electrode and the drain electrode are provided over the oxide 230b. For each of the conductor 243 and the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

For the conductor 243 and the conductor 242, the same material may be used or different materials may be used. In addition, over the oxide 230b, the area of the conductor 242 is larger than the area of the conductor 243, and the conductor 242 is in contact with part of a top surface and a side surface of the conductor 243 and is in contact with part of the top surface of the oxide 230b. Furthermore, the thickness of the conductor 242 is preferably smaller than the thickness of the conductor 243.

When the conductor 243 and the conductor 242 are provided to be in contact with the oxide 230, the oxygen concentration of the oxide 230 in the vicinity of the conductor 243 and the conductor 242 sometimes decreases. In addition, a metal compound layer that contains the metal contained in the conductor 243 and the conductor 242 and the component of the oxide 230 is sometimes formed in the oxide 230 in the vicinity of the conductor 243 and the conductor 242. In such cases, the carrier density of a region in the oxide 230 in the vicinity of the conductor 243 and the conductor 242 increases, and the region becomes a low-resistance region.

Here, the region between the conductor 242a and the conductor 242b is formed to overlap with the opening of the insulator 280. Accordingly, the conductor 260 can be provided between the conductor 242a and the conductor 242b in a self-aligned manner.

In the transistor 200 illustrated in FIG. 1, an angle formed between the side surfaces and bottom surfaces of the conductor 242a and the conductor 242b on the conductor 260 side be greater than or equal to 10° and less than or equal to 80°, preferably greater than or equal to 30° and less than or equal to 60°. Note that the transistor 200 illustrated in FIG. 1 is not limited thereto, and side surfaces of the conductor 242a and the conductor 242b on the conductor 260 side have substantially perpendicular shapes. Alternatively, side surfaces of the conductor 242a and the conductor 242b that face each other may have a plurality of surfaces with different angles formed between the side surfaces and bottom surfaces.

The insulator 266 functions as a hard mask for forming the conductor 242a and the conductor 242b. The insulator 266 functions as an etching stopper for removing the hard mask formed over the insulator 266. The insulator 266 is in contact with the top surface of the conductor 242a and the conductor 242b and be in contact with the side surface of the insulator 254. An insulator that can be used as the insulator 222 can be used as the insulator 266. When an insulator having a function of inhibiting diffusion of oxygen is used as the insulator 266, the conductor 242 can be prevented from reacting with oxygen in the oxide 230c.

The insulator 250 functions as a gate insulator. The insulator 250 is preferably provided along the bottom surface and side surface of the conductor 260 and in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because of their thermal stability.

As in the insulator 224, the concentration of impurities such as water or hydrogen in the insulator 250 is preferably lowered. The concentration of impurities such as In in insulator 250 is also preferably lowered. The thickness of the insulator 250 is preferably greater than or equal to 1 nm and less than or equal to 20 nm.

It is preferable that the In concentration in the insulator 250 be as low as possible. When the oxide 230c in contact with the insulator 250 contains In, In might be diffused into the insulator 250. Negative electric charge is trapped by In, which is a metal, in the insulator 250. This might affect transistor characteristics and variations in transistor characteristics, and for example, might cause a positive shift in the threshold voltage of the transistor and an increase in an S value. For example, in the case where the threshold voltage of the transistor is positively shifted and the transistor exhibits normally-off characteristics, higher drive voltage is needed, which makes it difficult to perform low-voltage driving. In that case, the power consumption of the transistor and an electronic device including the transistor is increased.

Thus, the concentration of In contained in the insulator 250 is preferably lower than or equal to $1.0\times10^{19}$ atoms/cm$^3$, further preferably lower than or equal to $1.0\times10^{18}$ atoms/cm$^3$, still further preferably lower than or equal to $1.0\times10^{17}$ atoms/cm$^3$. Alternatively, it is preferable that the oxide 230c (230c2) in contact with the insulator 250 be an oxide that does not contain In. For example, it is preferable that an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) be used as the oxide 230c1 and an oxide of the element M, an M-Zn oxide, or the like be used as the oxide 230c2. Specifically, it is preferable that an In—Ga—Zn oxide be used as the oxide 230c1 and gallium oxide or a Ga—Zn oxide be used as the oxide 230c2.

Furthermore, a metal oxide may be provided between the insulator 250 and the conductor 260. The metal oxide preferably inhibits oxygen diffusion from the insulator 250 to the conductor 260. Accordingly, oxidation of the conductor 260 due to oxygen from the insulator 250 can be inhibited.

In addition, the metal oxide has a function of part of the gate insulator in some cases. Therefore, when silicon oxide, silicon oxynitride, or the like is used for the insulator 250, a metal oxide that is a high-k material with high relative permittivity is preferably used for the metal oxide. When the gate insulator has a stacked-layer structure of the insulator 250 and the metal oxide, the stacked-layer structure can be thermally stable and have high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or a plurality of kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although FIG. 1 illustrates the conductor 260 as a conductor having a two-layer structure, the conductor 260 may have a single-layer structure or a stacked-layer structure of three or more layers. In addition, the top surface of the conductor 260 is preferably substantially aligned with the top surfaces of the insulator 250, the insulator 254, the insulator 244, the oxide 230c, and the insulator 280.

For the conductor 260a, it is preferable to use the above conductor having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting oxygen diffusion, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure of the conductive material and titanium or titanium nitride.

In addition, as illustrated in FIGS. 1(A) and 1(C), the oxide 230 is preferably provided such that a side surface of the oxide 230 is covered with the conductor 260 in the region of the oxide 230b that does not overlap with the conductor 242, that is, the channel formation region of the oxide 230. Furthermore, it is preferable that the conductor 260 faces the side surface of the oxide 230b and tat the oxide 230c and the insulator 250 be provided between the conductor 260 and the side surface of the oxide 230b. Accordingly, the electric field of the conductor 260 functioning as the first gate electrode is likely to applied to the side surface of the oxide 230. Thus, the on-state current of the transistor 200 can be increased and the frequency characteristics of the transistor 200 can be improved. For example, as illustrated in FIG. 2(B), a lower end portion of the conductor 260 is preferably provided on the insulator 224 side from a lower end portion of the oxide 230b. Here, as illustrated in FIG. 2(B), a difference between the lower end of the conductor 260 and the lower end of the oxide 230b is denoted by T2. In that case, T2 is greater than or equal to 0 nm and less than or equal to 100 nm, preferably greater than or equal to 3 nm and less than or equal to 50 nm, further preferably greater than or equal to 5 nm and less than or equal to 20 nm.

Like the insulator 214 and the like, the insulator 254 preferably functions as a barrier insulating film that inhibits the mixing of impurities such as water or hydrogen into the transistor 200 from the insulator 280 side. For example, the insulator 254 preferably has lower hydrogen permeability than the insulator 224. Furthermore, as illustrated in FIGS. 1(B) and 1(C), the insulator 254 is preferably in contact with the side surface of the oxide 230c, the top surface and side surface of the conductor 242, the side surface of the conductor 243, the side surfaces of the oxide 230a and the oxide 230b, and the top surface of the insulator 224. Such a structure can inhibit entry of hydrogen contained in the insulator 280 into the oxide 230 through the top surfaces or side surfaces of the conductor 242, the conductor 243, the oxide 230a, the oxide 230b, and the insulator 224.

It is also preferable that the insulator 254 have a function of inhibiting diffusion of oxygen (e.g., at least one of an oxygen atom, an oxygen molecule, and the like) (through which oxygen is less likely to pass). For example, the insulator 254 preferably has lower oxygen permeability than the insulator 280 or the insulator 224.

The insulator 254 is preferably deposited by an ALD method, which provides good coverage.

Alternatively, the insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 into the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. Note that as the insulator containing an oxide of one or both of aluminum and hafnium, aluminum oxide, hafnium oxide, an oxide containing aluminum and hafnium (hafnium aluminate), or the like is preferably used.

Furthermore, the insulator 254 may contain fluorine. Fluorine contained in the insulator 254 is preferable because it can trap hydrogen existing in the oxide 230 and its vicinity and can inhibit gettering of hydrogen from the oxide 230 and the mixing of impurities such as hydrogen from the outside of the insulator 254 into the oxide 230. To form the insulator 254 that contains fluorine, fluorine is added to the insulator 254 after the formation of the insulator 254. Alternatively, the insulator 254 may be deposited in a fluorine-containing atmosphere.

Like the insulator 214 and the like, the insulator 244 preferably functions as a barrier insulating film that inhibits the mixing of impurities such as water or hydrogen into the transistor 200 from the insulator 280 side. For example, the insulator 244 preferably has lower hydrogen permeability than the insulator 224. In addition, the insulator 244 is preferably provided to be in contact with the insulator 254, as illustrated in FIGS. 1(B) and 1(C). Such a structure can inhibit entry of hydrogen contained in the insulator 280 into the oxide 230 through the side surfaces of the conductor 260, the oxide 230c, and the insulator 250.

The insulator 244 is preferably deposited by a sputtering method. When the insulator 244 is deposited by a sputtering method in an oxygen-containing atmosphere, oxygen can be added to the insulator 224 through the insulator 254. Accordingly, oxygen can be supplied from the insulator 224 to the oxide 230. Here, with the insulator 244 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 into the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 244, for example. Note that as the insulator containing an oxide of one or both of aluminum and hafnium, aluminum oxide, hafnium oxide, an oxide containing aluminum and hafnium (hafnium aluminate), or the like is preferably used.

In addition, like the insulator 254, the insulator 244 may contain fluorine. The insulator 244 preferably contains fluorine because, also in the insulator 244, fluorine can trap hydrogen existing in the oxide 230 and its vicinity and can inhibit gettering of hydrogen from the oxide 230 and the mixing of impurities such as hydrogen from the outside of the insulator 244 into the oxide 230. To form the insulator 244 that contains fluorine, fluorine may be added to the insulator 244 after the formation of the insulator 244. Alternatively, the insulator 244 may be deposited in a fluorine-containing atmosphere.

As described above, by covering the insulator 224, the insulator 250, and the oxide 230 with the insulator 254 and the insulator 244 that have barrier properties against hydrogen or trap impurities such as hydrogen, the insulator 280 is separated from the insulator 224, the oxide 230, and the insulator 250 with the insulator 254 or the insulator 244.

This can inhibit entry of impurities such as hydrogen from the outside of the transistor 200, resulting in favorable electrical characteristics and high reliability of the transistor 200.

In addition, for example, it is preferable that the insulator 244 have a function of inhibiting diffusion of oxygen (e.g., at least one of an oxygen atom, an oxygen molecule, and the like) (through which oxygen is less likely to pass). For example, the insulator 244 preferably has lower oxygen permeability than the insulator 224. When the insulator 244 has a function of inhibiting oxygen diffusion, the conductor 260 can be inhibited from reacting with oxygen contained in the insulator 280.

An insulator containing aluminum nitride may be used as the insulator 244, for example. It is preferable to use a nitride insulator that satisfies the composition formula AN, (x is a real number greater than 0 and less than or equal to 2, preferably x is a real number greater than 0.5 and less than or equal to 1.5) as the insulator 244. Accordingly, a film having an excellent insulating property and high thermal conductivity can be obtained, and thus dissipation of heat generated in driving the transistor 200 can be increased. Alternatively, aluminum titanium nitride, titanium nitride, or the like can be used for the insulator 244. In that case, deposition by a sputtering method is preferable because deposition can be performed without using a highly-oxidizing gas such as oxygen or ozone as a deposition gas. Alternatively, silicon nitride, silicon nitride oxide, or the like can be used.

An insulator containing an oxide of one or both of aluminum and hafnium is preferably deposited as the insulator 244, for example. Note that as the insulator containing an oxide of one or both of aluminum and hafnium, aluminum oxide, hafnium oxide, an oxide containing aluminum and hafnium (hafnium aluminate), or the like is preferably used. In this case, the insulator 244 is preferably deposited by an ALD method. An ALD method is a deposition method that provides good coverage, and thus can prevent formation of disconnection or the like due to unevenness of the insulator 244.

The insulator 280 is provided over the insulator 224, the oxide 230, and the conductor 242 with the insulator 244 and the insulator 254 therebetween. For example, for the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride are preferable because of their thermal stability. Materials such as silicon oxide, silicon oxynitride, and porous silicon oxide, in each of which a region containing oxygen released by heating can be easily formed, are particularly preferable.

The concentration of impurities such as water or hydrogen in the insulator 280 is preferably lowered. In addition, the top surface of the insulator 280 may be planarized.

Like the insulator 214 and the like, the insulator 274 preferably functions as a barrier insulating film that inhibits the mixing of impurities such as water or hydrogen into the insulator 280 from the above. An insulator that can be used as the insulator 214, the insulator 254, the insulator 244, or the like is used as the insulator 274, for example.

In addition, the insulator 281 functioning as an interlayer film is preferably provided over the insulator 274. As in the insulator 224 and the like, the concentration of impurities such as water or hydrogen in the insulator 281 is preferably lowered.

In addition, the conductor 240a and the conductor 240b are provided in openings formed in the insulator 281, the insulator 274, the insulator 280, the insulator 244, and the insulator 254. The conductor 240a and the conductor 240b are provided to face each other with the conductor 260 therebetween. Note that top surfaces of the conductor 240a and the conductor 240b may be on the same plane as the top surface of the insulator 281.

Note that the insulator 241a is provided in contact with the inner wall of the opening in the insulator 281, the insulator 274, the insulator 280, the insulator 244, and the insulator 254, and a first conductor of the conductor 240a is formed in contact with a side surface of the insulator 241a. The conductor 242a is located on at least part of the bottom portion of the opening, and thus the conductor 240a is in contact with the conductor 242a. Similarly, the insulator 241b is provided in contact with the inner wall of the opening in the insulator 281, the insulator 274, the insulator 280, the insulator 244, and the insulator 254, and a first conductor of the conductor 240b is formed in contact with a side surface of the insulator 241b. The conductor 242b is located on at least part of the bottom portion of the opening, and thus the conductor 240b is in contact with the conductor 242b.

For the conductor 240a and the conductor 240b, a conductive material containing tungsten, copper, or aluminum as its main component is preferably used. In addition, the conductor 240a and the conductor 240b may have a stacked-layer structure.

In addition, in the case where the conductor 240 has a stacked-layer structure, the conductor having a function of inhibiting diffusion of impurities such as water or hydrogen is preferably used as a conductor in contact with the oxide 230a, the oxide 230b, the conductor 242, the insulator 244, the insulator 280, the insulator 274, and the insulator 281. For example, tantalum, tantalum nitride, titanium, titanium nitride, ruthenium, ruthenium oxide, or the like is preferably used. Alternatively, the conductive material having a function of inhibiting diffusion of impurities such as water or hydrogen may be used as a single layer or stacked layers. The use of the conductive material can prevent oxygen added to the insulator 280 from being absorbed by the conductor 240a and the conductor 240b. Moreover, the mixing of impurities such as water or hydrogen into the oxide 230 through the conductor 240a and the conductor 240b from a layer above the insulator 281 can be inhibited.

Insulators that can be used as the insulator 244 and the like are used as the insulator 241a and the insulator 241b, for example. Since the insulator 241a and the insulator 241b are provided in contact with the insulator 254 and the insulator 244, the mixing of impurities such as water or hydrogen into the oxide 230 through the conductor 240a and the conductor 240b from the insulator 280 or the like can be inhibited. In addition, oxygen contained in the insulator 280 can be prevented from being absorbed by the conductor 240a and the conductor 240b.

In addition, although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure; for example, stacked layers of the above conductive material, and titanium or titanium nitride. The conductor may be formed to be embedded in an opening provided in an insulator.

In addition, although not illustrated, an insulator having resistivity higher than or equal to $1.0 \times 10^{13}$ Ω-cm and lower than or equal to $1.0 \times 10^{15}$ Ω-cm, preferably higher than or equal to $5.0 \times 10^{13}$ Ω-cm and lower than or equal to $5.0 \times 10^{14}$ Ω-cm is preferably provided to cover the conductor. It is preferable that an insulator having resistivity in the above range be provided over the conductor, in which case the insulator can disperse electric charge accumulated in the transistor 200 or between wirings of the conductor or the like and can inhibit poor characteristics and electrostatic breakdown of the transistor and an electronic device including the transistor due to the electric charge, while maintaining the insulating property.

<Constituent Material of Semiconductor Device>

Constituent materials that can be used for a semiconductor device are described below.

«Substrate»

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. In addition, examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

«Insulator»

Examples of an insulator include an oxide, a nitride, an oxynitride, a nitride oxide, a metal oxide, a metal oxynitride, and a metal nitride oxide, each of which has an insulating property.

As miniaturization and high integration of the transistor progress, for example, a problem such as leakage current may arise because of a thinner gate insulator. When a high-k material is used for the insulator functioning as a gate insulator, the voltage when the transistor operates can be reduced while keeping the physical thickness of the gate insulator. In contrast, when a material with low relative permittivity is used for the insulator functioning as an interlayer film, parasitic capacitance generated between wirings can be reduced. Thus, a material is preferably selected depending on the function of an insulator.

In addition, examples of the insulator with high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of the insulator with low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In addition, when a transistor using an oxide semiconductor is surrounded by an insulator (the insulator 214, the insulator 222, the insulator 254, the insulator 244, the insulator 274, or the like) having a function of inhibiting the passage of oxygen and impurities such as hydrogen, the electrical characteristics of the transistor can be stable. For the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

«Conductor»

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

«Metal Oxide»

As the oxide 230, a metal oxide functioning as an oxide semiconductor (hereinafter also referred to as an oxide semiconductor) is preferably used. A metal oxide that can be applied to the oxide 230 according to the present invention is described below.

The oxide semiconductor preferably contains at least indium or zinc. In particular, indium and zinc are preferably contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, the element M, and zinc is considered. The element M is aluminum, gallium, yttrium, tin, or the like. Other elements that can be applied to the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

Oxide semiconductors are classified into a single crystal oxide semiconductor and a non-single-crystal oxide semiconductor. A polycrystalline oxide semiconductor, an amorphous oxide semiconductor, and the like are known as non-single-crystal oxide semiconductors, for example.

For an oxide semiconductor used for a semiconductor of the transistor, a thin film having high crystallinity is preferably used. With use of the thin film, the stability or reliability of the transistor can be improved. Examples of the thin film include a thin film of a single crystal oxide semiconductor and a thin film of a polycrystalline oxide semiconductor. However, to form the thin film of a single crystal oxide semiconductor or the thin film of a polycrystalline oxide semiconductor over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). Here, it has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for the semiconductor of the transistor.

Non-Patent Document 6 has shown that a transistor using an oxide semiconductor has extremely low leakage current in a non-conduction state; specifically, off-state current per micrometer in the channel width of the transistor is on the order of yA/μm ($10^{-24}$ A/μm). For example, a low-power-consumption CPU utilizing the property of low leakage current of the transistor using an oxide semiconductor has been disclosed (see Non-Patent Document 7).

Furthermore, application of a transistor using an oxide semiconductor to a display device utilizing the property of low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The finding of the CAAC structure and the nc structure has contributed to improvements in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the property of low leakage current of the transistor have been studied.

[Composition of Metal Oxide]

The composition of a CAC (Cloud-Aligned Composite)-OS that can be used in a transistor disclosed in one embodiment of the present invention will be described below.

Note that in this specification and the like, CAAC (c-axis aligned crystal) or CAC (Cloud-Aligned Composite) might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

[Structure of Metal Oxide]

An oxide semiconductor is classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the mixing of impurities, formation of defects, or the like might decrease the crystallinity of the oxide semiconductor; thus, it can also be said that the CAAC-OS is an oxide semiconductor having small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has lower crystallinity than the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

Note that when the above oxide semiconductor is used for a transistor, a transistor with high field-effect mobility can be achieved. In addition, a transistor having high reliability can be achieved.

In addition, an oxide semiconductor with a low carrier density is preferably used for a transistor. In the case where the carrier density of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. For example, the carrier density of the oxide semiconductor is set lower than $8\times10^{11}/cm^3$, preferably lower than $1\times10^{11}/cm^3$, further preferably lower than $1\times10^{10}/cm^3$, and greater than or equal to $1\times10^{-9}/cm^3$.

In addition, a highly purified intrinsic or substantially highly purified intrinsic oxide semiconductor film has a low density of defect states and thus has a low density of trap states in some cases.

Furthermore, electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Thus, in order to stabilize electrical characteristics of the transistor, reducing the impurity concentration in the oxide semiconductor is effective. Furthermore, in order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

[Impurity]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. For this reason, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

[Effect of Vacuum Baking]

Here, a weak Zn—O bond included in a metal oxide is described, and an example of a method for reducing the number of oxygen atoms and zinc atoms that form the bond is described.

In a transistor using a metal oxide, an oxygen vacancy is given as an example of a defect that leads to poor electrical characteristics of the transistor. For example, the threshold voltage of a transistor using a metal oxide including oxygen vacancies in the film tends to shift in the negative direction, and thus the transistor is likely to have normally-on characteristics. This is because a donor caused by oxygen vacancies in the metal oxide is generated and the carrier concentration is increased. The transistor having normally-on characteristics causes various problems where malfunction is likely to occur at the time of operation and power consumption is increased at the time of non-operation, for example.

Furthermore, a thermal budget in a step of forming a connection wiring for manufacturing a module causes problems such as degradation of the electrical characteristics of the transistor, such as variations in threshold voltage and an increase in parasitic resistance, and increased variations in electrical characteristics due to the degradation of the electrical characteristics. Since such problems lead directly to a decrease in manufacturing yield, it is important to consider countermeasures. Moreover, the electrical characteristics degrade through a stress test, which can evaluate changes in transistor characteristics due to long-term use (changes over time) in a short time. The degradation of the electrical characteristics is presumably caused by oxygen vacancies in the metal oxide due to high-temperature treatment performed in the manufacturing process or electrical stress applied during the stress test.

In the metal oxide, there is an oxygen atom that has a weak bond to a metal atom and is likely to form an oxygen vacancy. In particular, in the case where the metal oxide is an In—Ga—Zn oxide, a zinc atom and an oxygen atom are likely to form a weak bond (also referred to as a weak Zn—O bond). Here, the weak Zn—O bond means a bond generated between a zinc atom and an oxygen atom, which is weak enough to be broken by high-temperature treatment performed in the manufacturing process or electrical stress applied during the stress test. When a weak Zn—O bond exists in the metal oxide, the bond is broken by heat treatment or current stress, so that an oxygen vacancy is formed. The formation of the oxygen vacancy decreases the stability of the transistor such as resistance to thermal budget and resistance to electrical stress.

A bond generated between an oxygen atom bonded to many zinc atoms and the zinc atoms is a weak Zn—O bond in some cases. A zinc atom is bonded to an oxygen atom more weakly than a gallium atom is. Thus, an oxygen atom bonded to many zinc atoms is likely to form a vacancy. That is, a bond generated between a zinc atom and an oxygen atom is probably weaker than a bond between an oxygen atom and another metal.

In addition, it is probable that a weak Zn—O bond is likely to be formed when impurities exist in the metal oxide. Examples of impurities in the metal oxide include a water molecule and hydrogen. When a water molecule or hydrogen exists in the metal oxide, a hydrogen atom is sometimes bonded to an oxygen atom forming the metal oxide (which is also referred to as an OH bond). In the case where the In—Ga—Zn oxide is single crystal, an oxygen atom forming the metal oxide is bonded to four metal atoms forming the metal oxide. However, an oxygen atom bonded to a hydrogen atom is bonded to two or three metal atoms in some cases. When the number of metal atoms bonded to an oxygen atom decreases, the oxygen atom is likely to form an oxygen vacancy. Note that when a zinc atom is bonded to an oxygen atom that forms an OH bond, the bond between the oxygen atom and the zinc atom is probably weak.

In addition, a weak Zn—O bond is sometimes formed in distortion in a region where a plurality of nanocrystals are connected. Although the shape of nanocrystals is basically a hexagon, they have pentagonal lattice arrangement, heptagonal lattice arrangement, or the like in the distortion. A weak Zn—O bond is formed in the distortion presumably because the bond distances between atoms are not uniform in the distortion.

In addition, it is probable that a weak Zn—O bond is likely to be formed when the crystallinity of the metal oxide is low. When the crystallinity of the metal oxide is high, a zinc atom forming the metal oxide is bonded to four or five oxygen atoms. However, when the crystallinity of the metal oxide becomes lower, the number of oxygen atoms bonded to a zinc atom tends to decrease. When the number of oxygen atoms bonded to a zinc atom decreases, the zinc atom is likely to form a vacancy. That is, a bond generated between a zinc atom and an oxygen atom is presumably weaker than a bond generated in single crystal.

Reducing the number of oxygen atoms and zinc atoms that form the above-described weak Zn—O bonds inhibits formation of oxygen vacancies due to a thermal budget or current stress and can improve the stability of a transistor. Note that in the case where only the number of oxygen atoms that form the weak Zn—O bonds is reduced and the number of zinc atoms that form the weak Zn—O bonds is not reduced, a weak Zn—O bond is sometimes formed again when an oxygen atom is supplied to the vicinity of the zinc atoms. Therefore, it is preferable to reduce the number of zinc atoms and oxygen atoms that form the weak Zn—O bonds.

As a method for reducing the number of oxygen atoms and zinc atoms that form the weak Zn—O bonds, a method in which vacuum baking is performed after a metal oxide is deposited can be given. Vacuum baking is heat treatment performed in a vacuum atmosphere. A vacuum atmosphere is kept by evacuation with a turbomolecular pump or the like. Note that pressure in a treatment chamber is lower than or equal to $1 \times 10^{-2}$ Pa, preferably lower than or equal to $1 \times 10^{-3}$ Pa. In addition, the substrate temperature in the heat treatment is higher than or equal to 300° C., preferably higher than or equal to 400° C.

Performing the vacuum baking can reduce the number of oxygen atoms and zinc atoms that form the weak Zn—O bonds. Furthermore, since the metal oxide is heated by the vacuum baking, atoms included in the metal oxide are rearranged after the number of oxygen atoms and zinc atoms that form the weak Zn—O bonds is reduced, so that the number of oxygen atoms each bonded to four metal atoms is increased. Consequently, the number of oxygen atoms and zinc atoms that form the weak Zn—O bonds can be reduced, and a weak Zn—O bond can be inhibited from being formed again.

In addition, when impurities exist in the metal oxide, performing the vacuum baking can release water molecules or hydrogen in the metal oxide and reduce the number of OH bonds. When the number of OH bonds in the metal oxide decreases, the proportion of the oxygen atoms each bonded to four metal atoms increases. Furthermore, the atoms forming the metal oxide are rearranged when water molecules or hydrogen is released, so that the number of oxygen atoms each bonded to four metal atoms increases. Thus, a weak Zn—O bond can be inhibited from being formed again.

As described above, when vacuum baking is performed after the metal oxide is deposited, the number of oxygen atoms and zinc atoms that form weak Zn—O bonds can be reduced. Thus, the stability of the transistor can be improved through the step. Furthermore, an improvement in stability of the transistor increases the degree of freedom in selecting materials and formation methods.

<Method for Manufacturing Semiconductor Device>

Next, a method for manufacturing a semiconductor device including the transistor 200 according to one embodiment of the present invention, which is illustrated in FIG. 1, is described with reference to FIG. 3 to FIG. 12. In addition, (A) in each of FIG. 3 to FIG. 12 is a top view. Furthermore, (B) in each drawing is a cross-sectional view corresponding to a portion indicated by a dashed-dotted line A1-A2 in (A), and is also a cross-sectional view of the transistor 200 in the channel length direction. Moreover, (C) in each drawing is a cross-sectional view corresponding to a portion indicated by a dashed-dotted line A3-A4 in (A), and is also a cross-sectional view of the transistor 200 in the channel width direction. Note that for clarity of the drawing, some components are not illustrated in the top view of (A) in each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

In addition, in an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a plasma enhanced ALD (PEALD) method that is a deposition method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a film formation method in which particles ejected from a target or the like are deposited, a CVD method and an ALD method are film formation methods in which a film is formed by reaction at a surface of an object. Thus, a CVD method and an ALD method are film formation methods that enable favorable step coverage almost regardless of the shape of an object. In particular, an ALD method enables excellent step coverage and excellent thickness uniformity and can be favorably used to cover a surface of an opening with a high aspect ratio, for example. On the other hand, an ALD method has a relatively low deposition rate, and thus is preferably used in combination with another film formation method with a high deposition rate, such as a CVD method, in some cases.

When a CVD method or an ALD method is used, the composition of a film to be formed can be controlled with a flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases while forming the film, a film whose composition is continuously changed can be formed. In the case of depositing a film while changing the flow rate ratio of source gases, as compared with the case of depositing a film with use of a plurality of deposition chambers, time taken for the deposition can be shortened because time taken for transfer and pressure adjustment is not required. Thus, the productivity of the semiconductor device can be increased in some cases.

In this embodiment, for the insulator 214, aluminum oxide is deposited by a sputtering method. In addition, the insulator 214 may have a multilayer structure. For example, a structure may be employed in which aluminum oxide is deposited by a sputtering method and aluminum oxide is deposited over the aluminum oxide by an ALD method. Alternatively, a structure may be employed in which aluminum oxide is deposited by an ALD method and aluminum oxide is deposited over the aluminum oxide by a sputtering method.

Next, a conductive film to be the conductor 205 is deposited over the insulator 214. The conductive film to be the conductor 205 can be deposited by a sputtering method, a CVD method, an MBE method, a PLD method, an ALD method, or the like. In addition, the conductive film to be the conductor 205 can be a multilayer film. In this embodiment, tungsten is deposited for the conductive film to be the conductor 205.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is performed, so that a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

In addition, a hard mask formed of an insulator or a conductor may be used instead of the resist mask. In the case where a hard mask is used, a hard mask with a desired shape can be formed by forming an insulating film or a conductive film to be a hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect a post-process or can be utilized in the post-process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Next, an insulating film to be the insulator 216 is deposited over the insulator 214 and the conductor 205. The insulating film is formed to be in contact with the top surface and side surface of the conductor 205. The insulator to be the insulator 216 can be deposited by a sputtering method, a CVD method, an MBE method, a PLD method, an ALD method, or the like. In this embodiment, for the insulating film to be the insulator 216, silicon oxide is deposited by a CVD method.

ere, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the conductor 205 is 150 nm, and the thickness of the insulating film to be the insulator 216 is 350 nm.

ext, CMP (chemical Mechanical Polishing) treatment is performed on the insulating film to be the insulator 216, so that part of the insulating film to be the insulator 216 is removed and a surface of the conductor 205 is exposed. Thus, the conductor 205 and the insulator 216 in contact with the side surface of the conductor 205 that have flat top surfaces can be formed (see FIG. 3). The improvement in planarity of the top surfaces of the insulator 216 and the conductor 205 results in improved crystallinity of the CAAC-OS that forms the oxide 230b and the oxide 230c.

Note that the method for manufacturing the insulator 216 and the conductor 205 is not limited to the above. For example, the insulating film to be the insulator 216 may be deposited over the insulator 214, an opening may be provided in the insulating film, and the conductor 205 may be formed to be embedded in the opening.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, an insulating film to be the insulator 224 is deposited over the insulator 222. The insulating film to be the insulator 224 can be deposited by a sputtering method, a CVD method, an MBE method, a PLD method, an ALD method, or the like.

Next, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere, or an atmosphere containing an oxidizing gas at 10 ppm or more, 1% or higher, or 10% of higher. Alternatively, the heat treatment may be performed under reduced pressure. Alternatively, the heat treatment may be performed by performing heat treatment in a nitrogen or inert gas atmosphere and then performing heat treatment in an atmosphere containing an oxidizing gas at 10 ppm or higher, 1% or higher, or 10% or higher to compensate for released oxygen.

In this embodiment, as the heat treatment, treatment is performed at 400° C. in a nitrogen atmosphere for 1 hour after deposition of the insulator 224. By the heat treatment, impurities such as water and hydrogen contained in the insulator 224 can be removed, for example. The heat treatment can also be performed after the deposition of the insulator 222, for example.

Here, in order to form an excess-oxygen region in the insulator 224, plasma treatment containing oxygen may be performed under reduced pressure. For the plasma treatment containing oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals produced by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen contained in the insulator 224 can be removed by selecting the conditions for the plasma treatment as appropriate. In that case, the heat treatment does not need to be performed.

Figure 3A:
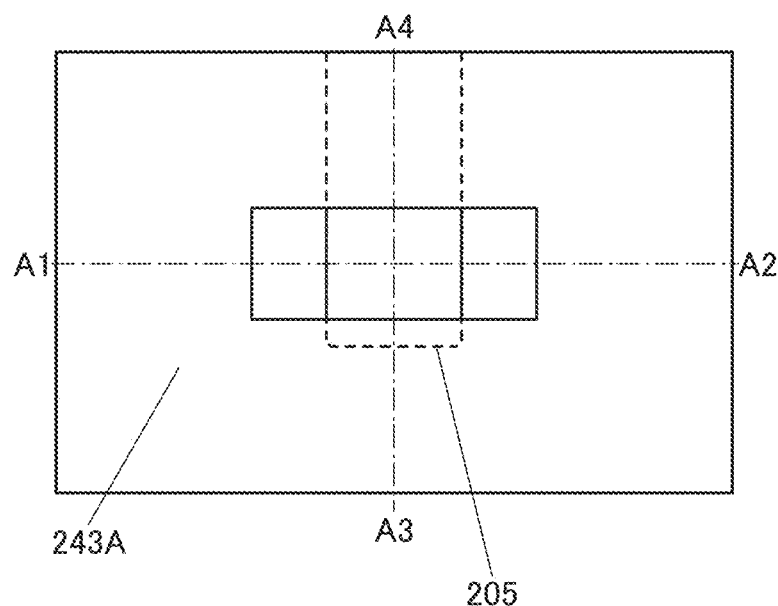
[FIGS. 3A to 3C] A top view and cross-sectional views illustrating a method for manufacturing a semiconductor device according to one embodiment of the present invention.
Figure 3C:
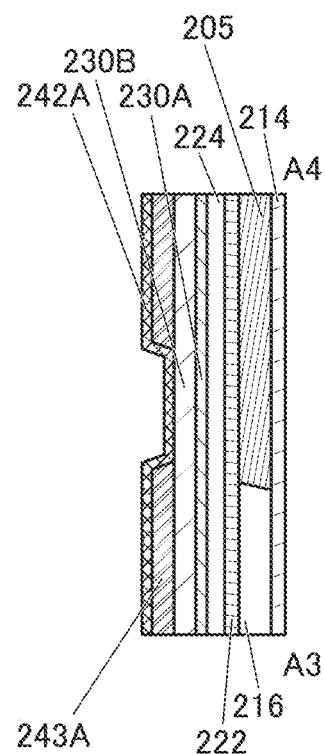
Figure 3B:
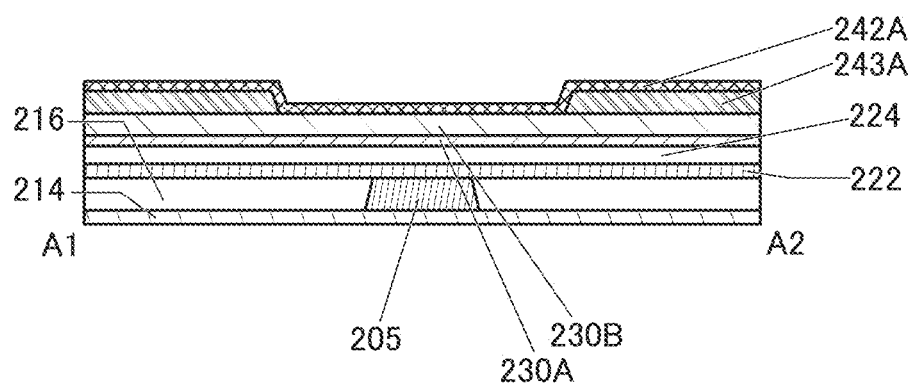
Figure 4A:
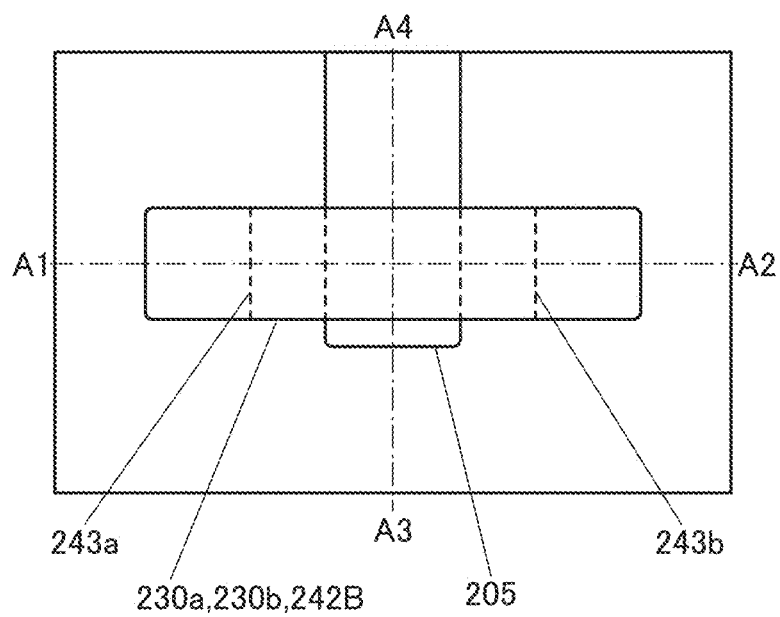
[FIGS. 4A to 4C] A top view and cross-sectional views illustrating a method for manufacturing a semiconductor device according to one embodiment of the present invention.
Figure 4C:
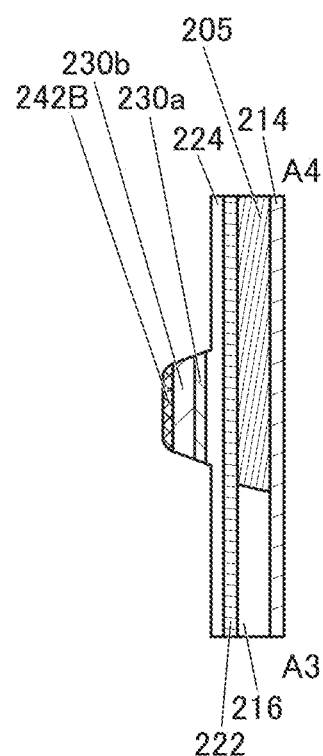
Figure 4B:
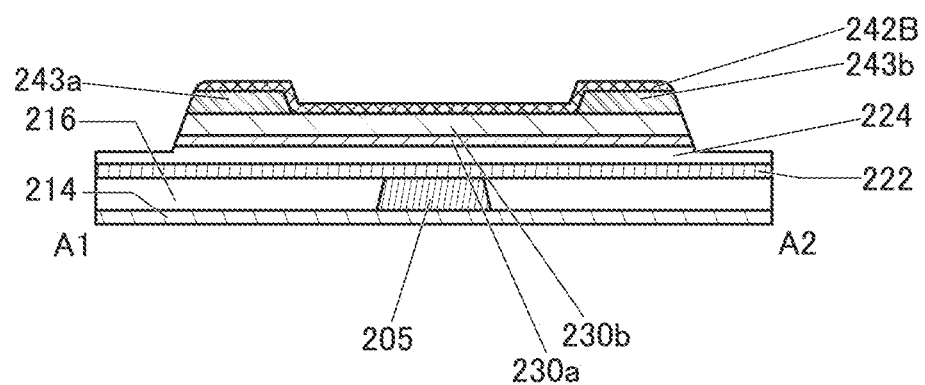

Next, an oxide film 230A and an oxide film 230B are deposited in this order over the insulator 224 (see FIG. 3). Note that the oxide films are preferably deposited successively without being exposed to an atmospheric environment. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. Increasing the proportion of oxygen contained in the sputtering gas can increase the amount of excess oxygen in the deposited oxide films. In the case where the above oxide films are deposited by a sputtering method, the above In-M-Zn oxide target can be used. Furthermore, a direct current (DC) power source or an alternating current (AC) power source such as a radio frequency (RF) power source is connected to a target, and required power can be applied depending on the electric conductivity of the target. For example, in the case where gallium oxide is deposited for an oxide, an RF power source is preferably used. Moreover, in the case where a Ga—Zn oxide is deposited for an oxide, a DC power source or an RF power source is used depending on the electric conductivity of the target.

In particular, part of oxygen contained in the sputtering gas is supplied to the insulator 224 during the deposition of the oxide film 230A in some cases. Therefore, the proportion of oxygen contained in the sputtering gas for the oxide film 230A is higher than or equal to 70%, preferably higher than or equal to 80%, further preferably 100%.

In addition, in the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. In a transistor in which an oxygen-deficient oxide semiconductor is used for its channel formation region, comparatively high field-effect mobility can be obtained. Furthermore, when deposition is performed while the substrate is heated, the crystallinity of the oxide film can be improved. Note that one embodiment of the present invention is not limited thereto. In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained.

In this embodiment, the oxide film 230A is deposited by a sputtering method using a target with In:Ga:Zn=1:1:0.5 [atomic ratio] (2:2:1 [atomic ratio]) or 1:3:4 [atomic ratio]. In addition, the oxide film 230B is deposited by a sputtering method using a target with In:Ga:Zn=4:2:4.1 [atomic ratio]. Note that each of the oxide films is formed to have characteristics required for the oxide 230 by selecting the deposition condition and the atomic ratio as appropriate.

In addition, it is preferable that the sputtering gas be highly purified in the deposition of the oxide film 230A and the oxide film 230B. For example, as an oxygen gas or a rare gas used as a sputtering gas, a gas that is highly purified to have a dew point −60° C. or lower, preferably −100° C. or lower is used. When the highly purified sputtering gas is used for the deposition, entry of moisture or the like into the oxide 230 can be prevented as much as possible.

Furthermore, in the case where the oxide film 230A and the oxide film 230B are deposited by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5 \times 10^{-7}$ Pa to $1 \times 10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1 \times 10^{-4}$ Pa, further preferably lower than or equal to $5 \times 10^{-5}$ Pa.

Next, heat treatment may be performed. For the heat treatment, the conditions for the above heat treatment can be used. Through the heat treatment, impurities such as water and hydrogen in the oxide film 230A and the oxide film 230B can be removed, for example. In this embodiment, treatment is performed at 400° C. in a nitrogen atmosphere for 1 hour, and treatment is successively performed at 400° C. in an oxygen atmosphere for 1 hour.

Next, a conductive film is formed over the oxide film 230B, and the conductive film is partly removed by a lithography method to form a conductor layer 243A. Although the conductor layer 243A has an opening in FIG. 3, this embodiment is not limited to this. In this step, a portion of the conductive film to be the conductor layer 243A that corresponds to a region between the conductor 243a and the conductor 243b is removed. For example, the conductive film to be the conductor layer 243A may be divided into an island-shaped conductor corresponding to the conductor 243a and an island-shaped conductor corresponding to the conductor 243b.

In this step, the insulator 222, the insulator 224, the oxide film 230A, the oxide film 230B, and the conductive film to be the conductor layer 243A are preferably formed without exposure to the air. For example, a multi-chamber deposition apparatus described later may be used.

Then, a conductive film 242A is formed over the oxide film 230B and the conductor layer 243A. The conductive film 242A is formed to be in contact with a top surface and a side surface of the conductor layer 243A and in contact with a top surface of the oxide film 230B that is not covered with the conductor layer 243A (see FIG. 3).

Next, the oxide film 230A, the oxide film 230B, the conductor layer 243A, and the conductive film 242A are processed into island shapes, so that the oxide 230a, the oxide 230b over the oxide 230a, the conductor 243 (the conductor 243a and the conductor 243b) over the oxide 230b, and a conductor layer 242B over the oxide 230b and the conductor 243 are formed. Note that in this step, the thickness of the insulator 224 in a region that does not overlap with the oxide 230a is reduced in some cases (see FIG. 4).

Here, the oxide 230a, the oxide 230b, and the conductor layer 242B are formed to at least partly overlap with the conductor 205. In addition, a structure may be employed in which an angle formed between side surfaces of the oxide 230a, the oxide 230b, the conductor 243, and the conductor layer 242B and a top surface of the insulator 222 is an acute angle. In that case, the angle formed between the side surfaces of the oxide 230a, the oxide 230b, the conductor 243, and the conductor layer 242B and the top surface of the insulator 222 is preferably greater than or equal to 60° and less than 70°. With such a shape, coverage with the insulator 254 and the like can be improved in a later step, so that defects such as voids can be reduced. Alternatively, side surfaces of the oxide 230a, the oxide 230b, the conductor 243, and the conductor layer 242B may be substantially perpendicular to the top surface of the insulator 222. When the side surfaces of the oxide 230a, the oxide 230b, the conductor 243, and the conductor layer 242B are substantially perpendicular to the top surface of the insulator 222, the plurality of transistors 200 can be provided in a smaller area at a higher density.

In addition, a curved surface is preferably provided between the side surfaces of the conductor 243 and the conductor layer 242B, and a top surface of the conductor layer 242B. That is, an end portion of the side surfaces and an end portion of the top surface are preferably curved (such shapes are hereinafter also referred to as rounded shapes). The radius of curvature of the curved surface at end portions of the conductor 243 and the conductor layer 242B is greater than or equal to 3 nm and less than or equal to 10 nm, preferably greater than or equal to 5 nm and less than or equal to 6 nm, for example. When the end portions are not angular, coverage with films in a later deposition process can be improved.

Note that the oxide film 230A, the oxide film 230B, the conductor layer 243A, and the conductive film 242A are processed by a lithography method. In addition, a dry etching method or a wet etching method can be used for the processing. Processing by a dry etching method is suitable for microfabrication.

In addition, in some cases, the treatment such as dry etching causes attachment or diffusion of impurities due to an etching gas or the like to a surface or an inside of the oxide 230a, the oxide 230b, or the like. Examples of the impurities include fluorine and chlorine.

In order to remove the impurities and the like, cleaning is performed. Examples of a cleaning method include wet cleaning using a cleaning solution or the like, plasma treatment using plasma, and cleaning by heat treatment, and these cleanings may be performed in appropriate combination.

As the wet cleaning, cleaning treatment may be performed using an aqueous solution obtained by diluting an oxalic acid, a phosphoric acid, a hydrofluoric acid, or the like with carbonated water or pure water. Alternatively, ultrasonic cleaning using pure water or carbonated water may be performed. In this embodiment, the ultrasonic cleaning using pure water or carbonated water is performed.

Then, heat treatment may be performed. For the conditions of the heat treatment, the conditions for the above heat treatment can be used.

Next, a dummy gate film to be a dummy gate layer 262A is deposited over the insulator 224, the oxide 230a, the oxide 230b, the conductor 243, and the conductor layer 242B.

The dummy gate film to be the dummy gate layer 262A is processed to be used as a dummy gate. The dummy gate is an interim gate electrode. That is, the dummy gate film to be the dummy gate layer 262A is processed to form an interim gate electrode, the dummy gate is removed in a later step, and a gate electrode is formed using a conductive film or the like instead. Thus, a film that is easily processed minutely and easily removed is preferably used as the dummy gate film to be the dummy gate layer 262A.

The dummy gate film to be the dummy gate layer 262A can be deposited by a sputtering method, a CVD method, an MBE method, a PLD method, an ALD method, or the like. An insulator, a semiconductor, or a conductor can be used, for example. Specifically, silicon such as polysilicon, microcrystalline silicon, or amorphous silicon, or a metal film of aluminum, titanium, tungsten, or the like is used, for example. Alternatively, a film containing carbon, SOG (Spin On Glass), a resin film, or the like may be formed by a coating method. For example, a photoresist, polyester, polyolefin, polyamide (nylon, aramid, or the like), polyimide, polycarbonate, acrylic, or the like can be given. When SOG or the resin film is formed by a coating method, a surface of the dummy gate film can be made flat. When the surface of the dummy gate film is made flat in this manner, the dummy gate film can be easily processed minutely and easily removed.

In addition, the dummy gate film to be the dummy gate layer 262A can be a multilayer film using different kinds of films. For example, the dummy gate film to be the dummy gate layer 262A can have a two-layer structure in which a conductive film and a resin film over the conductive film are formed. When the dummy gate film has such a structure, the conductive film functions as a stopper film for CMP treatment in a later CMP process in some cases, for example. Alternatively, the end point of the CMP treatment can be detected in some cases, so that processing variations can be reduced in some cases.

Figure 5A:
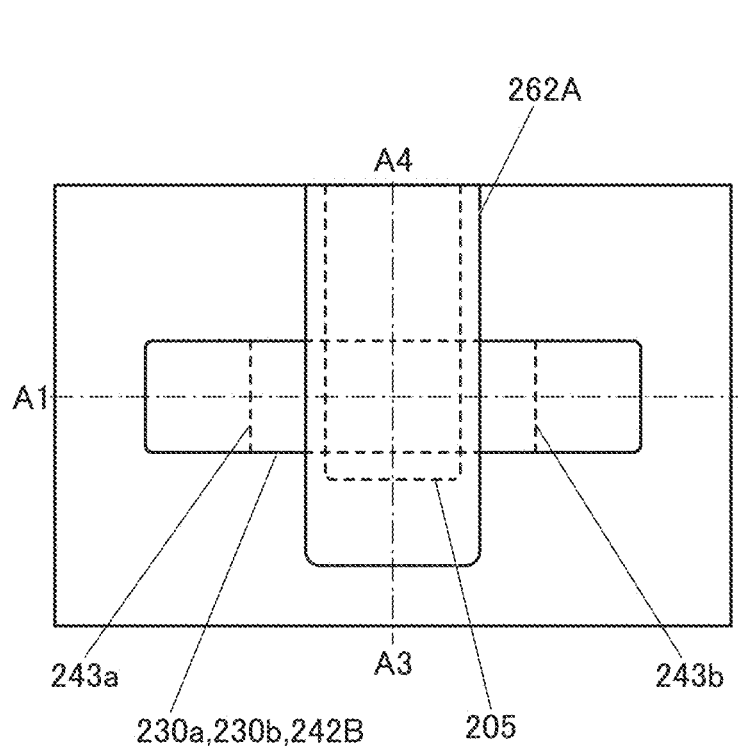
[FIGS. 5A to 5C] A top view and cross-sectional views illustrating a method for manufacturing a semiconductor device according to one embodiment of the present invention.
Figure 5C:
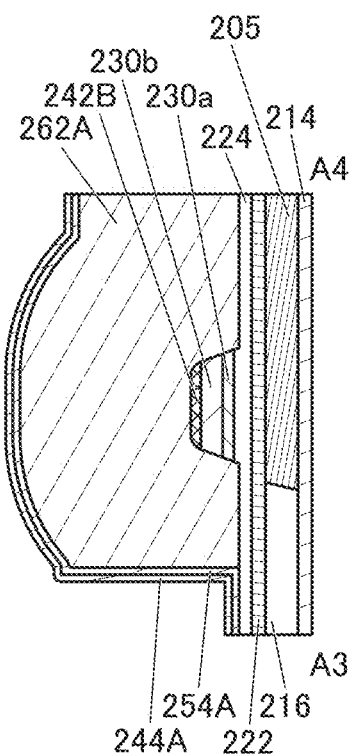
Figure 5B:
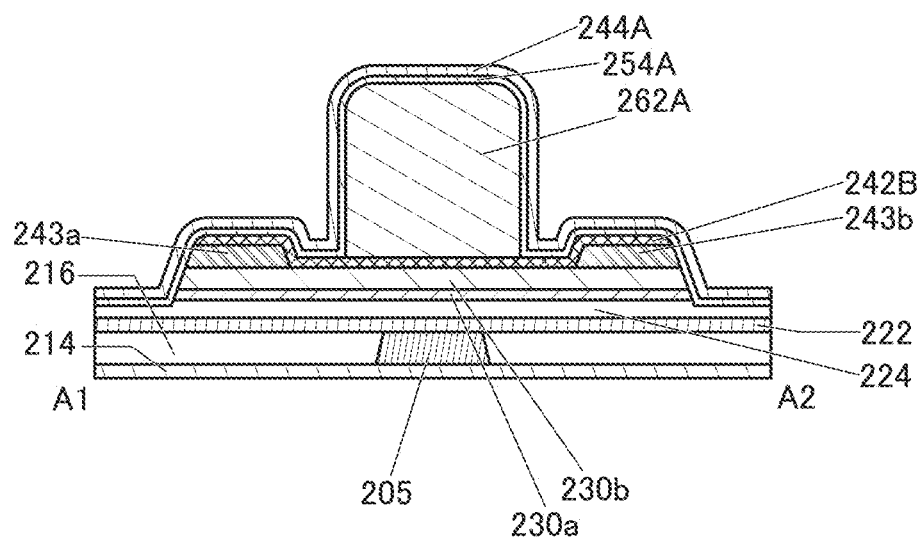

Then, the dummy gate film to be the dummy gate layer 262A is etched by a lithography method, so that the dummy gate layer 262A is formed (see FIG. 5). The dummy gate layer 262A is formed to at least partly overlap with the conductor 205 and the oxide 230. For example, the dummy gate layer 262A may be formed over the conductor layer 242B that is positioned between the conductor 243a and the conductor 243b.

Next, an insulating film 254A is deposited to cover the oxide 230a, the oxide 230b, the conductor 243a, the conductor 243b, the conductor layer 242B, and the dummy gate layer 262A. Then, an insulating film 244A may be deposited over the insulating film 254A (see FIG. 5). The insulating film 254A and the insulating film 244A can be deposited by a sputtering method, a CVD method, an MBE method, a PLD method, an ALD method, or the like.

As the insulating film 254A, an insulating film having a function of inhibiting diffusion of oxygen and impurities such as hydrogen is preferably used. For example, an aluminum oxide film is preferably deposited by an ALD method. With use of the ALD method that provides good coverage, it is possible to form the insulating film 254A having uniform thickness even in a step portion generated by the oxide 230a, the oxide 230b, the conductor 243b, the conductor 243b, the conductor layer 242B, and the dummy gate layer 262A.

As the insulating film 244A, an insulating film having a function of inhibiting diffusion of oxygen and impurities such as hydrogen is preferably used. For example, an aluminum oxide film is preferably deposited by a sputtering method.

Alternatively, aluminum nitride, silicon nitride, silicon nitride oxide, or the like may be deposited for the insulating film 244A. For example, in the case where an aluminum nitride film is deposited as the insulating film 244A by reactive sputtering using an aluminum target, the flow rate of a nitrogen gas to the total flow rate of a deposition gas is higher than or equal to 30% and lower than or equal to 100%, preferably higher than or equal to 40% and lower than or equal to 100%, further preferably higher than or equal to 50% and lower than or equal to 100%.

Alternatively, aluminum oxide may be deposited for the insulating film 244A while the substrate is heated at a high temperature. The substrate heating temperature during the deposition of the insulating film 244A is higher than or equal to 200° C., preferably higher than or equal to 250° C., further preferably higher than or equal to 350° C. In that case, the deposition of aluminum oxide for the insulating film 254A by an ALD method can prevent the dummy gate layer 262A from being deformed when the insulating film 244A is deposited at the above temperature.

Alternatively, fluorine may be added after deposition of either one or both of the insulating film 244A and the insulating film 254A. Fluorine can be added to either one or both of the insulating film 244A and the insulating film 254A in such a manner that plasma treatment is performed in an atmosphere containing a fluorine-based gas (e.g., $CF_4$ or the like) or doping of a gas containing fluorine is performed. When fluorine is added to either one or both of the insulating film 244A and the insulating film 254A, hydrogen contained in the film is expected to be terminated or be subjected to gettering by fluorine.

Accordingly, it is possible to prevent outward diffusion of excess oxygen contained in the insulator 224 and entry of impurities such as water and hydrogen into the insulator 224 from the outside. Note that the deposition of the insulating film 244A can be omitted.

Next, an insulating film to be the insulator 280 is deposited over the insulating film 244A. The insulating film to be the insulator 280 can be deposited by a sputtering method, a CVD method, an MBE method, a PLD method, an ALD method, or the like.

Figure 6A:
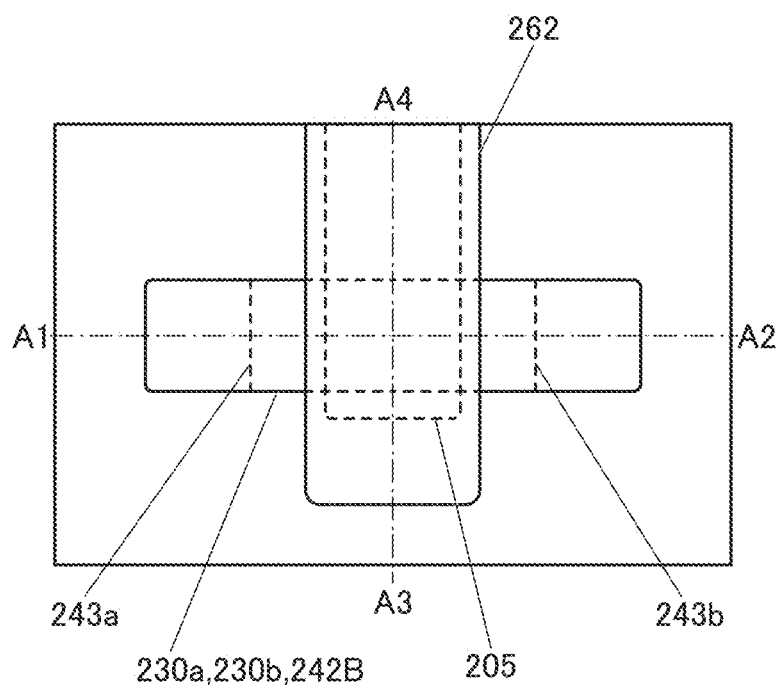
[FIGS. 6A to 6C] A top view and cross-sectional views illustrating a method for manufacturing a semiconductor device according to one embodiment of the present invention.

Next, the insulating film to be the insulator 280, the dummy gate layer 262A, the insulating film 254A, and the insulating film 244A are partly removed until part of the dummy gate layer 262A is exposed, so that the insulator 280, a dummy gate 262, the insulator 254, and the insulator 244 are formed (see FIG. 6). CMP treatment is preferably employed for forming the insulator 280, the dummy gate 262, the insulator 254, and the insulator 244.

Figure 6C:
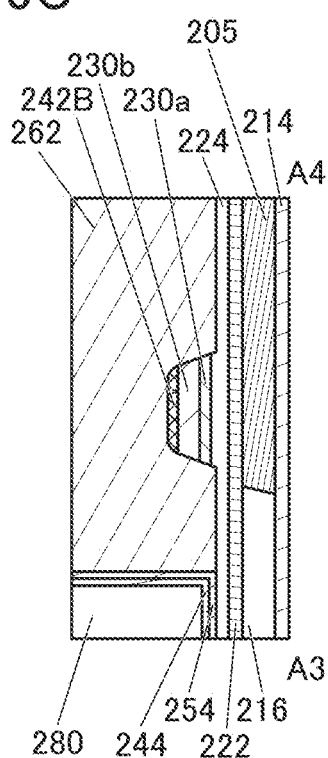
Figure 6B:
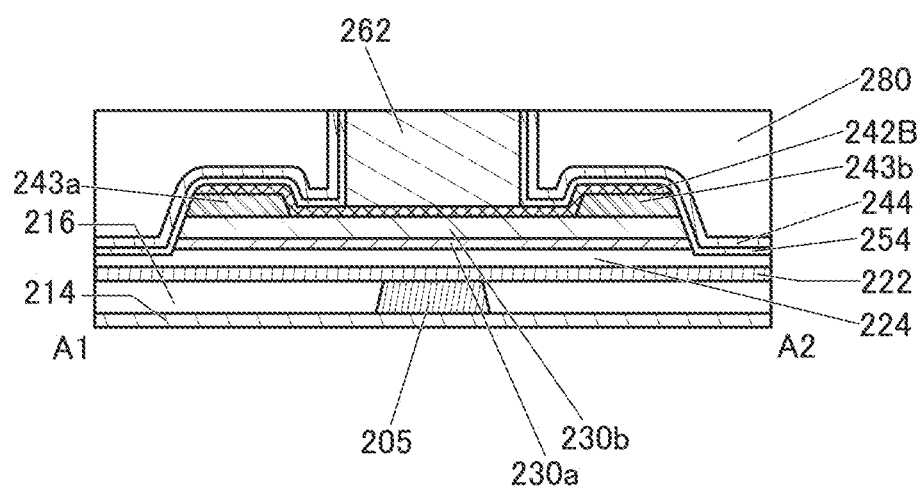

In addition, as described above, when the dummy gate layer 262A has a two-layer structure in which a conductive film and a resin film over the conductive film are formed, for example, in a CMP process, the conductive film functions as a stopper film for CMP treatment in some cases. Alternatively, the end point of the CMP treatment can be detected with the conductive film in some cases, so that variations in the height of the dummy gate 262 can be reduced in some cases. As illustrated in FIG. 6(B) and FIG. 6(C), a top surface of the dummy gate 262 is substantially aligned with the top surfaces of the insulator 254, the insulator 244, and the insulator 280.

Figure 7A:
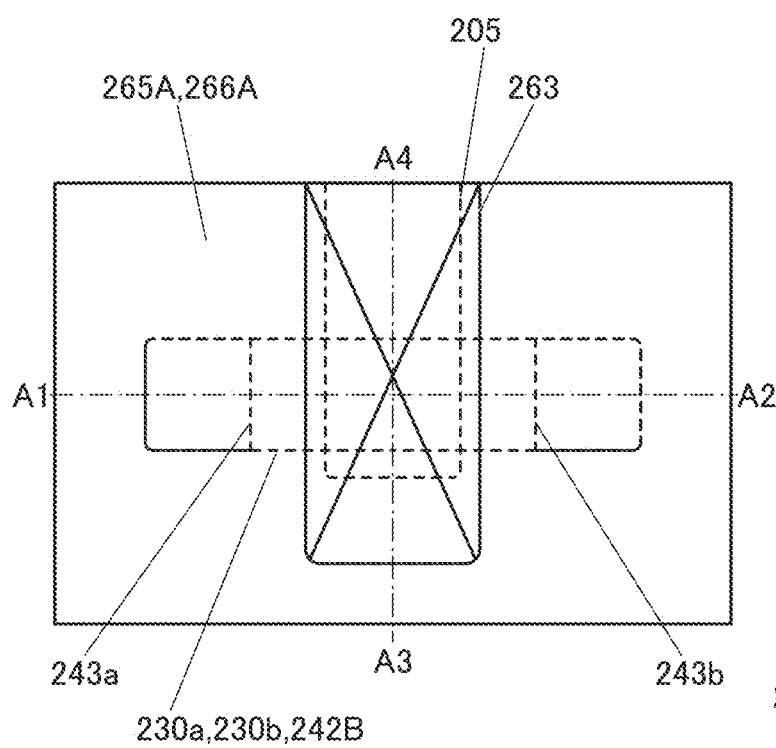
[FIGS. 7A to 7C] A top view and cross-sectional views illustrating a method for manufacturing a semiconductor device according to one embodiment of the present invention.
Figure 7C:
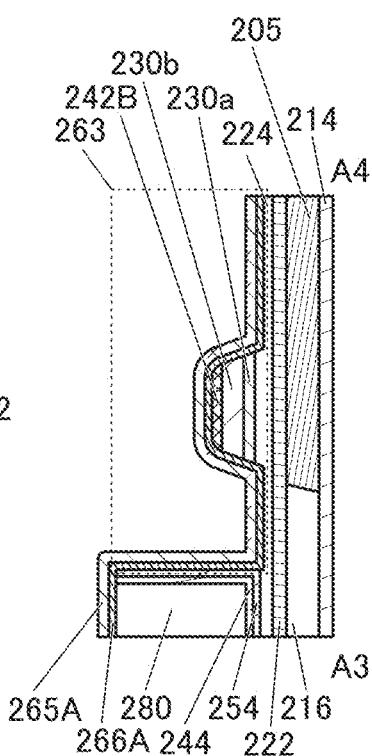
Figure 7B:
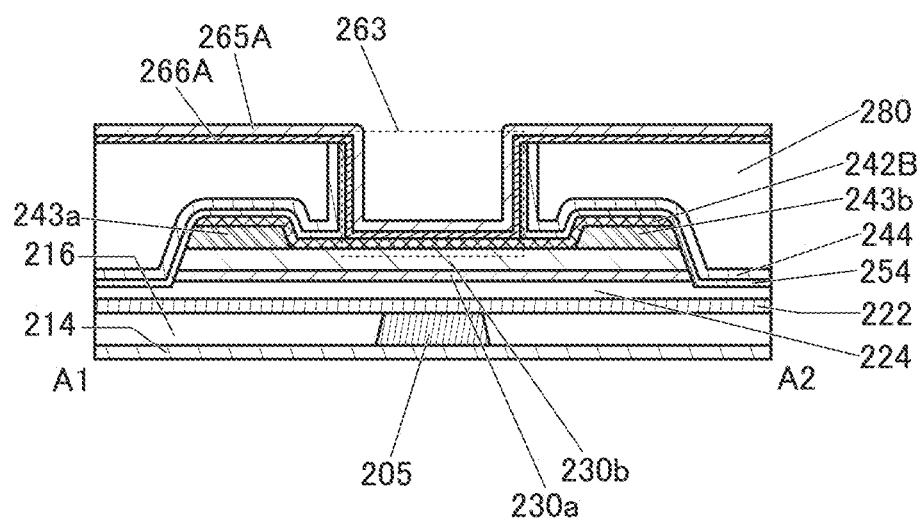

Next, the dummy gate 262 is removed to form an opening 263 (see FIG. 7). The dummy gate 262 can be removed by wet etching, dry etching, ashing, or the like. Alternatively, a plurality of above treatments may be performed in appropriate combination. For example, wet etching treatment may be performed after ashing treatment. By removing the dummy gate 262, part of a surface of the conductor layer 242B is exposed from the opening 263.

Next, an insulating film 266A is deposited over the insulator 280, the insulator 244, the insulator 254, and the conductor layer 242B, and then a dummy film 265A is deposited thereover (see FIG. 7). In this step, the insulating film 266A needs to be deposited on a sidewall of the opening 263, in other words, deposited to be in contact with the insulator 254; a distance between the conductor 242a and the conductor 242b, that is, substantial channel length is determined by the thickness of the dummy film 265A. Thus, the insulating film 266A and the dummy film 265A are preferably deposited by an ALD method that provides good coverage and makes fine adjustment of the thickness comparatively easily. The thicknesses of the insulating film 266A and the dummy film 265A may be determined as appropriate in accordance with the electrical characteristics required for the transistor 200. For example, the thickness of the insulating film 266A may be greater than or equal to 0.5 nm, preferably greater than or equal to 1 nm. For example, the thickness of the dummy film 265A may be greater than or equal to 5 nm and less than or equal to 25 nm, preferably greater than or equal to 10 nm and less than or equal to 20 nm.

Note that it is preferable to use a film that can be easily processed minutely and easily removed as the dummy film 265A because the dummy film 265A is finally removed. For example, in this embodiment, aluminum oxide deposited by an ALD method may be used as the dummy film 265A. The insulating film 266A functions as an etching stopper when the dummy film 265A is removed. For this reason, an insulator having a lower etching rate in etching for removing the dummy film 265A than the dummy film 265A is used. For example, in this embodiment, hafnium oxide deposited by an ALD method may be used as the insulating film 266A.

Figure 8A:
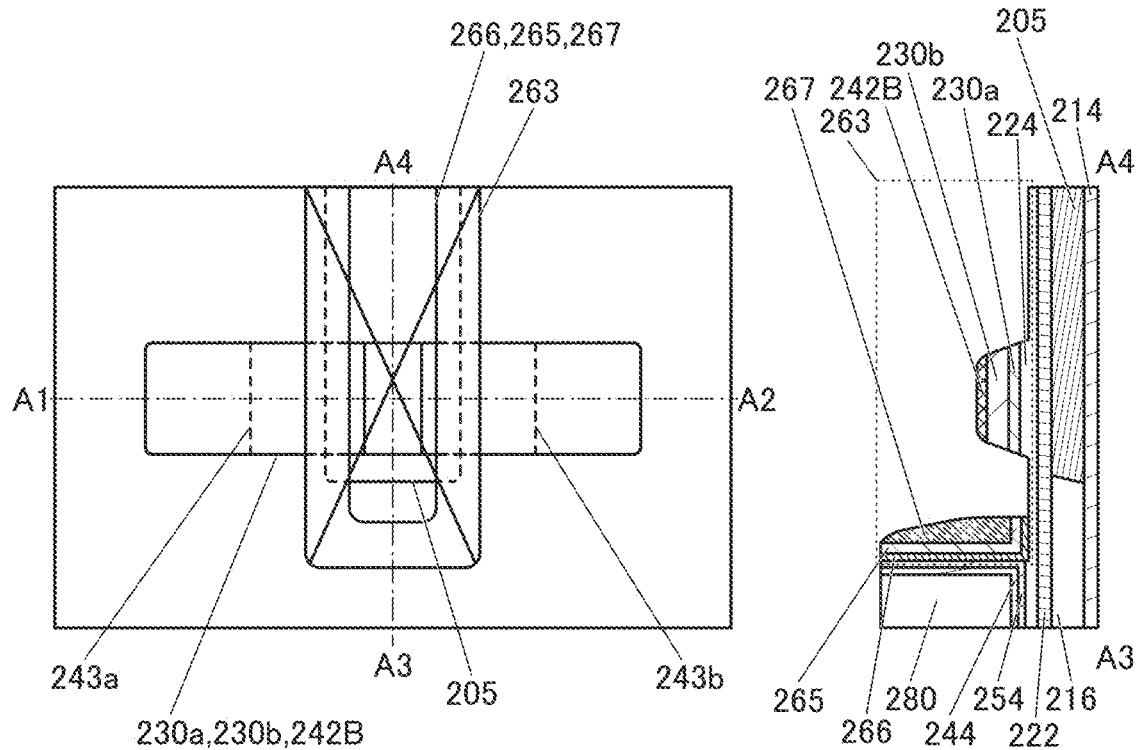
[FIGS. 8A to 8C] A top view and cross-sectional views illustrating a method for manufacturing a semiconductor device according to one embodiment of the present invention.
Figure 8C:
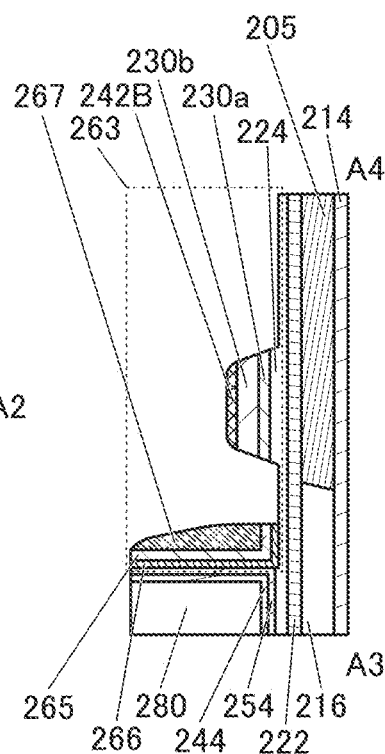
Figure 8B:
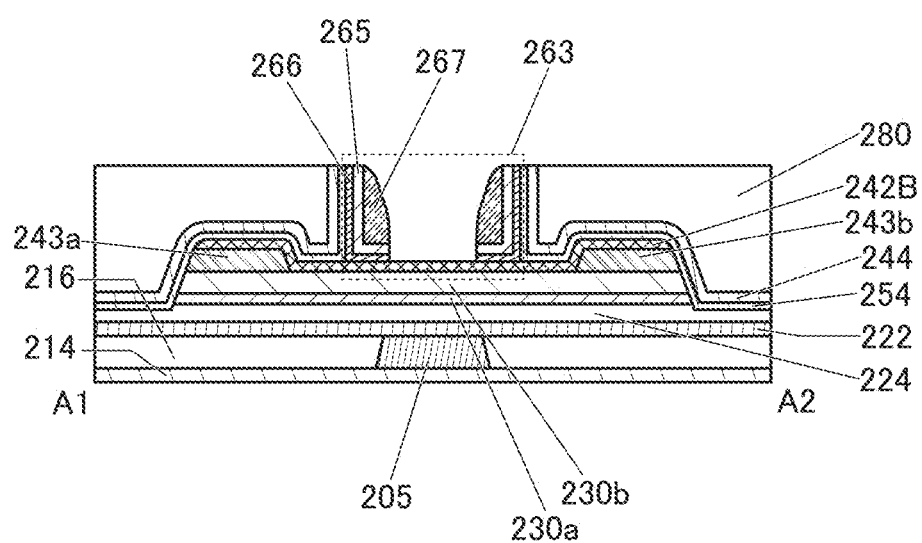

Next, anisotropic etching is performed on the insulating film 266A and the dummy film 265A to remove part of the insulating film 266A and the dummy film 265A, so that the insulator 266 in contact with a top surface of the conductor layer 242B and a side surface of the insulator 254, a dummy layer 265 over the insulator 266, and a by-product 267 over the dummy layer 265 are formed (see FIG. 8). Note that the insulator 266, the dummy layer 265, and the by-product 267 remain only in a vicinity of a side surface of the opening 263. In the subsequent step, the insulator 266, the dummy layer 265, and the by-product 267 are not formed in a portion where the channel formation region of the transistor 200 is formed, and the conductive layer 242 B is exposed. Thus, cross-sectional shapes of the insulator 266 and the dummy layer 265 are each an L-shaped shape as illustrated in FIGS. 8(B) and (C).

Note that dry etching is preferably employed as anisotropic etching. As a gas used for the dry etching, for example, one of a $C_4F_6$ gas, a $C_5F_6$ gas, a $C_4F_8$ gas, a $CF_4$ gas, a $SF_6$ gas, a $CHF_3$ gas, a $Cl_2$ gas, a $BCl_3$ gas, a $SiCl_4$ gas and the like can be used alone or two or more of the gases can be mixed and used. Alternatively, an oxygen gas, a helium gas, an argon gas, a hydrogen gas, or the like can be added to any of the above gases as appropriate. These etching gases can be switched as appropriate depending on objects to be etched (the insulating film 266A and the dummy film 265A).

Any of the above dry etching apparatuses can be used as a dry etching apparatus; however, a parallel-plate-type dry etching apparatus in which high-frequency power sources with different frequencies are connected to the facing electrodes is preferably used because a parallel-plate-type dry etching apparatus can perform anisotropic etching relatively easily.

The etching step is preferably performed under a condition where the by-product 267 is easily formed. As a condition of such an etching step, for example, a gas containing a large amount of carbon is preferably used as at least one of the etching gases. Specifically, the carbon-rich gas preferably contains carbon and fluorine and in the gas, the atomic ratio of carbon to fluorine is preferably 50% or more. As such an etching gas, for example, a $C_4F_6$ gas, a $C_5F_6$ gas, a $C_4F_8$ gas, or the like can be used alone or in combination. Alternatively, an oxygen gas, a helium gas, an argon gas, a nitrogen gas, a hydrogen gas, or the like can be added to any of the above gases as appropriate.

By performing etching using such an etching gas, the gas is decomposed by plasma, and carbon contained in the gas is reacted with a component (e.g., aluminum or the like) contained in the dummy film 265A, resulting in formation of a carbon compound. Furthermore, fluorine contained in the gas and the component (e.g., aluminum or the like) contained in the dummy film 265A react with each other, resulting in formation of a fluorine compound. The carbon compound and the fluorine compound are deposited over the dummy layer 265 remaining in the vicinity of the side surface of the opening 263, so that the by-product 267 is formed. Thus, the formed by-product 267 contains components contained in the dummy layer 265, the insulator 266, the insulator 280, the etching gas, and the like. Consequently, the product 267 may contain aluminum, fluorine, and carbon.

Figure 9A:
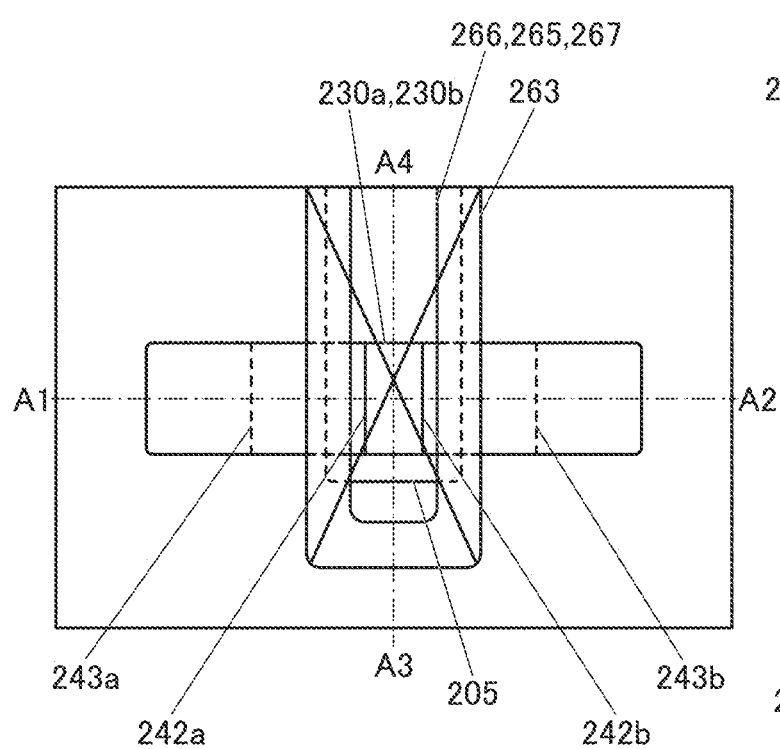
[FIGS. 9A to 9C] A top view and cross-sectional views illustrating a method for manufacturing a semiconductor device according to one embodiment of the present invention.
Figure 9C:
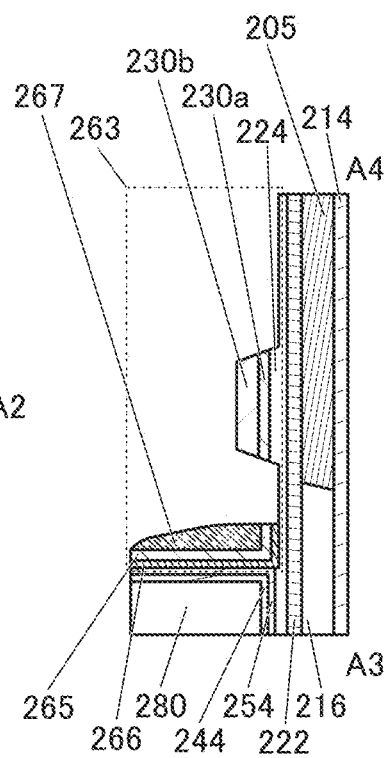
Figure 9B:
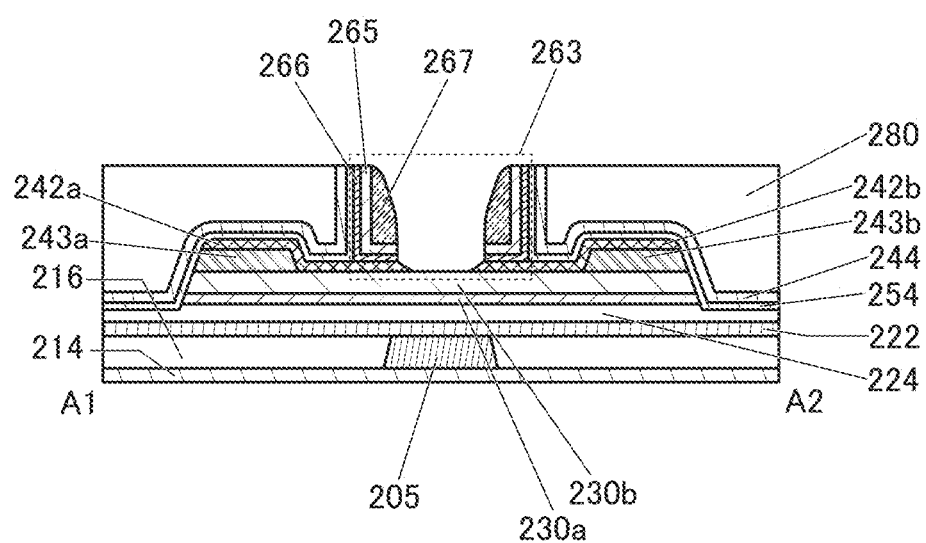

Next, part of the conductor layer 242B is removed using the insulator 266, the dummy layer 265, and the by-product 267 as a mask to form the conductor 242a and the conductor 242b (see FIG. 9). For the etching of the conductor layer 242B, a dry etching method is preferably used. Note that etching of the insulating film 266A and the dummy film 265A and the etching of the conductor layer 242B may be performed successively.

The by-product 267 is formed with dry etching treatment under the above conditions, whereby the insulator 266 and the dummy layer 265 can be each processed into an L shape. The conductor 242a and the conductor 242b can be formed in portions overlapping with the insulator 266 and the dummy layer 265; thus, the length T1 of the Lov region can be sufficiently long. In contrast, in the case where the above etching is performed under conditions where the by-product 267 is not formed, the thickness of the dummy film 265A needs to be approximately the same as the sum of the thickness of the dummy layer 265 and the thickness of the by-product 267 shown in FIG. 9 to obtain the same length T1 of the Lov region. Thus, when the above etching is performed under conditions where the by-product 267 is not formed, the deposition time of the dummy film 265A becomes extremely long. However, when the manufacturing method described in this embodiment is used, the deposition time of the dummy film 265A is shortened, whereby productivity of the semiconductor device can be increased.

Figure 10A:
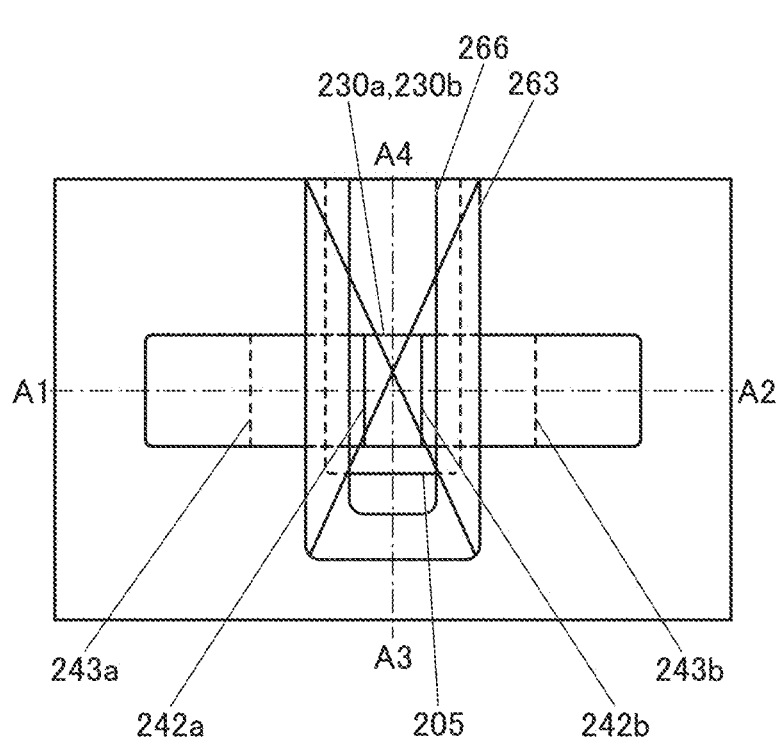
[FIGS. 10A to 10C] A top view and cross-sectional views illustrating a method for manufacturing a semiconductor device according to one embodiment of the present invention.
Figure 10C:
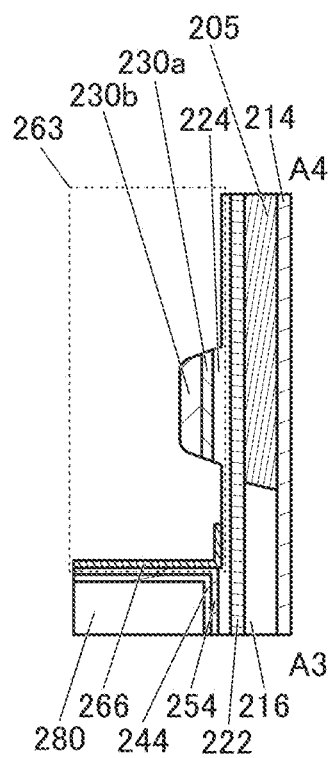
Figure 10B:
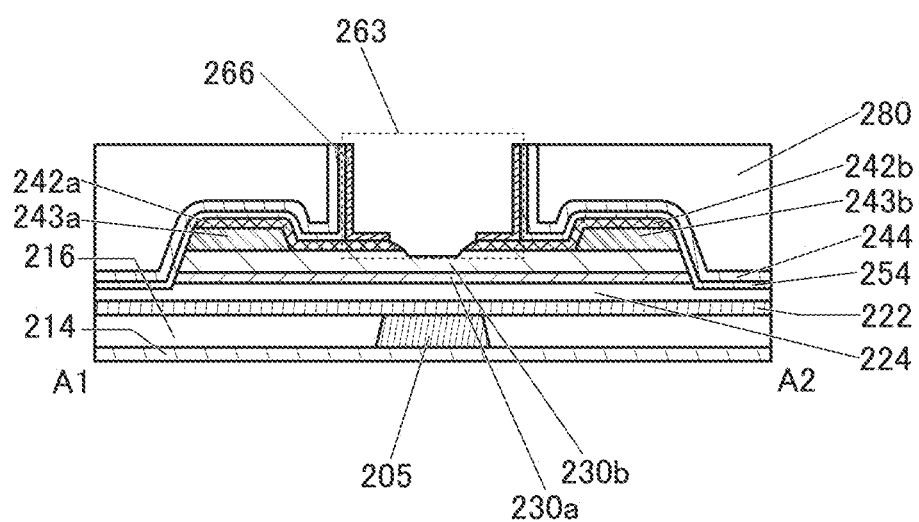
Figure 11A:
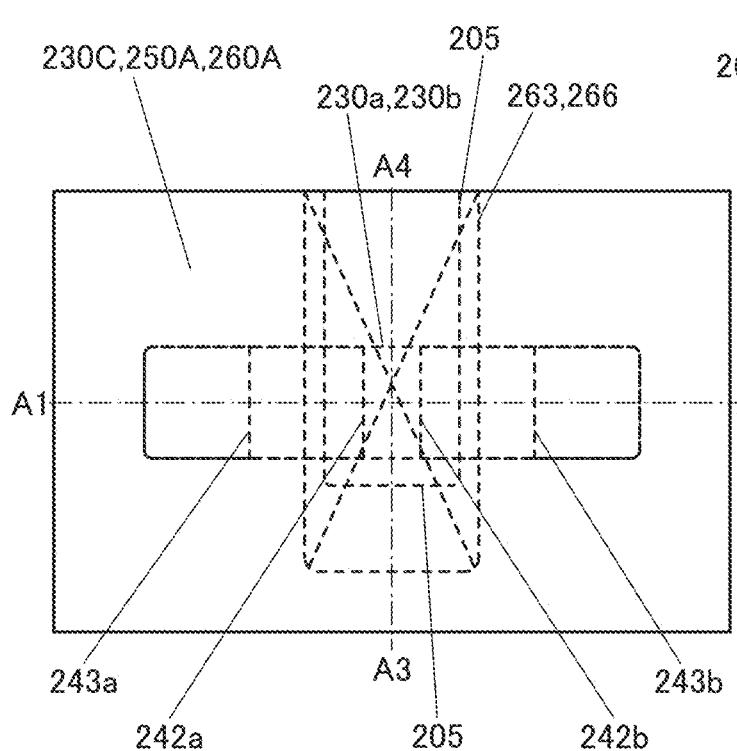
[FIGS. 11A to 11C] A top view and cross-sectional views illustrating a method for manufacturing a semiconductor device according to one embodiment of the present invention.
Figure 11C:
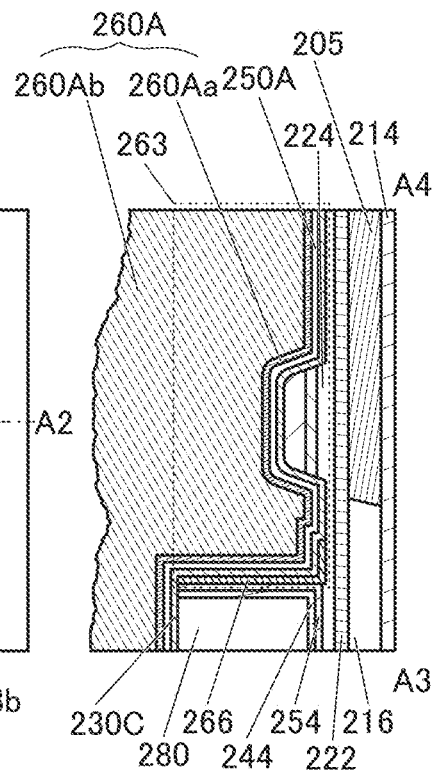
Figure 11B:
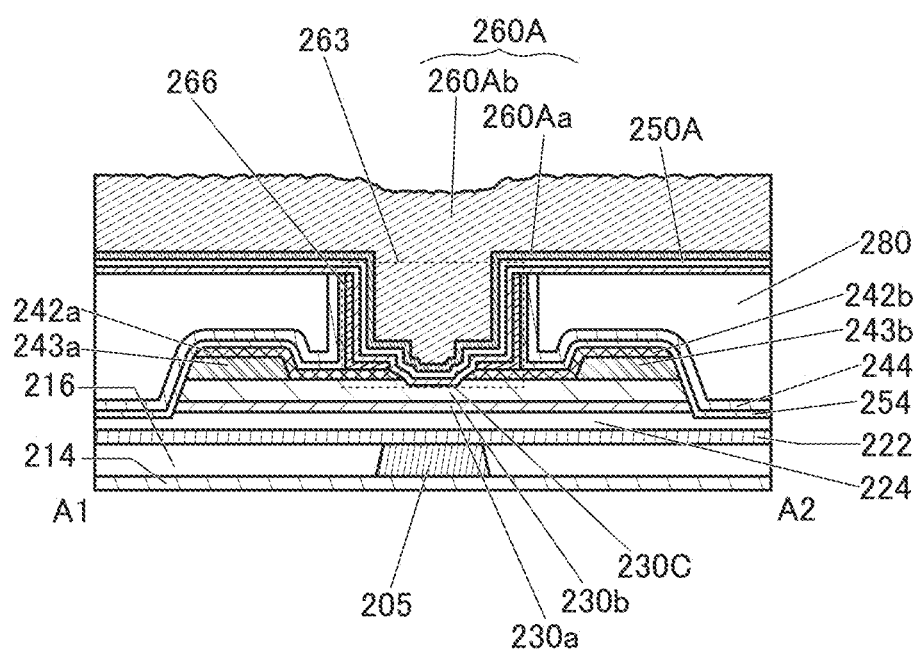

Next, the dummy film 265 and the by-product 267 are selectively removed by isotropic etching (see FIG. 10). As the isotropic etching, wet etching or etching using a reactive gas is used, for example. When the dummy layer 265 and the by-product 267 are etched, the insulator 266 functions as an etching stopper. Accordingly, when the dummy layer 265 and the by-product 267 are etched, the insulator 254 and the insulator 244 can be prevented from being etched. In this manner, the distance between the conductor 242a and the conductor 242b can be shorter than the length of the opening 263 in the channel length direction. At this point, the part of the top surface of the oxide 230b that is exposed between the conductor 242a and the conductor 242b is removed in some cases.

Next, heat treatment is preferably performed before deposition of an oxide film 230C. The heat treatment may be performed at a temperature higher than or equal to 100° C. and lower than or equal to 400° C., and may be performed at 200° C., for example. Alternatively, the heat treatment is preferably performed at the same temperature as the deposition temperature of the oxide film 230C. Here, the deposition temperature is not limited to the substrate temperature during the deposition, and includes the set temperature of the deposition apparatus. For example, in the case where the oxide film 230C is deposited at 300° C., the heat treatment is preferably performed at 300° C. The heat treatment is preferably performed under reduced pressure, and for example, may be performed in a vacuum atmosphere. A vacuum atmosphere is kept by evacuation with a turbomolecular pump or the like. Pressure in a vacuum atmosphere of the treatment chamber is lower than or equal to $1\times10^{-2}$ Pa, preferably lower than or equal to $1\times10^{-3}$ Pa.

Next, the oxide film 230C is deposited to fill the opening 263. In addition, the oxide film 230C is preferably deposited successively without being exposed to the air after the heat treatment. For example, it is preferable that the heat treatment and the deposition treatment be successively performed in different chambers by using a multi-chamber type deposition apparatus described later, or the like. The treatment can remove impurities such as moisture, hydrogen, or carbon adsorbed onto the surfaces or the like of the oxide 230a and the oxide 230b, and can reduce the moisture concentration and hydrogen concentration in the oxide 230a and the oxide 230b. An impurity that is removed by the heat treatment includes an impurity having a bond of hydrogen and carbon, an impurity having a bond of hydrogen and oxygen, and the like. Furthermore, it is possible to prevent reentry of impurities such as hydrogen into the oxide 230 by performing heat treatment and deposition successively without exposure to the air.

The oxide film 230C can be deposited by a sputtering method, a CVD method, an MBE method, a PLD method, an ALD method, or the like. An oxide film to be the oxide film 230C is deposited by a method similar to that for the oxide film to be the oxide film 230A or the oxide film 230B in accordance with characteristics required for the oxide film 230C. An In—Ga—Zn oxide or an oxide that does not contain In can be used for the oxide film 230C. As the oxide that does not contain In, a Ga—Zn oxide, gallium oxide, or the like can be used. Alternatively, as the oxide film 230C, a stacked-layer structure of an In—Ga—Zn oxide and an oxide that does not contain In may be used. The oxide film 230C is deposited by a sputtering method using a target with In:Ga:Zn=1:3:4 [atomic ratio] or 4:2:4.1 [atomic ratio], Ga:Zn=2:1 [atomic ratio], or Ga:Zn=2:5 [atomic ratio]. In this embodiment, as the oxide film 230C, a first oxide film to be the oxide 230c1 is formed by a sputtering method using a target with In:Ga:Zn=4:2:4.1 [atomic ratio], and a second oxide film to be the oxide 230c2 is formed over the first oxide film using a target with Ga:Zn=2:1 [atomic ratio].

The oxide film 230C is preferably deposited while the substrate is heated. At this time, when the substrate temperature is higher than or equal to 300° C., oxygen vacancies in the oxide film 230B and the oxide film 230C can be reduced. In addition, for example, the oxide film 230C may be deposited at the same temperature as the deposition temperature of an insulating film 250A to be described later. Furthermore, when the oxide film 230C is deposited while the substrate is heated in this manner, the crystallinity of the oxide film 230C and the oxide film 230B can be improved.

In particular, in the deposition of the oxide film 230C, part of oxygen contained in the sputtering gas is supplied to the oxide 230a and the oxide 230b, in some cases. Therefore, the proportion of oxygen contained in the sputtering gas for the oxide film 230C is higher than or equal to 70%, preferably higher than or equal to 80%, further preferably 100%. Furthermore, when deposition is performed while the substrate is heated, the crystallinity of the oxide film can be improved.

In addition, it is preferable to employ a stacked-layer structure for the oxide film 230C and use an oxide that does not contain In for the second oxide film because the concentration of In contained in the insulating film 250A to be formed next can be reduced or the insulating film 250A that does not contain In can be formed. Here, in this specification, an insulating film that does not contain In refers to an insulating film whose In concentration measured by secondary ion mass spectrometry (SIMS) is lower than or equal to $1.0\times10^{17}$ atoms/cm$^3$, preferably lower than or equal to $5.0\times10^{16}$ atoms/cm$^3$, further preferably lower than or equal to $1.0\times10^{16}$ atoms/cm$^3$.

Next, heat treatment is preferably performed before deposition of the insulating film 250A. The heat treatment may be performed at a temperature higher than or equal to 100° C. and lower than or equal to 400° C., and may be performed at 200° C., for example. Alternatively, the heat treatment is preferably performed at the same temperature as the deposition temperature of the insulating film 250A. Here, the deposition temperature is not limited to the substrate temperature during the deposition, and includes the set temperature of the deposition apparatus. For example, in the case where the insulating film 250A is deposited at 350° C., the heat treatment is preferably performed at 350° C. The heat treatment is preferably performed under reduced pressure, and for example, may be performed in a vacuum atmosphere. A vacuum atmosphere is kept by evacuation with a turbomolecular pump or the like. Pressure in a vacuum atmosphere of the treatment chamber is lower than or equal to $1 \times 10^{-2}$ Pa, preferably lower than or equal to $1 \times 10^{-3}$ Pa.

In addition, the insulating film 250A is preferably deposited successively without being exposed to the air after the heat treatment. For example, it is preferable that the heat treatment and the deposition treatment be successively performed in different chambers by using a multi-chamber deposition apparatus. The treatment can remove impurities such as moisture, hydrogen, or carbon adsorbed onto the surface or the like of the oxide film 230C, and can reduce the moisture concentration and hydrogen concentration in the oxide 230a, the oxide 230b, and the oxide film 230C. An impurity that is removed by the heat treatment includes an impurity having a bond of hydrogen and carbon, an impurity having a bond of hydrogen and oxygen, and the like. Furthermore, it is possible to prevent reentry of impurities such as hydrogen into the oxide 230 by performing heat treatment and deposition successively without exposure to the air.

Next, the insulating film 250A is deposited. The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of depositing the insulating film 250A is preferably higher than or equal to 300° C. and lower than 450° C., further preferably higher than or equal to 300° C. and lower than 400° C., particularly preferably approximately 350° C. For example, when the insulating film 250A is deposited at 350° C., an insulator having few impurities can be deposited.

Note that oxygen is excited by microwaves to generate high-density oxygen plasma, and the insulating film 250A is exposed to the oxygen plasma, so that oxygen can be introduced into the insulating film 250A.

Furthermore, heat treatment may be performed. For the heat treatment, the conditions for the above heat treatment can be used. The heat treatment can reduce the moisture concentration and hydrogen concentration in the insulating film 250A.

Next, a conductive film 260A including a conductive film 260Aa and a conductive film 260Ab is deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 11).

At this point, the oxide film 230C, the insulating film 250A, the conductive film 260Aa and the conductive film 260Ab are preferably deposited without exposure to the air. For example, a multi-chamber deposition apparatus described later may be used.

Figure 12A:
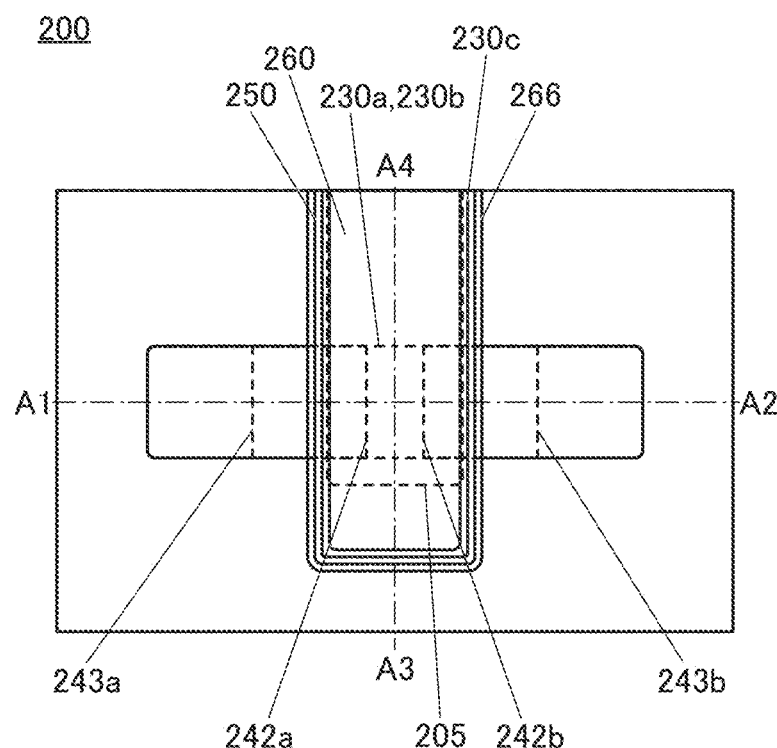
[FIGS. 12A to 12C] A top view and cross-sectional views illustrating a method for manufacturing a semiconductor device according to one embodiment of the present invention.
Figure 12C:
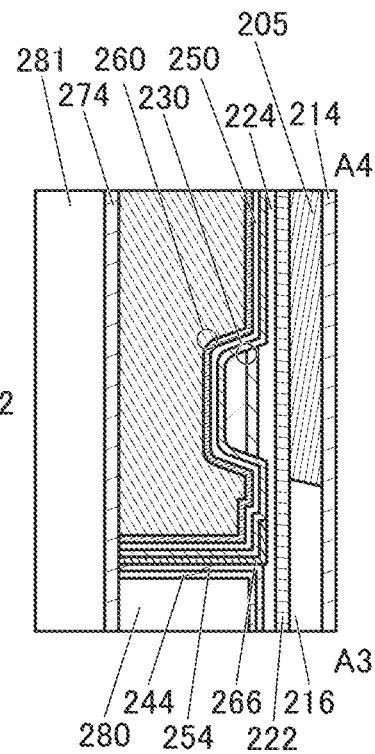
Figure 12B:
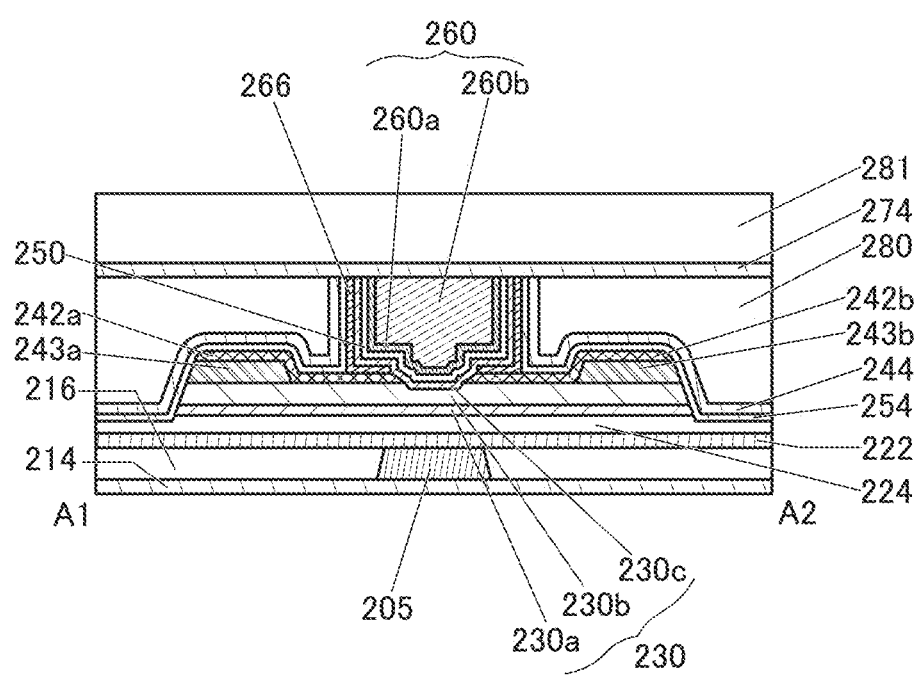

Then, the oxide film 230C, the insulating film 250A, the conductive film 260Aa, and the conductive film 260Ab are partly removed until an upper part of the insulator 280 is exposed, so that the oxide 230c, the insulator 250, and the conductor 260 (the conductor 260a and the conductor 260b) are formed (see FIG. 12). CMP treatment is preferably performed for forming the insulator 230c, the insulator 250, and the conductor 260. As illustrated in FIGS. 12(B) and 12(C), it is preferable that the top surface of the conductor 260 be substantially aligned with the top surfaces of the insulator 250, the oxide 230c, the insulator 266, the insulator 254, the insulator 244, and the insulator 280.

Next, heat treatment may be performed. For the heat treatment, the conditions for the above heat treatment can be used. The heat treatment can reduce the moisture concentration and hydrogen concentration in the insulator 280.

Next, an insulating film to be the insulator 274 is formed over the insulator 280 (see FIG. 12). The insulating film to be the insulator 274 can be deposited by a sputtering method, a CVD method, an MBE method, a PLD method, an ALD method, or the like. An aluminum oxide film is preferably deposited as the insulating film to be the insulator 274 by a sputtering method, for example. When an aluminum oxide film is deposited by a sputtering method, hydrogen contained in the insulator 280 can be prevented from being diffused into the oxide 230 in some cases.

Next, heat treatment may be performed. For the heat treatment, the conditions for the above heat treatment can be used. The heat treatment can reduce the moisture concentration and hydrogen concentration in the insulator 280.

Next, an insulator to be the insulator 281 may be deposited over the insulator 274. The insulating film to be the insulator 281 can be deposited by a sputtering method, a CVD method, an MBE method, a PLD method, an ALD method, or the like (see FIG. 12).

Then, openings reaching the conductor 242a and the conductor 242b are formed in the insulator 254, the insulator 244, the insulator 280, the insulator 274, and the insulator 281. The openings may be formed by a lithography method.

Next, an insulating film to be the insulator 241 is deposited over the insulator 281 and in the openings, and the insulating film is subjected to anisotropic etching to form the insulator 241 (the insulator 241a and the insulator 241b) on sidewalls of the openings. The insulating film can be deposited by a sputtering method, a CVD method, an MBE method, a PLD method, an ALD method, or the like. An insulating film having a function of inhibiting the passage of oxygen is preferably used as the insulating film to be the insulator 241. For example, an aluminum oxide film is preferably deposited by an ALD method. In addition, for the anisotropic etching, a dry etching method or the like may be employed, for example. When sidewall portions of the openings have such structures, the passage of oxygen from the outside can be inhibited and oxidation of the conductor 240a and the conductor 240b to be formed next can be prevented. Furthermore, impurities such as water and hydrogen can be prevented from being diffused from the conductor 240a and the conductor 240b to the outside.

Next, the conductor 240a and the conductor 240b are formed in the openings to be in contact with sidewalls of the insulator 241 by a known method. In a method for forming the conductor 240a and the conductor 240b, for example, a conductive film to be the conductor 240a and the conductor 240b is deposited. The conductive film to be the conductor 240a and the conductor 240b desirably has a stacked-layer structure that includes a conductor having a function of inhibiting diffusion of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 1). Note that the insulator 281 is partly removed by the CMP treatment in some cases.

In addition, although not illustrated, a conductor functioning as a wiring may be formed in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure; for example, stacked layers of the above conductive material, and titanium or titanium nitride. The conductor may be formed to be embedded in an opening provided in an insulator.

In addition, although not illustrated, an insulator having resistivity higher than or equal to $1.0 \times 10^{13}$ Ω-cm and lower than or equal to $1.0 \times 10^{15}$ Ω-cm, preferably higher than or equal to $5.0 \times 10^{13}$ Ω-cm and lower than or equal to $5.0 \times 10^{14}$ Ωcm is preferably formed to cover the conductor. It is preferable that an insulator having resistivity in the above range be provided over the conductor, in which case the insulator can disperse electric charge accumulated in the transistor 200 or between wirings of the conductor or the like and can inhibit poor characteristics and electrostatic breakdown of the transistor and an electronic device including the transistor due to the electric charge, while maintaining the insulating property.

Through the above process, the semiconductor device including the transistor 200 can be manufactured. As illustrated in FIG. 3 to FIG. 12, with use of the method for manufacturing the semiconductor device described in this embodiment, the transistor 200 can be manufactured.

According to one embodiment of the present invention, it is possible to provide a semiconductor device with high on-state current. Alternatively, according to one embodiment of the present invention, it is possible to provide a semiconductor device with high frequency characteristics. Alternatively, according to one embodiment of the present invention, it is possible to provide a highly reliable semiconductor device. Alternatively, according to one embodiment of the present invention, it is possible to provide a semiconductor device that can be miniaturized or highly integrated. Alternatively, according to one embodiment of the present invention, it is possible to provide a semiconductor device with favorable electrical characteristics. Alternatively, according to one embodiment of the present invention, it is possible to provide a semiconductor device with low off-state current. Alternatively, according to one embodiment of the present invention, it is possible to provide a semiconductor device with reduced power consumption. Alternatively, according to one embodiment of the present invention, it is possible to provide a semiconductor device with high productivity.

<Modification Example of Semiconductor Device>

An example of a semiconductor device including the transistor 200 according to one embodiment of the present invention, which is different from the semiconductor device described in <Structure example of semiconductor device>above and an example of a method for manufacturing the semiconductor device will be described below with reference to FIG. 13.

FIG. 13(A) is a top view of the transistor. Furthermore, FIG. 13(B) is a cross-sectional view corresponding to a portion indicated by a dashed-dotted line A1-A2 in FIG. 13(A), and is also a cross-sectional view of the transistor 200 in the channel length direction. Furthermore, FIG. 13(C) is a cross-sectional view corresponding to a portion indicated by a dashed-dotted line A3-A4 in FIG. 13(A), and is also a cross-sectional view in the channel width direction of the transistor 200. In addition, FIG. 13(D) is a cross-sectional view corresponding to a portion indicated by the dashed-dotted line A5-A6 in (A), and is also a cross-sectional view in the channel width direction of the transistor 200. For clarity of the drawing, some components are not illustrated in the top view of (A) of each drawing.

Note that in the semiconductor device shown in FIG. 13, structures having the same functions as the structures in the semiconductor device described in <Structure example of semiconductor device> are denoted by the same reference numerals. Note that in this section, the materials described in detail in <Structure example of semiconductor device> can be used as the constituent materials for the transistor 200.

The transistor 200 illustrated in FIG. 13 is different from the transistor 200 illustrated in FIG. 1 in that the conductor 242a covers the side surfaces of the conductor 243a, the oxide 230b, and the oxide 230a and is in contact with the top surface of the insulator 224, and in that the conductor 242b covers the side surfaces of the conductor 243b, the oxide 230b, and the oxide 230a and is in contact with the top surface of the insulator 224. This structure increases the contact area between the conductor 242a or 242b and the oxide 230b, so that the on-state current can be increased.

In the case where the transistor 200 illustrated in FIS. 13 is manufactured, before the conductive film 242A is formed in the step illustrated in FIG. 3 A, the oxide film 230A, the oxide film 230B, and the conductor layer 243A may be processed into island shapes, so that the oxide 230a, the oxide 230b, the conductor 243a, and the conductor 243b are formed.

Alternatively, as illustrated in FIGS. 13(B), (C), and (D), the insulator 224 may be provided to overlap with the oxide 230a and the oxide 230b to have an island shape. With such a structure, the lower end portion of the conductor 260 can be positioned lower, and thus, the electric field of the conductor 260 functioning as the first gate electrode is easily applied to the side surface of the oxide 230. Thus, the on-state current of the transistor 200 can be increased and the frequency characteristics of the transistor 200 can be improved. In addition, the oxide 230c, the insulator 266, the conductor 242, and the insulator 254 are in contact with the top surface of the insulator 222 in a region not overlapping with the insulator 224. Accordingly, the insulator 224, the insulator 250, and the oxide 230 are surrounded by the insulator 222, the insulator 254, and the insulator 274 having a barrier property against oxygen and impurities such as hydrogen. This can inhibit entry of excess oxygen and impurities such as hydrogen from the outside of the transistor 200, resulting in favorable electrical characteristics and high reliability of the transistor 200.

The structure, method, and the like described above in this embodiment can be used in appropriate combination with structures, methods, and the like described in the other embodiments and the example.

Embodiment 2

In this embodiment, an apparatus that can be used to manufacture a semiconductor device of one embodiment of the present invention will be described with reference to FIG. 14.

In manufacture of the semiconductor device of one embodiment of the present invention, it is preferable to use what is called a multi-chamber apparatus including a plurality of treatment chambers enabling successive depositions of different kinds of films. In each treatment chamber, deposition treatment such as sputtering, CVD, or ALD can be performed. For example, in the case where one treatment chamber is a sputtering chamber, the sputtering chamber can be connected to a gas supply device, a gas refining device connected to the gas supply device, a vacuum pump, a target, or the like.

In each treatment chamber, the substrate may be subjected to cleaning treatment, plasma treatment, reverse sputtering treatment, etching treatment, ashing treatment, heat treatment, or the like. Different treatments are performed between treatment chambers as appropriate, whereby the insulator, the conductor, and the semiconductor film can be formed without exposure to the air.

A typical example of the semiconductor film used in one embodiment of the present invention includes an oxide semiconductor film. In particular, the oxide semiconductor film having a low impurity concentration and a low density of defect states (the amount of oxygen vacancies is small) enables a transistor with excellent electric characteristics to be manufactured. Here, the state in which the impurity concentration is low and the density of defect states is low is referred to as highly purified intrinsic or substantially highly purified intrinsic.

A highly purified intrinsic or substantially highly purified intrinsic oxide semiconductor film has few carrier generation sources, and thus the carrier density can be reduced. Thus, a transistor in which a channel formation region is formed in the oxide semiconductor film rarely has electrical characteristics in which the threshold voltage is negative (also referred to as normally on). In addition, a highly purified intrinsic or substantially highly purified intrinsic oxide semiconductor film has a low density of defect states and thus has a low density of trap states in some cases. Furthermore, the highly purified intrinsic or substantially highly purified intrinsic oxide semiconductor film has an extremely low off-state current; even when an element has a channel width of $1\times10^6$ µm and a channel length L of 10 µm, the off-state current can be less than or equal to the measurement limit of a semiconductor parameter analyzer, i.e., less than or equal to $1\times10^{-13}$ A, at a voltage between a source electrode and a drain electrode (drain voltage) ranging from 1 V to 10 V.

Note that impurities in the oxide semiconductor film are typically water, hydrogen, and the like. In this specification and the like, reducing or removing water and hydrogen from the oxide semiconductor film may be referred to as dehydration or dehydrogenation. Moreover, adding oxygen to the oxide semiconductor film may be referred to as oxygen addition and a state in which oxygen in excess of the stoichiometric composition is contained due to the oxygen addition may be referred to as an oxygen-excess state.

It is preferable that an oxide semiconductor, an insulator or a conductor below the oxide semiconductor, and an insulator or a conductor over the oxide semiconductor are deposited successively with different kinds of materials without being exposed to the air, whereby a substantially highly purified intrinsic oxide semiconductor film whose impurity (hydrogen and water, in particular) concentration is reduced can be formed.

First, a structure example of an apparatus that can be used to manufacture a semiconductor device of one embodiment of the present invention will be described with reference to FIG. 14. With use of the apparatus shown in FIG. 14, it is possible to successively deposit a semiconductor film, an insulator or a conductor positioned below the semiconductor film, and an insulator or a conductor positioned over the semiconductor film. Thus, impurities (particularly hydrogen and water) can be prevented from entering the semiconductor film.

Figure 14:
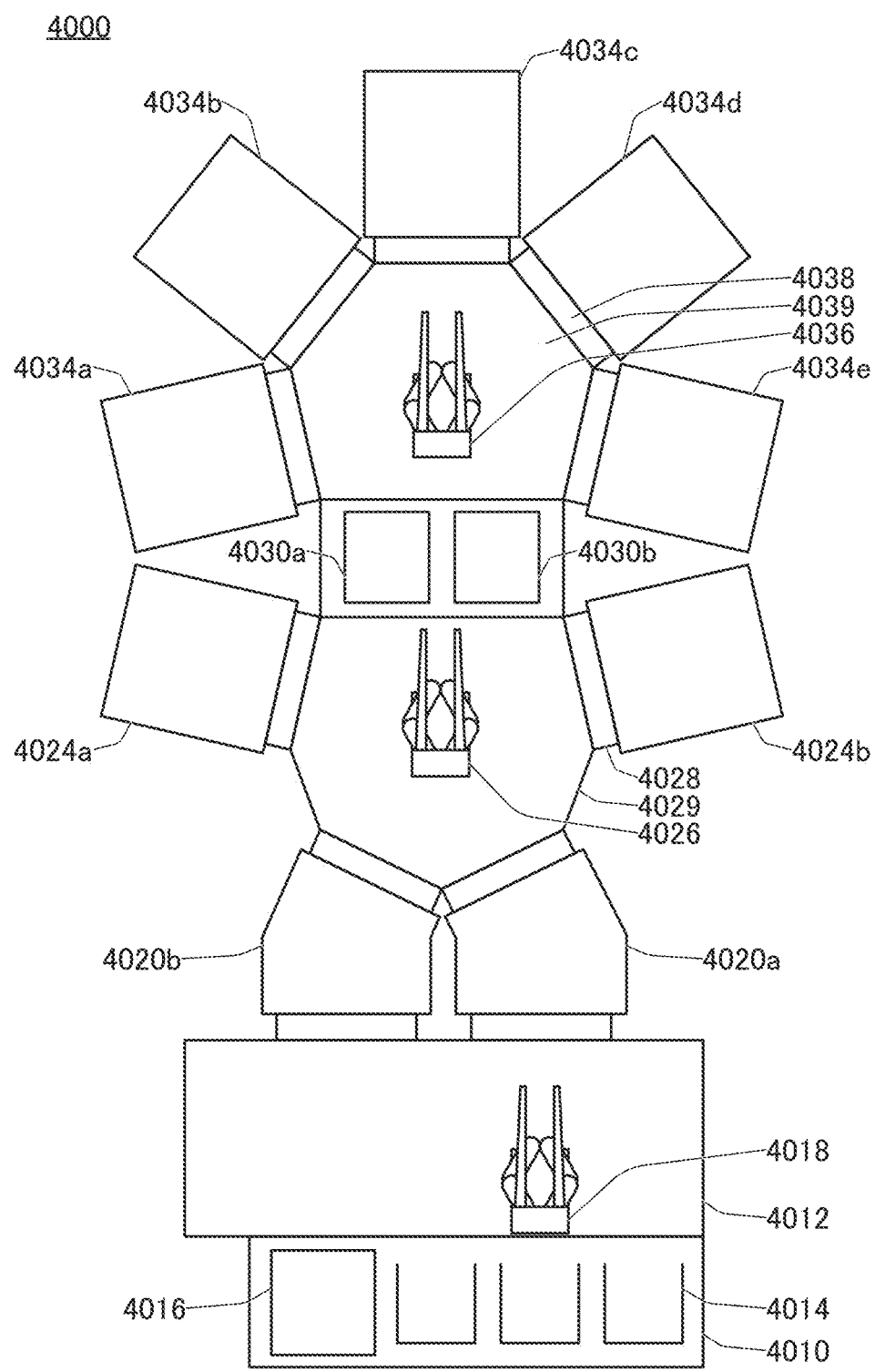
[FIG. 14] A top view illustrating an apparatus for manufacturing a semiconductor device according to one embodiment of the present invention.

FIG. 14 schematically shows a top view of a single wafer multi-chamber apparatus 4000.

The apparatus 4000 includes an atmosphere-side substrate supply chamber 4010, an atmosphere-side substrate supply chamber 4012 that transfers a substrate from the atmosphere-side substrate supply chamber 4010, a load chamber 4020a that carries the substrate and switches a pressure in the chamber from an atmospheric pressure to a reduced pressure or from a reduced pressure to an atmospheric pressure, an unload chamber 4020b that carries a substrate and switches the pressure in the chamber from a reduced pressure to an atmospheric pressure or from an atmospheric pressure to a reduced pressure, a transfer chamber 4029 and a transfer chamber 4039 that carries a substrate in vacuum, a delivering chamber 4030a and a delivering chamber 4030b that connect the transfer chamber 4029 and the transfer chamber 4039, and a treatment chamber 4024a, a treatment chamber 4024b, a treatment chamber 4034a, a treatment chamber 4034b, a treatment chamber 4034c, a treatment chamber 4034d, and a treatment chamber 4034e that perform deposition or heating.

Note that the plurality of treatment chambers can perform treatments similar to each other or different treatments in parallel. In the case where the similar treatment is performed in the plurality of treatment chambers, a plurality of substrates can be processed concurrently; thus, the process time can be shortened. When different treatments are performed in the plurality of treatment chambers, a stacked-layer structure including different kinds of films can be easily formed over one substrate. The number of parallel treatments that can be conducted at maximum is equated to the number of treatment chambers. For example, the apparatus 4000 illustrated in FIG. 14 is an apparatus including seven treatment chambers. Thus, seven substrates can be processed concurrently at maximum.

On the other hand, in the case where different kinds of films are stacked over one substrate, the number of stacked layers which can be formed without being exposed to the air is not necessarily equal to the number of treatment chambers. For example, in the case where a stacked-layer structure to be required includes a plurality of layers formed using the same material, the layers can be provided in one treatment chamber; thus, a stacked-layer structure can have stacked layers the number of which is larger than the number of provided treatment chambers.

The atmosphere-side substrate supply chamber 4010 includes a cassette port 4014 that holds a substrate and an alignment port 4016 that aligns a substrate. Note that a plurality of the cassette ports 4014 may be provided (for example, in FIG. 14, three cassette ports are provided).

The atmosphere-side substrate transfer chamber 4012 is connected to the load chamber 4020a and the unload chamber 4020b. The transfer chamber 4029 is connected to the load chamber 4020a, the unload chamber 4020b, the delivering chamber 4030a, the delivering chamber 4030b, the treatment chamber 4024a, and the treatment chamber 4024b. The delivering chamber 4030a and the delivering chamber 4030b are connected to the transfer chamber 4029 and the transfer chamber 4039. The transfer chamber 4039 is connected to the delivering chamber 4030a, the delivering chamber 4030b, the treatment chamber 4034a, the treatment chamber 4034b, the treatment chamber 4034c, the treatment chamber 4034d, and the treatment chamber 4034e.

Note that a gate valve 4028 or a gate valve 4038 is provided for a connecting portion of each chamber so that each of the chambers except for the atmosphere-side substrate supply chamber 4010 and the atmosphere-side substrate transfer chamber 4012 can be independently kept under vacuum. The atmosphere-side substrate transfer chamber 4012 includes a transfer robot 4018. The transfer chamber 4029 includes a transfer robot 4026, and the transfer chamber 4039 includes a transfer robot 4036. Each of the transfer robots 4018, 4026, and 4036 includes a plurality of movable portions and an arm for holding a substrate and can transfer a substrate to each chamber.

Note that the number of transfer chambers, treatment chambers, load chambers, unload chambers, and delivering chambers is not limited to the above, and the numbers thereof can be set as appropriate depending on the space for placement or the process conditions.

In particular, in the case where a plurality of transfer chambers are provided, two or more delivering chambers are preferably provided between one transfer chamber and another transfer chamber. For example, in the case where the transfer chamber 4029 and the transfer chamber 4039 are provided as illustrated in FIG. 14, the delivering chamber 4030a and the delivering chamber 4030b are preferably arranged in parallel between the transfer chamber 4029 and the transfer chamber 4039.

When the delivering chamber 4030a and the delivering chamber 4030b are arranged in parallel to each other, for example, a step of carrying a substrate to the delivering chamber 4030a by the transfer robot 4026 and a step of carrying a substrate to the delivering chamber 4030b by the transfer robot 4036 can be concurrently performed. Furthermore, a step of carrying out a substrate from the delivering chamber 4030b by the transfer robot 4026 and a step of carrying out a substrate from the delivering chamber 4030a by the transfer robot 4036 can be concurrently performed. That is, when a plurality of transfer robots are driven concurrently, the production efficiency is improved.

Although FIG. 14 illustrates an example where one transfer chamber is provided with one transfer robot and connected to a plurality of treatment chambers, one embodiment of the present invention is not limited to the structure. One transfer chamber may be provided with a plurality of transfer robots.

In addition, one or both of the transfer chamber 4029 and the transfer chamber 4039 are connected to a vacuum pump and a cryopump through valves. Accordingly, the transfer chamber 4029 and the transfer chamber 4039 can be evacuated with use of the vacuum pump from the atmospheric pressure to low or medium vacuum (approximately several hundred pascals to 0.1 Pa) and then, by switching the valve, be evacuated with use of the cryopump from the medium vacuum to high or ultra-high vacuum (approximately 0.1 Pa to $1 \times 10^{-7}$ Pa).

Alternatively, two or more cryopumps may be connected in parallel to one transfer chamber, for example. With a plurality of cryopumps, even when one of the cryopumps is in regeneration, exhaust can be performed using the other cryopumps. Note that the above regeneration refers to treatment for discharging molecules (or atoms) entrapped in the cryopump. When molecules (or atoms) are entrapped too much in a cryopump, the exhaust capability is lowered; therefore, it is preferable to perform regeneration regularly.

The treatment chamber 4024a, the treatment chamber 4024b, the treatment chamber 4034a, the treatment chamber 4034b, the treatment chamber 4034c, the treatment chamber 4034d, and the treatment chamber 4034e can perform different treatments in parallel. In other words, the treatment chambers can perform, on the substrate provided, different treatments out of a deposition treatment by a sputtering method, a CVD method, an MBE method, a PLD method, an ALD method, or the like, a heat treatment, and a plasma treatment. In the treatment chamber, a deposition treatment may be performed after a heat treatment or a plasma treatment.

In the apparatus 4000, it is possible to transfer a substrate without exposure of the substrate to the air between treatments since a plurality of treatment chambers are provided; therefore, adsorption of impurities on the substrate can be inhibited. The treatment chambers can perform a deposition treatment for different kinds of films, a heat treatment, or a plasma treatment, which makes it possible to freely determine the order of deposition, a heat treatment, and the like.

Note that each treatment chamber may be connected to the vacuum pump through a valve. As the vacuum pump, a dry pump, a mechanical booster pump, and the like can be used, for example.

Furthermore, each treatment chamber may be connected to a power source capable of generating plasma. As the power source, a DC power source, an AC power source, a high-frequency (RF, microwave, or the like) power source, or the like may be provided. A pulsed generator may be connected to the DC power source.

Moreover, the treatment chamber may be connected to a gas refining device through a gas supply device. Note that the number of provided gas supply devices and the number of provided gas refining devices may be equated to the number of kinds of gases.

For example, in the case where the deposition treatment is performed by sputtering in the treatment chamber, the treatment chamber may include a backing plate provided with a target, a cathode connected to the backing plate therebetween, a deposition shield, a substrate stage, or the like. The substrate stage may be connected to an anode. For example, the substrate stage may include a substrate holding mechanism which holds the substrate, a rear heater which heats the substrate from the back surface, or the like.

Note that the substrate stage may be substantially parallel to the floor. In this structure, it is preferable that a target be provided below the substrate stage, and the substrate be placed between the target and the substrate stage in what is called a face-down manner. The substrate stage may be provided with a jig for fixing a substrate so as not to fall or a mechanism for fixing a substrate. When such a jig for fixing a substrate or a mechanism is provided, the substrate can be heated or cooled efficiently, which is preferable. Meanwhile, a manner in which a target is provided above the substrate stage, what is called a face-up manner, may be employed. Also in this case, a jig for fixing a substrate or a mechanism for fixing a substrate may be provided so as to prevent misalignment of the substrate over the substrate stage or to heat or cool the substrate efficiently.

Furthermore, when a deposition shield is provided for the treatment chamber, particles sputtered from the target can be inhibited from being deposited on a region where deposition is not needed. Moreover, the deposition shield is preferably processed to prevent accumulated sputtered particles from being separated. For example, blasting treatment which increases surface roughness or projections and depressions may be provided on the surfaces of the deposition shield.

The backing plate has a function of holding the target. The cathode has a function of applying negative voltage to the target.

Note that the target can be formed using a conductor, an insulator, or a semiconductor. For example, when the target is an oxide semiconductor such as a metal oxide, an oxide semiconductor film can be deposited in the treatment chamber. Note that when the target is a metal oxide, an oxynitride semiconductor film can be formed by using a nitrogen gas as the deposition gas.

Each treatment chamber may be connected to a gas supply device through a gas heating mechanism. The gas heating mechanism is connected to a gas refining device through the gas supply apparatus. As the gas introduced to the treatment chamber, a gas whose dew point is −80° C. or lower, preferably −100° C. or lower, further preferably −120° C. or lower can be used; for example, an oxygen gas, a nitrogen gas, and a rare gas (e.g., an argon gas) can be used. With the gas heating mechanism, a gas which is introduced to the treatment chamber can be heated to a temperature higher than or equal to 40° C. and lower than or equal to 400° C. Note that the number of provided gas heating mechanisms, the number of provided gas supply devices, and the number of provided gas refining devices may be equated to the number of kinds of gases.

Each treatment chamber may be connected to a turbo molecular pump and a vacuum pump through a valve. Each treatment chamber may be provided with a cryotrap.

The cryotrap is a mechanism which can adsorb a molecule (or an atom) having a relatively high melting point, such as water. The turbo molecular pump has excellent productivity because it stably exhausts a large-sized molecule (or atom) and needs low frequency of maintenance, whereas it has a low capability in removing hydrogen and water. Thus, a cryotrap can be used to improve the evacuation capability of water or the like. The temperature of a refrigerator of the cryotrap is set lower than or equal to 100 K, preferably lower than or equal to 80 K. Furthermore, in the case where the cryotrap has a plurality of refrigerators, it is preferable to set the refrigerators at different temperatures because efficient exhaust is possible. For example, the temperature of a first-stage refrigerator is set lower than or equal to 100 K and the temperature of a second-stage refrigerator is set lower than or equal to 20 K.

Note that the exhaust method for the treatment chamber is not limited thereto, and a system similar to that in the exhaust method described for the transfer chamber connected thereto (the exhaust method using the cryopump and the vacuum pump) may be employed. Note that the exhaust method for the transfer chamber may have a system similar to that of the treatment chamber (the exhaust method using the turbo molecular pump and the vacuum pump).

In particular, the vacuum pump and the cryotrap may be combined to be combined as the exhaust method for the treatment chamber where an oxide semiconductor film is deposited. The exhaust method for the treatment chamber where an oxide semiconductor film is deposited preferably has at least a function of adsorbing water molecules.

In the treatment chamber where the oxide semiconductor film is deposited, the partial pressure of hydrogen molecules is preferably lower than or equal to $1 \times 10^{-2}$ Pa, and the partial pressure of water molecules is preferably lower than or equal to $1 \times 10^{-4}$ Pa. In the treatment chamber where the oxide semiconductor film is deposited in a standby state, the pressure is lower than or equal to $8.0 \times 10^{-5}$ Pa, preferably lower than or equal to $5.0 \times 10^{-5}$ Pa, further preferably lower than or equal to $1.0 \times 10^{-5}$ Pa. The above values of the partial pressure of hydrogen molecules and the partial pressure of water molecules are the values of both of the standby state and in the deposition state (a plasma discharge state) of the treatment chamber in which sputtering is performed.

Note that a total pressure and a partial pressure in the treatment chamber can be measured using a mass analyzer. For example, Qulee CGM-051, a quadrupole mass analyzer (also referred to as Q-mass) produced by ULVAC, Inc. can be used.

The partial pressure of hydrogen molecules, the partial pressure of water molecules, and the pressure in a standby state in the treatment chamber are set to the values in above ranges, the impurity concentration an oxide semiconductor film to be formed can be reduced.

In particular, each treatment chamber is used for deposition treatment by sputtering, so that part of the structure of the transistor 200 described in the above embodiment can be manufactured successively without being exposed to the air.

For example, in the case where the transistor 200 is manufactured, at least the insulator 222, the insulator 224, the oxide film 230A, the oxide film 230B, and a conductive film to be the conductor layer 243A can be successively formed using the apparatus 4000. That is, the insulator 222, the insulator 224, the oxide film 230A, the oxide film 230B, and a conductive film to be the conductor layer 243A can be successively formed without exposure to the air.

Furthermore, for example, the oxide film 230C the insulating film 250A, the conductive film 260Aa, and the conductive film 260Ab can be successively formed.

With the above structure, a stacked layer film in which impurities (typically, water, hydrogen, or the like) are thoroughly removed in its film or an interface between the stacked films can be formed.

Alternatively, in the case where heat treatment is performed in a treatment chamber, for example, the treatment chamber may have a plurality of heating stages that can hold a substrate. Note that the heating stage may have several stages. By increasing the number of the heating stages, a plurality of substrates can be subjected to heat treatment at the same time, which leads to an increase in productivity.

Furthermore, a heating mechanism which can be used for the treatment chamber may be a heating mechanism which performs heating with a resistance heater or the like, for example. Alternatively, a heating mechanism that uses heat conduction or heat radiation from a medium such as a heated gas for heating may be used. For example, RTA (Rapid Thermal Anneal) apparatus such as a GRTA (Gas Rapid Thermal Anneal) apparatus or an LRTA (Lamp Rapid Thermal Anneal) apparatus can be used. In the LRTA, an object is heated by radiation of light (electromagnetic wave) emitted from a lamp such as a halogen lamp, a metal halide lamp, a xenon arc lamp, a carbon arc lamp, a high-pressure sodium lamp, or a high-pressure mercury lamp. In GRTA, heat treatment is performed using a high-temperature gas. An inert gas is used as the gas.

The load chamber 4020a may include a substrate delivery stage, a rear heater for heating a substrate from the back surface, or the like. When a pressure in the load chamber 4020a is increased from a reduced pressure state to the air and the pressure in the load chamber 4020a becomes atmospheric pressure, the substrate delivery stage receives a substrate from the transfer robot 4018 provided in the atmosphere-side substrate transfer chamber 4012. After that, the load chamber 4020a is evacuated into vacuum to make a reduced pressure state, and then the transfer robot 4026 provided in the transfer chamber 4029 receives the substrate from the substrate delivery stage.

Furthermore, the load chamber 4020a is connected to the vacuum pump and the cryopump through valve. Note that the unload chamber 4020b may have a structure similar to that of the load chamber 4020a or a structure in which a substrate heating mechanism is not provided.

Since the atmosphere-side substrate transfer chamber 4012 includes the transfer robot 4018, delivery and receipt of a substrate between the cassette port 4014 and the load chamber 4020a can be performed using the transfer robot 4018. Furthermore, a mechanism for inhibiting entry of dust or a particle, generated from an HEPA filter (High Efficiency Particulate Air Filter), may be provided above the atmosphere-side substrate transfer chamber 4012 and the atmosphere-side substrate supply chamber 4010. The cassette port 4014 can hold a plurality of substrates.

Entry of impurities into a semiconductor film can be suitably inhibited when an insulating film, a semiconductor film, and a conductive film are successively deposited without exposure to the air with use of the apparatus 4000 described above.

As described above, a stacked-layer structure including a semiconductor film can be formed by successive film deposition with use of the apparatus of one embodiment of the present invention. Therefore, impurities such as hydrogen, water, or the like that might enter a semiconductor film can be inhibited and a semiconductor film with a low density of defect states can be formed.

At least part of this embodiment can be implemented in combination with the other embodiments and the example described in this specification as appropriate.

Embodiment 3

In this embodiment, one embodiment of a semiconductor device is described with reference to FIG. 15.
[Memory Device 1]

Figure 15:
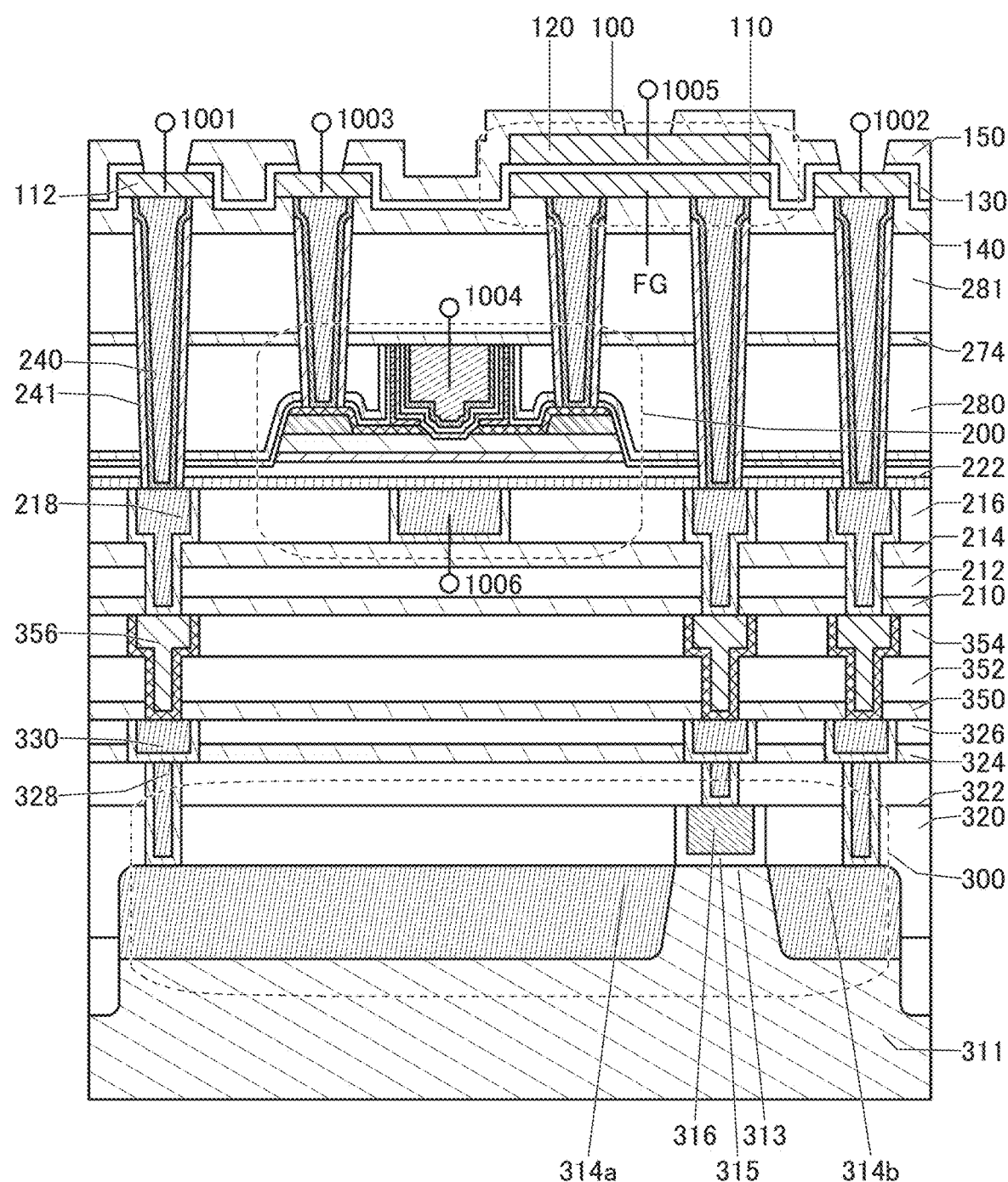
[FIG. 15] A cross-sectional view illustrating a structure of a memory device according to one embodiment of the present invention.

FIG. 15 illustrates an example of a semiconductor device (a memory device) using a capacitor that is one embodiment of the present invention. In a semiconductor device of one embodiment of the present invention, the transistor 200 is provided above a transistor 300, and a capacitor 100 is provided above the transistor 300 and the transistor 200. Note that the transistor 200 described in the above embodiment or the like can be used as the transistor 200.

The transistor 200 is a transistor in which a channel is formed in a semiconductor layer including an oxide semiconductor. The off-state current of the transistor 200 is low; thus, by using the transistor 200 in a memory device, stored data can be retained for a long time. In other words, such a memory device does not require refresh operation or has extremely low frequency of the refresh operation, which leads to a sufficient reduction in power consumption of the memory device.

In the semiconductor device illustrated in FIG. 15, a wiring 1001 is electrically connected to a source of the transistor 300, and a wiring 1002 is electrically connected to a drain of the transistor 300. In addition, a wiring 1003 is electrically connected to one of a source and a drain of the transistor 200, a wiring 1004 is electrically connected to a first gate of the transistor 200, and a wiring 1006 is electrically connected to a second gate of the transistor 200. Furthermore, a gate of the transistor 300 and the other of the source and the drain of the transistor 200 are electrically connected to one electrode of the capacitor 100, and a wiring 1005 is electrically connected to the other electrode of the capacitor 100.

Furthermore, by arranging the memory devices illustrated in FIG. 15 in a matrix, a memory cell array can be formed.
<Transistor 300>

The transistor 300 is provided on a substrate 311 and includes a conductor 316 functioning as a gate electrode, an insulator 315 functioning as a gate insulator, a semiconductor region 313 formed of part of the substrate 311, and a low-resistance region 314a and a low-resistance region 314b functioning as a source region and a drain region. The transistor 300 is either a p-channel transistor or an n-channel transistor.

Here, in the transistor 300 illustrated in FIG. 15, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting a work function may be used for the conductor 316. Such a transistor 300 is also referred to as a FIN-type transistor because it utilizes a convex portion of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 15 is an example and the structure is not limited thereto; any transistor appropriate for a circuit configuration or a driving method is used.
<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over a conductor 246 can be formed at the same time. Note that the conductor 112 has a function of a plug or a wiring that is electrically connected to the capacitor 100, the transistor 200, or the transistor 300.

Although the conductor 112 and the conductor 110 each having a single-layer structure are illustrated in FIG. 15, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

In addition, the insulator 130 can be provided to have stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, it is preferable to use a stacked-layer structure of a material with high dielectric strength such as silicon oxynitride and a high-permittivity (high-k) material for the insulator 130. In the capacitor 100 having such a structure, sufficient capacitance can be secured because a high-permittivity (high-k) insulator is included, and dielectric strength can be improved because an insulator with high dielectric strength is included, so that the electrostatic breakdown of the capacitor 100 can be inhibited.

Note that examples of the insulator of the high-permittivity (high-k) material (material with high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Meanwhile, examples of the material with high dielectric strength (material with low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring layer>

Wiring layers provided with an interlayer film, a wiring, a plug, and the like may be provided between the components. In addition, a plurality of wiring layers can be provided in accordance with design. Here, a plurality of conductors having functions of plugs or wirings are collectively denoted by the same reference numeral in some cases. Furthermore, in this specification and the like, a wiring and a plug electrically connected to the wiring may be a single component. That is, there are the case where part of a conductor functions as a wiring and the case where part of a conductor functions as a plug.

For example, an insulator 320, an insulator 322, an insulator 324, and an insulator 326 are sequentially stacked over the transistor 300 as interlayer films. In addition, a conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulators functioning as interlayer films may also function as planarization films that cover uneven shapes therebelow. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 15, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor included in the transistor 200 (the conductor 205), and the like are embedded in the insulator 210, an insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having low relative permittivity is used for the insulator functioning as an interlayer film, parasitic capacitance generated between wirings can be reduced. Thus, a material is preferably selected depending on the function of an insulator.

For example, for the insulator 150, the insulator 212, the insulator 352, the insulator 354, or the like, an insulator having a low dielectric constant is preferably used. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low relative permittivity. Examples of the resin include polyester, polyolefin, polyamide (nylon, aramid, or the like), polyimide, polycarbonate, and acrylic.

In addition, it is preferable that one or both of the insulator 130 and the insulator 150 provided over the conductor 112 or the conductor 120 be an insulator or insulators each having resistivity higher than or equal to $1.0 \times 10^{12}$ Ω-cm and lower than or equal to $1.0 \times 10^{15}$ Ω-cm, preferably higher than or equal to $5.0 \times 10^{12}$ Ω-cm and lower than or equal to $1.0 \times 10^{14}$ Ω-cm, further preferably higher than or equal to $1.0 \times 10^{13}$ Ω-cm and lower than or equal to $5.0 \times 10^{13}$ Ω-cm. One or both of the insulator 130 and the insulator 150 are preferably an insulator or insulators each having resistivity in the above range because the insulator or the insulators can disperse electric charge accumulated between the transistor 200, the transistor 300, the capacitor 100, and wirings such as the conductor 112 and the conductor 120 and can inhibit poor characteristics and electrostatic breakdown of the transistor and a memory device including the transistor due to the electric charge, while maintaining the insulating property. For such an insulator, silicon nitride or silicon nitride oxide can be used.

In addition, as the insulator having resistivity in the above range, the insulator 140 may be provided below the conductor 112. In that case, the insulator 140 is formed over the insulator 281; an opening portion is formed in the insulator 140, the insulator 281, the insulator 274, the insulator 280, the insulator 244, the insulator 254, and the like; and the insulator 241 is formed in the opening portion, or the conductor 240 that is electrically connected to the transistor 200, the conductor 218, and the like is formed. For the insulator 140, a material similar to that of the insulator 130 or the insulator 150 can be used.

Furthermore, when a transistor using an oxide semiconductor is surrounded by an insulator having a function of inhibiting the passage of oxygen and impurities such as hydrogen, the electrical characteristics of the transistor can be stable. Thus, an insulator having a function of inhibiting the passage of oxygen and impurities such as hydrogen is used for the insulator 210, the insulator 350, or the like.

For the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, or the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

《Wiring or Plug in Layer Provided with Oxide Semiconductor》

Note that in the case where an oxide semiconductor is used for the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, an insulator 276 is preferably provided between an insulator 224 and the conductor 246 in FIG. 15. In particular, the conductor 246 is preferably provided in contact with the insulator 224 containing an excess oxygen region, and the insulator 222, the insulator 254, and the insulator 244 which sandwich the insulator 224. Since the insulator 276 is provided in contact with the insulator 222 and the insulator 281, the insulator 224 and the transistor 200 can be sealed by the insulators having a barrier property. It is also preferable that the insulator 276 be in contact with part of the insulator 280. When the insulator 276 extends to the insulator 280, the diffusion of oxygen and impurities can be further inhibited.

That is, provision of the insulator 276 can inhibit the absorption of excess oxygen contained in the insulator 224 by the conductor 246. In addition, by including the insulator 276, the diffusion of hydrogen, which is an impurity, into the transistor 200 through the conductor 246 can be inhibited.

The insulator 276 is preferably formed using an insulating material having a function of inhibiting diffusion of an impurity such as water or hydrogen and oxygen. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The above is the description of the structure example. With use of the structure, changes in electrical characteristics can be inhibited and reliability can be improved in a semiconductor device using a transistor including an oxide semiconductor. Alternatively, it is possible to provide a transistor including an oxide semiconductor with high on-state current. Alternatively, it is possible to provide a transistor including an oxide semiconductor with low off-state current. Alternatively, it is possible to provide a semiconductor device with reduced power consumption.

The structure described in this embodiment can be implemented in appropriate combination with the structures described in the other embodiments, the example, and the like.

Embodiment 4

In this embodiment, a memory device according to one embodiment of the present invention to which a transistor using an oxide as a semiconductor (hereinafter such a transistor is referred to as an OS transistor in some cases) and a capacitor are applied (hereinafter such a memory device is referred to as an OS memory device in some cases) will be described with reference to FIG. 16 and FIG. 17. The OS memory device is a memory device including at least a capacitor and an OS transistor that controls charging and discharging of the capacitor. Since the off-state current of the OS transistor is extremely low, the OS memory device has excellent retention characteristics and can function as a nonvolatile memory.

<Structure Example of Memory Device>

Figure 16A:
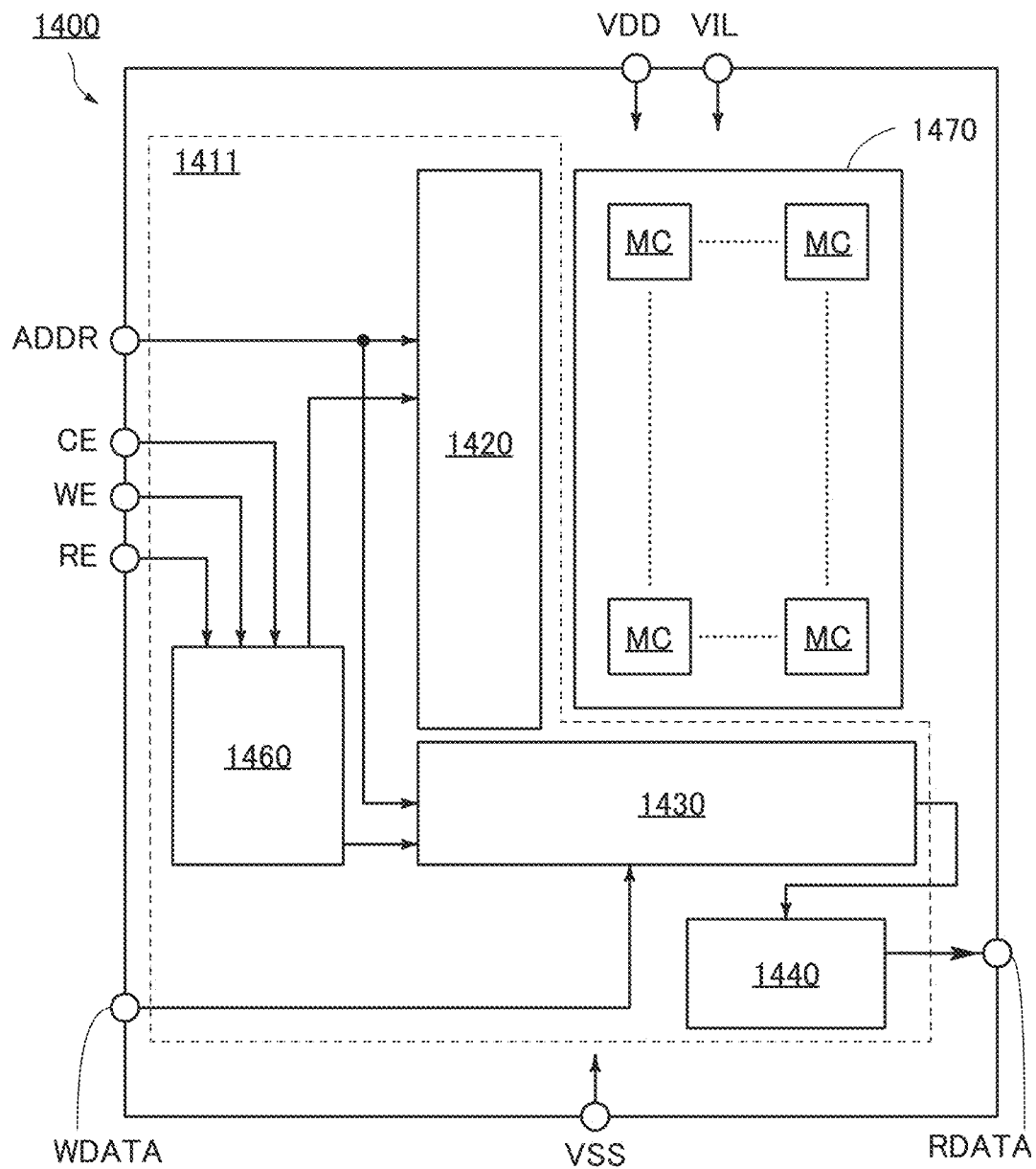
[FIGS. 16A and 16B] Block diagrams illustrating a configuration example of a memory device according to one embodiment of the present invention.

FIG. 16(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are wirings connected to memory cells included in the memory cell array 1470, which will be described in detail later. An amplified data signal is output to the outside of the memory device 1400 as a digital data signal RDATA through the output circuit 1440. Furthermore, the row circuit 1420 includes, for example, a row decoder, a word line driver circuit, and the like, and can select a row to be accessed.

As power supply voltages, a low power supply voltage (VSS), a high power supply voltage (VDD) for the peripheral circuit 1411, and a high power supply voltage (VIL) for the memory cell array 1470 are supplied to the memory device 1400 from the outside. In addition, control signals (CE, WE, and RE), an address signal ADDR, and a data signal WDATA are input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE denotes a chip enable signal, WE denotes a write enable signal, and RE denotes a read enable signal. Signals processed by the control logic circuit 1460 are not limited thereto, and other control signals are input as necessary.

The memory cell array 1470 includes a plurality of memory cells MC and a plurality of wirings arranged in a matrix. Note that the number of wirings that connect the memory cell array 1470 and the row circuit 1420 depends on the structure of the memory cell MC, the number of memory cells MC included in one column, and the like. Furthermore, the number of wirings that connect the memory cell array 1470 and the column circuit 1430 depends on the structure of the memory cell MC, the number of memory cells MC included in one row, and the like.

Figure 16B:
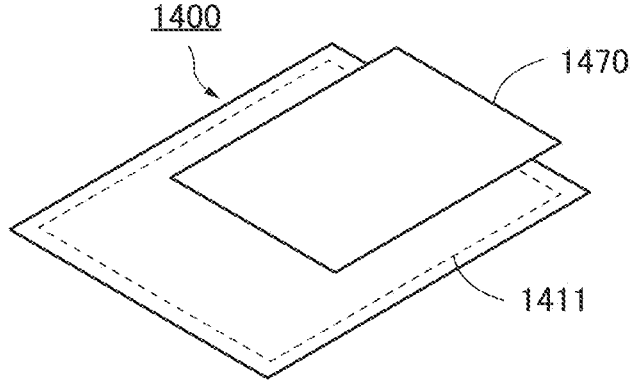

Note that FIG. 16(A) illustrates an example in which the peripheral circuit 1411 and the memory cell array 1470 are formed on the same plane; however, this embodiment is not limited thereto. For example, as illustrated in FIG. 16(B), the memory cell array 1470 may be provided over part of the peripheral circuit 1411 to overlap with the peripheral circuit 1411. For example, a structure may be employed in which the sense amplifier is provided below the memory cell array 1470 to overlap with the memory cell array 1470.

FIG. 17 illustrates structure examples of a memory cell applicable to the memory cell MC.

[Dosram]

Figure 17A:
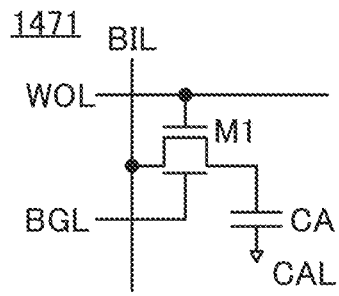
[FIGS. 17A to 17H] Circuit diagrams each illustrating a structure example of a memory device according to one embodiment of the present invention.
Figure 17B:
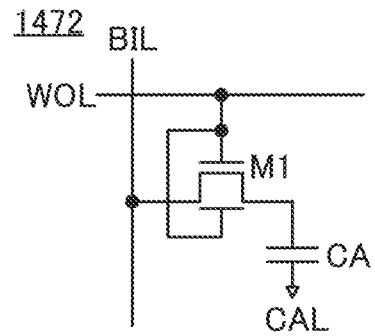
Figure 17C:
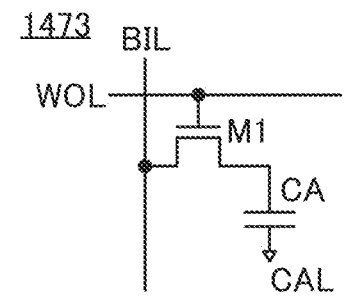
Figure 17D:
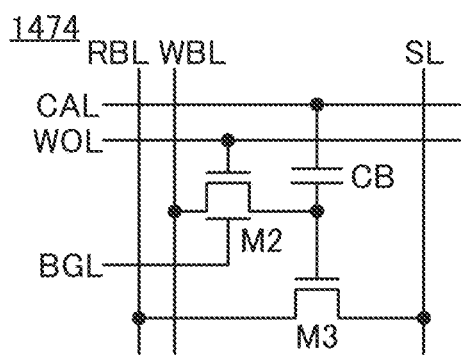
Figure 17E:
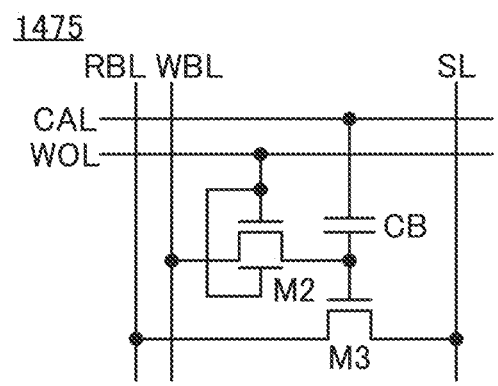
Figure 17F:
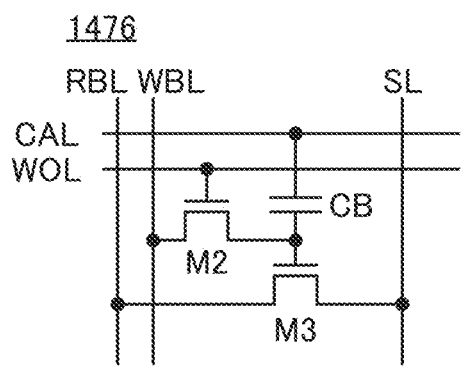
Figure 17G:
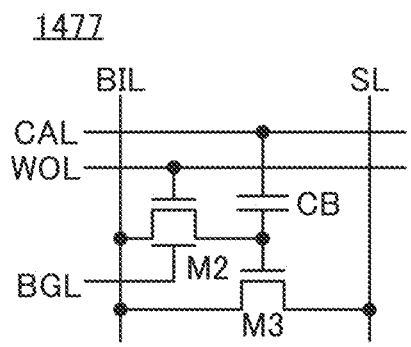

FIGS. 17(A) to 17(C) each illustrate a circuit structure example of a DRAM memory cell. In this specification and the like, a DRAM using a memory cell including one OS transistor and one capacitor is sometimes referred to as a DOSRAM (Dynamic Oxide Semiconductor Random Access Memory). A memory cell 1471 illustrated in FIG. 17(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In data writing and reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

In addition, the memory cell MC is not limited to the memory cell 1471, and the circuit structure can be changed. For example, like a memory cell 1472 illustrated in FIG. 17(B), a structure may be employed in which the back gate of the transistor M1 is connected not to the wiring BGL but to the wiring WOL in the memory cell MC. Alternatively, for example, like a memory cell 1473 illustrated in FIG. 17(C), the memory cell MC may be a memory cell including a single-gate transistor, that is, the transistor M1 that does not include a back gate.

In the case where the semiconductor device described in the above embodiment is used in the memory cell 1471 or the like, the transistor 200 can be used as the transistor M1, and the capacitor 100 can be used as the capacitor CA. The use of an OS transistor as the transistor M1 enables the leakage current of the transistor M1 to be extremely low. That is, written data can be retained for a long time by the transistor M1; thus, the frequency of refresh of the memory cell can be reduced. Alternatively, the refresh operation of the memory cell can be omitted. In addition, the extremely low leakage current allows multi-level data or analog data to be retained in the memory cell 1471, the memory cell 1472, or the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

[Nosram]

FIGS. 17(D) to 17(H) each illustrate a circuit structure example of a gain-cell memory cell including two transistors and one capacitor. A memory cell 1474 illustrated in FIG. 17(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A first terminal of the transistor M3 is connected to the wiring RBL, a second terminal of the transistor M3 is connected to the wiring SL, and a gate of the transistor M3 is connected to the first terminal of the capacitor CB.

The wiring WBL functions as a write bit line. The wiring RBL functions as a read bit line. The wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

In addition, the memory cell MC is not limited to the memory cell 1474, and the circuit structure can be changed as appropriate. For example, like a memory cell 1475 illustrated in FIG. 17(E), a structure may be employed in which the back gate of the transistor M2 is connected not to the wiring BGL but to the wiring WOL in the memory cell MC. Alternatively, for example, like a memory cell 1476 illustrated in FIG. 17(F), the memory cell MC may be a memory cell including a single-gate transistor, that is, the transistor M2 that does not include a back gate. Alternatively, for example, like a memory cell 1477 illustrated in FIG. 17(G), the memory cell MC may have a structure where the wiring WBL and the wiring RBL are combined into one wiring BIL.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time by the transistor M2; thus, the frequency of refresh of the memory cell can be reduced. Alternatively, the refresh operation of the memory cell can be omitted. In addition, the extremely low leakage current allows multi-level data or analog data to be retained in the memory cell 1474. The same applies to the memory cells 1475 to 1477.

Note that the transistor M3 may be a transistor containing silicon in a channel formation region (hereinafter such a transistor is referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistors M2 and M3, the circuit of the memory cell array 1470 can be formed using only n-channel transistors.

Figure 17H:
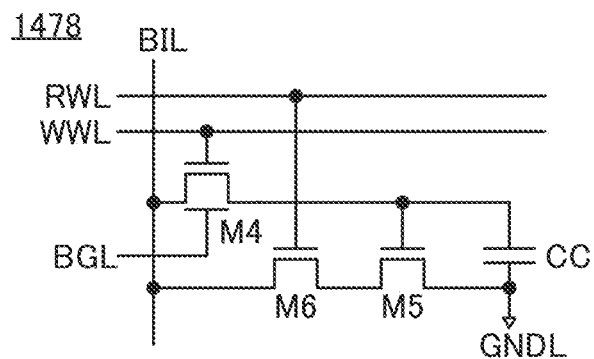

In addition, FIG. 17(H) illustrates an example of a gain-cell memory cell including three transistors and one capacitor. A memory cell 1478 illustrated in FIG. 17(H) includes transistors M4 to M6 and a capacitor CC. The capacitor CC is provided as appropriate. The memory cell 1478 is electrically connected to wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in the above embodiment is used in the memory cell 1478, the transistor 200 can be used as the transistor M4, the transistors 300 can be used as the transistors M5 and M6, and the capacitor 100 can be used as the capacitor CC. The use of an OS transistor as the transistor M4 enables the leakage current of the transistor M4 to be extremely low.

Note that the structures of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

The structure described in this embodiment can be used in appropriate combination with the structures described in the other embodiments, the example, and the like.

Embodiment 5

In this embodiment, an example of a chip 1200 on which the semiconductor device of the present invention is mounted will be described with reference to FIG. 18. A plurality of circuits (systems) are mounted on the chip 1200. A technique for integrating a plurality of circuits (systems) into one chip is referred to as system on chip (SoC) in some cases.

Figure 18A:
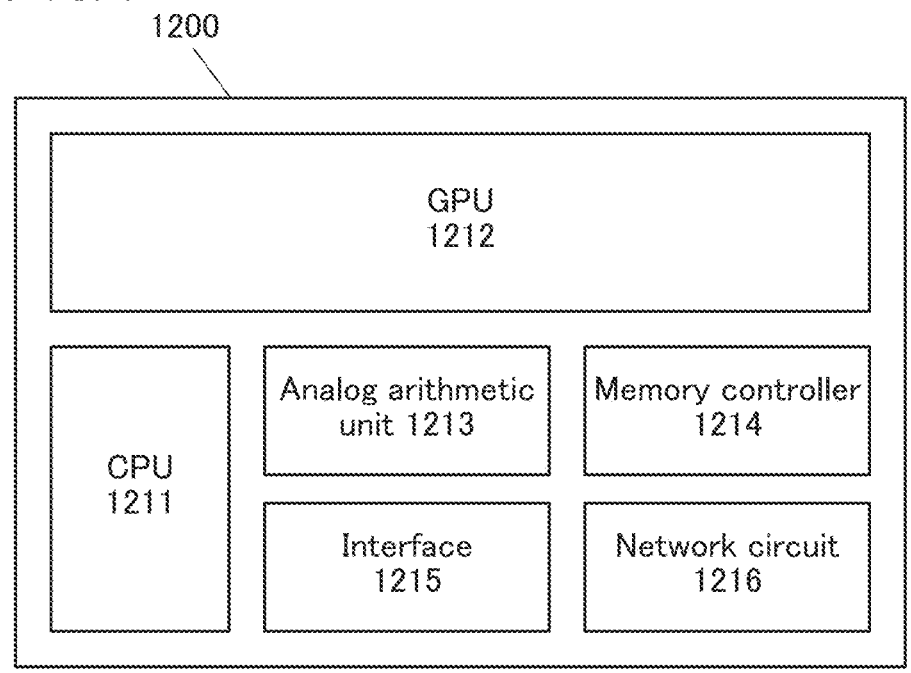
[FIGS. 18A and 18B] Schematic views of a semiconductor device according to one embodiment of the present invention.

As illustrated in FIG. 18(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 18B:
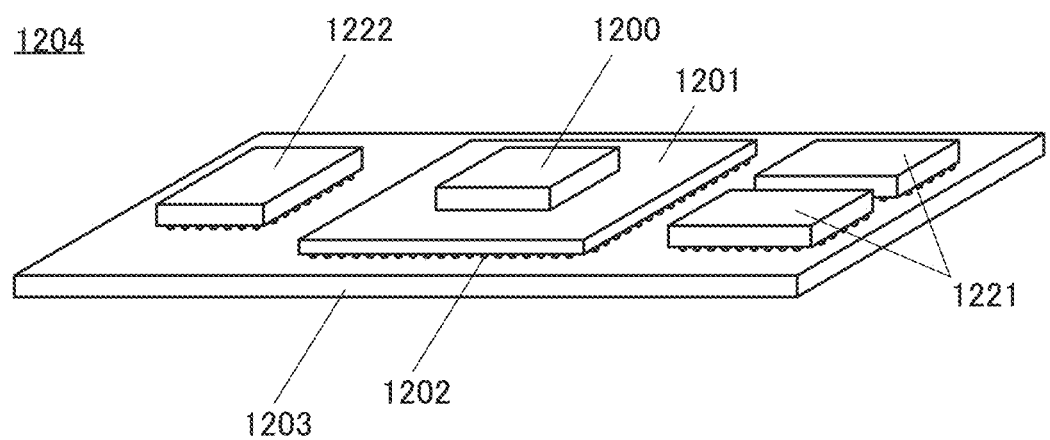

A bump (not illustrated) is provided on the chip 1200, and as illustrated in FIG. 18(B), the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Memory devices such as DRAMs 1221 and a flash memory 1222 may be provided over the motherboard 1203.

For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can execute arithmetic operation in a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

The structure described in this embodiment can be used in appropriate combination with the structures described in the other embodiments and the example.

Embodiment 6

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 19 schematically illustrates some structure examples of removable memory devices. The semiconductor device described in the above embodiment is processed into a packaged memory chip and used in a variety of storage devices and removable memories, for example.

FIG. 19(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

FIG. 19(B) is an external schematic diagram of an SD card, and FIG. 19(C) is a schematic diagram illustrating the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113, in which case data can be read from and written in the memory chip 1114 by radio communication between a host device and the SD card 1110. The semiconductor device described in the above embodiment can be incorporated in the memory chip 1114 or the like on the substrate 1113.

FIG. 19(D) is an external schematic diagram of an SSD, and FIG. 19(E) is a schematic diagram illustrating the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

The structure described in this embodiment can be implemented in appropriate combination with the structures described in the other embodiments, the example, and the like.

Embodiment 7

The semiconductor device according to one embodiment of the present invention can be used for a chip or a processor such as a CPU or a GPU. FIG. 20 illustrates specific examples of electronic devices including processors such as CPUs and GPUs, or chips of one embodiment of the present invention.

<Electronic Device and System>

The GPU or the chip according to one embodiment of the present invention can be mounted on a variety of electronic devices. Examples of electronic devices include a digital camera, a digital video camera, a digital photo frame, a cellular phone, a portable game machine, a portable information terminal, and an audio reproducing device in addition to electronic devices provided with comparatively large screens, such as a television device, a desktop or laptop personal computer, a monitor for a computer or the like, digital signage, and a large game machine like a pachinko machine. In addition, when an integrated circuit or a chip according to one embodiment of the present invention is provided in the electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 20 illustrates examples of electronic devices.

[Mobile Phone]

FIG. 20A illustrates a mobile phone (smartphone) which is a type of an information terminal. An information terminal 5500 includes a housing 5510 and a display portion 5511. As input interfaces, a touch panel is provided in the display portion 5511 and a button is provided in the housing 5510.

When the chip of one embodiment of the present invention is applied to the information terminal 5500, the information terminal 5500 can execute an application utilizing artificial intelligence. Examples of the application utilizing artificial intelligence include an application for recognizing a conversation and displaying the content of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal]

FIG. 20(B) illustrates a desktop information terminal 5300. The desktop information terminal 5300 includes a main body 5301 of the information terminal, a display 5302, and a keyboard 5303.

Like the information terminal 5500 described above, when the chip of one embodiment of the present invention is applied to the desktop information terminal 5300, the desktop information terminal 5300 can execute an application utilizing artificial intelligence. Examples of the application utilizing artificial intelligence include design-support software, text correction software, and software for automatic menu generation. Furthermore, with use of the desktop information terminal 5300, novel artificial intelligence can be developed.

Note that in the above description, as examples of the electronic devices, a smartphone and a desktop information terminal are shown in FIGS. 20(A) and 20(B), respectively; however, the electronic devices can be information terminals other than a smartphone and a desktop information terminal. Examples of an information terminal other than the smartphone and the desktop information terminal include a PDA (Personal Digital Assistant), a notebook information terminal, and a workstation.

[Household appliance]

FIG. 20(C) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 20(D) illustrates a portable game machine 5200 as an example of a game machine. A portable game machine 5200 includes a housing 5201, a display portion 5202, a button 5203, and the like.

When the GPU or the chip of one embodiment of the present invention is applied to the portable game machine 5200, the portable game machine 5200 with low power consumption can be achieved. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5200, the portable game machine 5200 including artificial intelligence can be achieved.

In general, the progress of a game, the actions and words of game characters, and expressions of a phenomenon and the like occurring in the game are determined by the program in the game; however, the use of artificial intelligence in the portable game machine 5200 enables expressions not limited by the game program. For example, it becomes possible to change expressions such as questions posed by the player, the progress of the game, time, and actions and words of game characters.

In addition, when a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 20(D), the game machine using the GPU or the chip of one embodiment of the present invention is not limited thereto. Examples of the game machine to which the GPU or the chip of one embodiment of the present invention is applied include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be applied to an automobile, which is a moving vehicle, and the periphery of a driver's seat in the automobile.

FIG. 20(E1) illustrates an automobile 5700, which is an example of a moving vehicle, and FIG. 20(E2) is a diagram illustrating the surroundings of a windshield inside the automobile. FIG. 20(E2) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile 5700. That is, displaying an image taken by the imaging device provided outside the automobile 5700 leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile 5700, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Broadcasting System]

The GPU or the chip of one embodiment of the present invention can be applied to a broadcasting system.

FIG. 20(F) schematically illustrates data transmission in a broadcasting system. Specifically, FIG. 20(F) illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 20(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 20(F) and may be satellite broadcasting using an artificial satellite, data broadcasting using an optical line, or the like.

The broadcasting system may be a broadcasting system utilizing artificial intelligence by applying the chip of one embodiment of the present invention. When broadcast data is transmitted from the broadcast station 5680 to the TV 5600 of each household, the broadcast data is compressed by an encoder. When the antenna 5650 receives the compressed broadcast data, the compressed broadcast data is decompressed by a decoder of the receiving device included in the TV 5600. With use of artificial intelligence, for example, a display pattern included in an image to be displayed can be recognized in motion compensation prediction, which is one of the compression methods for the encoder. In addition, in-frame prediction or the like can also be performed utilizing artificial intelligence. Furthermore, for example, when broadcast data with low resolution is received and the broadcast data is displayed on the TV 5600 with high resolution, image interpolation processing such as upconversion can be performed in the broadcast data decompression by the decoder.

The broadcasting system utilizing artificial intelligence is suitable for ultra-high definition television (UHDTV: 4K, 8K) broadcasting, which needs a larger amount of broadcast data.

In addition, as an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, the application examples of artificial intelligence, their effects, and the like described in this embodiment can be combined as appropriate with the description of another electronic device.

The structure described in this embodiment can be implemented in appropriate combination with the structures described in the other embodiments, the example, and the like.

EXAMPLE 1

In this example, steps including the step after removing the dummy gate 262 to the step of forming the conductor 242 were observed in cross sections with an electron microscope. Note that the steps subjected to cross-sectional observation correspond to the steps shown in FIG. 7 to FIG. 10 described in Embodiment 1. The cross-sectional observation was performed with a scanning transmission electron microscope (STEM). As an apparatus for the observation, HD-2700 manufactured by Hitachi High-Technologies Corporation was used. FIG. 21 and FIG. 22 show results of the cross-sectional observation.

A fabrication method for samples used in the observation will be described below. A tungsten film with a thickness of 150 nm was deposited by a sputtering method over a silicon substrate provided with an insulator. Next, the tungsten film was processed by a lithography method to form a first conductor containing tungsten (W in the drawing) which functions as a back gate. A first silicon oxynitride film with a thickness of 350 nm was deposited by a plasma CVD method to cover the first conductor. Next, the first silicon oxynitride film was removed by polishing until a surface of the first conductor was exposed. A CMP method was used for the polishing treatment. By the polishing treatment, an insulator containing silicon oxynitride can be formed on a side surface of the first conductor.

Next, over the first conductor and the insulator containing silicon oxynitride, a first aluminum oxide film (1st AlOx in the drawing) with a thickness of 10 nm was deposited by an ALD method, and a second silicon oxynitride film (2nd SiON in the drawing) with a thickness of 35 nm was deposited by a plasma CVD method. In this step, planarization treatment was performed on the second silicon oxynitride film. In the planarization treatment, polishing treatment by a CMP method was performed, and the thickness of the second silicon oxynitride film after the polishing treatment was approximately 30 nm.

Next, over the second silicon oxynitride film, a first oxide (OS1 in the drawing) with a thickness of 5 nm was deposited by a sputtering method using a target with In:Ga:Zn=1:3:4 [atomic ratio], and thereover, a second oxide (OS2 in the drawing) with a thickness of 20 nm was deposited by a sputtering method using a target with In:Ga:Zn=4:2:4.1 [atomic ratio]. Next, a first tantalum nitride film with a thickness of 20 nm was deposited by a sputtering method over the oxides. Subsequently, the first tantalum nitride film was processed by a lithography method so that at least a region to be a channel formation region of the second oxide is exposed. Next, a second tantalum nitride film with a thickness of 5 nm (TaN2 in the drawing) was deposited by a sputtering method to cover the exposed second oxide and the first tantalum nitride film. Through the above steps, a structure body corresponding to that illustrated in FIG. 3 can be obtained.

Next, the second tantalum nitride film, the first tantalum nitride film, the second oxide, and the first oxide were processed into an island shape by a lithography method. By this process, a structure body corresponding to that illustrated in FIG. 4 can be obtained. In addition, this process gives the formation of a second conductor containing tantalum nitride through the processing of the first tantalum nitride. Note that the process allows part of the second silicon oxynitride film to be etched. Moreover, in some cases, the second silicon oxynitride film may be etched until the first aluminum oxide film is exposed.

Next, a dummy gate is formed. A resin containing carbon material was used for the dummy gate. Next, a second aluminum oxide film (2nd AlOx in the drawing) with a thickness of 1 nm was deposited by an ALD method, and a third aluminum oxide film (3rd AlOx in the drawing) with a thickness of 8 nm was deposited by a sputtering method to cover the dummy gate, the second tantalum nitride film, the first tantalum nitride film, the second oxide, and the first oxide. Through the above steps, a structure body corresponding to that illustrated in FIG. 5 can be obtained.

Next, a third silicon oxynitride film (3rd SiON in the drawing) with a thickness of 400 nm was deposited by a CVD method to cover the third aluminum oxide film. Next, part of the third silicon oxynitride film, part of the third aluminum oxide film, and part of the second oxide film were removed by polishing treatment so as to expose the dummy gate. The polishing treatment was performed by a CMP method. Through the above steps, a structure body corresponding to that illustrated in FIG. 6 can be obtained.

Next, the dummy gate is removed, and then, an opening is formed over the second tantalum nitride film. The second tantalum nitride film is exposed at a bottom surface of the opening, and the second aluminum oxide film is exposed on the side surface. The dummy gate was removed by a dry etching method using a gas containing oxygen. Next, to cover the bottom surface and the side surface of the opening, a hafnium oxide film (HfOx in the drawing) with a thickness of 1 nm wad deposited by an ALD method over the third silicon oxynitride film, and thereover, a fourth aluminum oxide film (4th AlOx in the drawing) with a thickness of 13 nm was deposited by an ALD method. Through the above steps, a structure body corresponding to that illustrated in FIG. 7 can be obtained.

Figure 21A:
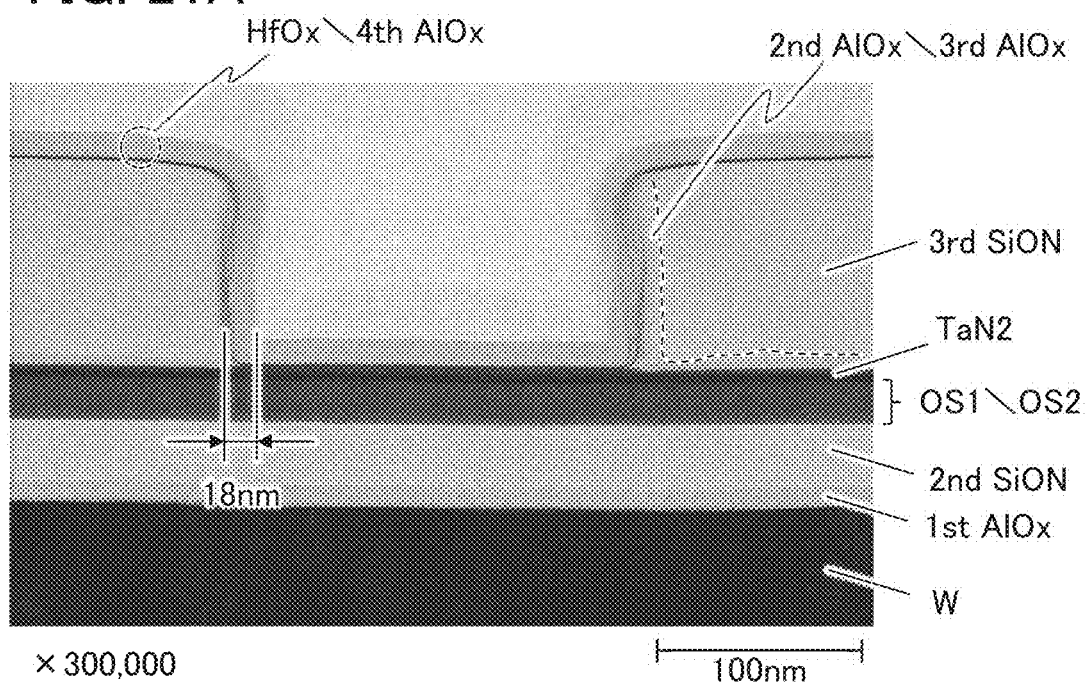
[FIGS. 21A and 21B] Diagrams illustrating Example of the present invention.

FIG. 21(A) shows a cross-sectional STEM image after the fourth aluminum oxide film was formed. As shown in FIG. 21(A), the thickness from a side wall of the second aluminum oxide to a side wall of the fourth aluminum oxide at the side surface of the opening was approximately 18 nm.

Next, anisotropic etching was performed on the fourth aluminum oxide film and the hafnium oxide film. Dry etching was used for the anisotropic etching. As the dry etching, a gas containing $C_4F_6$, $CHF_3$, and Ar was used. By the anisotropic etching, the fourth aluminum oxide film and the hafnium oxide film over the third silicon oxynitride film and the second tantalum nitride film were partly removed. Furthermore, it was found that a by-product was attached onto the side wall of the fourth aluminum oxide film through the anisotropic etching; the by-product contains a component included in the aluminum oxide film and a component included in the gas used for the dry etching. This by-product is conceivably formed in such a manner that a substance generated by a reaction of the aluminum oxide film and a gas used for dry etching was vaporized, attached to the side wall of the fourth aluminum oxide film, and then deposited.

By the formation of this by-product, the fourth aluminum oxide film and the hafnium oxide film remain not only on the side wall of the second tantalum nitride film but also over the second tantalum nitride, thereby having a L shape. Through the above steps, a structure body corresponding to that illustrated in FIG. 8 can be obtained.

Figure 21B:
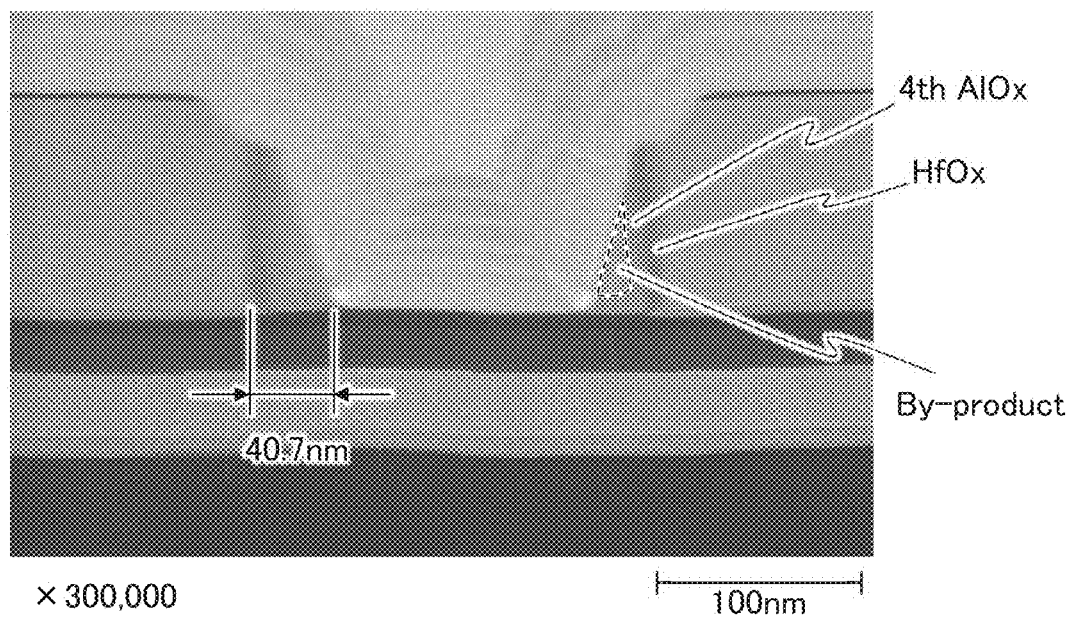

FIG. 21(B) shows a cross-sectional STEM image after the anisotropic etching. As shown in FIG. 21(B), the L-shaped hafnium oxide film, the L-shaped fourth aluminum oxide film, and the by-product are left in the opening. In addition, at the side surface of the opening, the width of a structure body composed of the hafnium oxide, the fourth aluminum oxide, and the by-product, which remain at the side wall of the second aluminum oxide, was approximately 40.7 nm.

Next, the second tantalum nitride film was processed using the structure body composed of the hafnium oxide film, the fourth aluminum oxide film, and the by-product as a mask. The processing of the second tantalum nitride film was performed by a dry etching method. Furthermore, as the dry etching, a first step for removing a natural oxide film (an oxide containing tantalum, such as tantalum oxynitride, tantalum oxide, or the like) formed on a surface of the second tantalum nitride film and a second step for removing the tantalum nitride film were successively performed in the same chamber. The first step used a gas containing $BCl_3$, and the second step used a gas containing $Cl_2$ and Ar. Note that in the case where the natural oxide film is not formed or the case where the natural oxide film can be removed only with the second step, the first step is not necessarily performed. Through the above steps, a structure body corresponding to that illustrated in FIG. 9 can be obtained. Moreover, by the processing of the second tantalum nitride film, a third conductor containing tantalum nitride is formed to cover the second conductor.

Figure 22A:
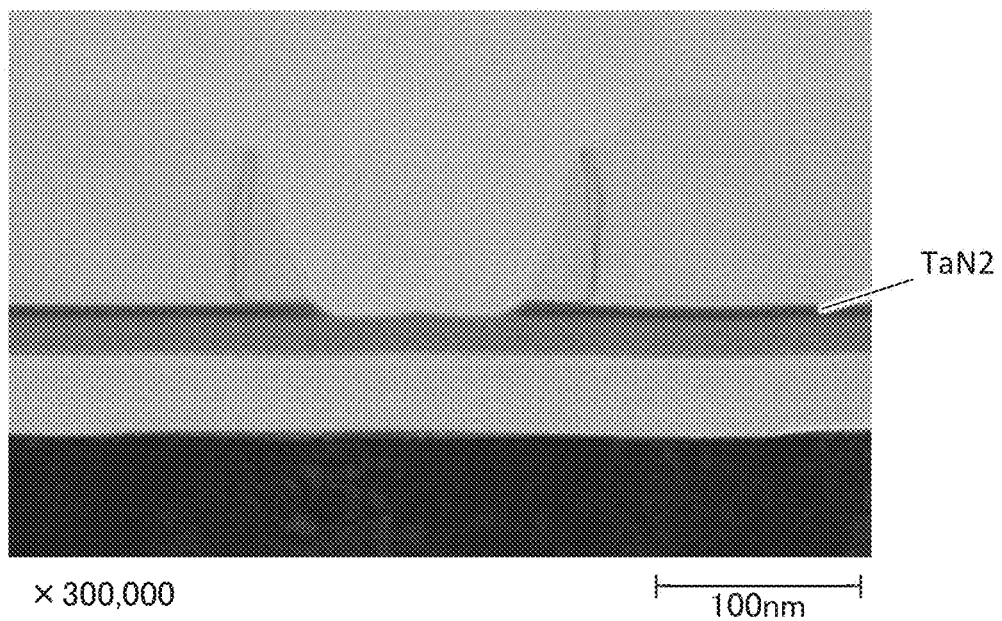
[FIGS. 22A and 22B] Diagrams illustrating Example of the present invention.

FIG. 22(A) shows a cross-sectional STEM image after the anisotropic etching.

Next, the by-product and the fourth aluminum oxide film are removed. To remove the by-product and the fourth aluminum oxide film, a wet etching method was used. An alkaline solution was used for the wet etching treatment. By the wet etching a structure body corresponding to that illustrated in FIG. 10 can be obtained. Moreover, part of the second oxide was also removed by the wet etching.

Figure 22B:
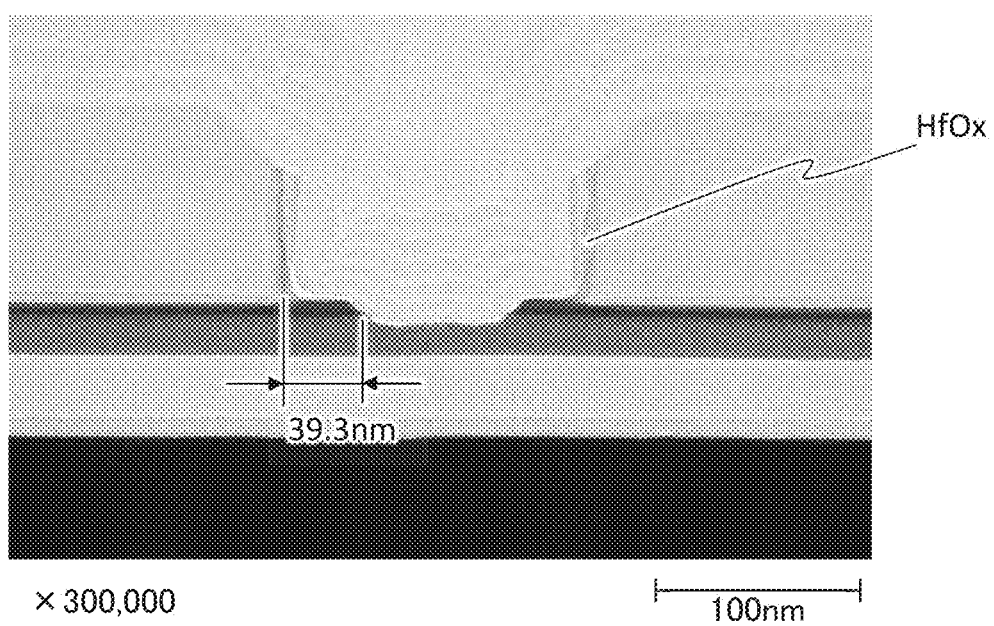

FIG. 22(B) shows a cross-sectional STEM image after the wet etching. As shown in FIG. 22(B), the L-shaped hafnium oxide film is left in the opening. In addition, the third conductor was formed in the opening, and the width of a portion of the third conductor, which does not overlap with the third silicon oxynitride film and protrudes into the opening, was approximately 39.3 nm.

Through the above steps, the third conductor protruding into the opening can be formed. With use of the method described in this example, the width of a portion of the third conductor protruding into the opening can be made larger than the total of the thickness of the hafnium oxide and the thickness of the fourth aluminum oxide, and a time required for formation of the hafnium oxide film and the fourth aluminum oxide film (deposition time) can be shortened.

REFERENCE NUMERALS

200: transistor, 205: conductor, 210: insulator, 212: insulator, 214: insulator, 216: insulator, 218: conductor, 222: insulator, 224: insulator, 230: oxide, 230*a*: oxide, 230*a*1: oxide, 230*a*2: oxide, 230A: oxide film, 230*b*: oxide, 230B: oxide film, 230*c*: oxide, 230*c*1: oxide, 230*c*2: oxide, 230C: oxide film, 240: conductor, 240*a*: conductor, 240*b*: conductor, 241: insulator, 241*a*: insulator, 241*b*: insulator, 242: conductor, 242*a*: conductor, 242A: conductive film, 242*b*: conductor, 242B: conductor layer, 243:conductor, 243*a*: conductor, 243A: conductor layer, 243*b*: conductor, 244: insulator, 244A: insulating film, 246: conductor, 250: insulator, 250A: insulating film, 254: insulator, 254A: insulating film, 260: conductor, 260*a*: conductor, 260Aa: conductive film, 260Ab: conductive film, 260*b*: conductor, 262: dummy gate, 262A: dummy gate layer, 263: opening, 265: dummy layer, 265A: dummy film, 266: insulator, 266A: insulating film, 267: by-product, 274: insulator, 276: insulator, 280: insulator, 281: insulator

The invention claimed is:

1. A semiconductor device comprising:
   a first oxide;
   a first conductor and a second conductor that are positioned to be separated from each other over the first oxide;
   a third conductor that is positioned to be in contact with a top surface and a side surface of the first conductor and a top surface of the first oxide;
   a fourth conductor that is positioned to be in contact with a top surface and a side surface of the second conductor and the top surface of the first oxide;
   a first insulator that is positioned over the third conductor and the fourth conductor and has an opening overlapping with a region between the third conductor and the fourth conductor;
   a fifth conductor positioned in the opening;
   a second oxide that is positioned between the fifth conductor and the first oxide, between the fifth conductor and the third conductor, between the fifth conductor and the fourth conductor, and between the fifth conductor and the first insulator;
   a second insulator positioned between the second oxide and the fifth conductor; and
   a third insulator that is positioned between the second oxide and the third conductor, between the second oxide and the fourth conductor, and between the second oxide and the first insulator and does not overlap with the first oxide in the region sandwiched between the third conductor and the fourth conductor,
   wherein the third conductor and the fourth conductor each comprises a region overlapping with the fifth conductor.

2. The semiconductor device according to claim 1, further comprising:
   a fourth insulator that is positioned between the first insulator and the first oxide, between the first insulator and the first conductor, between the first insulator and the second conductor, between the first insulator and the third conductor, between the first insulator and the fourth conductor, and between the first insulator and the third insulator,
   wherein the fourth insulator has lower oxygen-transmitting properties than the first insulator.

3. The semiconductor device according to claim 1,
   wherein the fifth conductor is positioned to face a side surface of the first oxide, and
   wherein the second oxide and the second insulator are positioned between the fifth conductor and the side surface of the first oxide.

4. The semiconductor device according to claim 1,
   wherein the third conductor has a smaller thickness than the first conductor, and
   wherein the fourth conductor has a smaller thickness than the second conductor.

5. The semiconductor device according to claim 1,
   wherein in the first oxide, a region that does not overlap with the third conductor or the fourth conductor has a smaller thickness than a region that overlaps with the third conductor or the fourth conductor.

6. The semiconductor device according to claim 1,
   wherein the first oxide comprises In, an element M(M is Al, Ga, Y, or Sn), and Zn.

7. The semiconductor device according to claim 6,
   wherein the second oxide comprises an element M(M is Al, Ga, Y, or Sn) and Zn.

8. The semiconductor device according to claim 6,
   wherein the second oxide comprises In, an element M(M is Al, Ga, Y, or Sn), and Zn, and
   wherein an atomic ratio of In to the element M in the second oxide is lower than an atomic ratio of In to the element M in the first oxide.

9. The semiconductor device according to claim 6,
   wherein the second oxide comprises a first layer and a second layer over the first layer,
   wherein the first layer has substantially a same composition as the second oxide, and
   wherein the second layer comprises a region with lower In concentration than the second oxide.

10. A method for manufacturing a semiconductor device, comprising:
    forming a first insulating film, a second insulating film, a first oxide film, a second oxide film, and a first conductive film in this order over a substrate;
    removing a part of the first conductive film to form a first conductor;
    forming a second conductive film over the second oxide film and the first conductor;
    processing the first oxide film, the second oxide film, the first conductor, and the second conductive film into an island shape to form a first oxide, a second oxide over the first oxide, a second conductor and a third conductor over the second oxide, and a fourth conductor over the second oxide, the second conductor, and the third conductor;
    forming a dummy gate layer that is positioned between the second conductor and the third conductor and is over the fourth conductor;
    forming a third insulating film to cover the first oxide, the second oxide, the second conductor, the third conductor, the fourth conductor, and the dummy gate layer;
    forming a fourth insulating film over the third insulating film;
    removing a part of the third insulating film and a part of the fourth insulating film until an upper part of the dummy gate layer is exposed;
    removing the dummy gate layer to form an opening;
    forming a fifth insulating film over the third insulating film, the fourth insulating film, and the fourth conductor;
    forming a dummy film over the fifth insulating film;
    removing a part of the fifth insulating film and a part of the dummy film by anisotropic etching using an etching gas containing fluorine and carbon, thereby forming a first insulator in contact with a top surface of the fourth conductor and a side surface of the third insulating film, forming a dummy layer over the first insulator, and depositing a by-product over the dummy layer;
    removing a part of the fourth conductor using the first insulator, the dummy layer, and the by-product as a mask to form a fifth conductor and a sixth conductor;
    removing the dummy layer and the by-product by wet etching;
    forming a third oxide film, a sixth insulating film, and a third conductive film in this order to be embedded in the opening; and
    removing a part of the third oxide film, a part of the sixth insulating film, and a part of the third conductive film until an upper part of the third insulating film is exposed.

11. The method for manufacturing a semiconductor device according to claim 10,
wherein the fifth insulating film is an oxide that is deposited by an ALD method and contains hafnium.

12. The method for manufacturing a semiconductor device according to claim 10,
wherein the dummy film is an oxide that is deposited by an ALD method and contains aluminum.

13. The method for manufacturing a semiconductor device according to claim 12,
wherein the by-product contains aluminum, fluorine, and carbon.

14. The method for manufacturing a semiconductor device according to claim 10,
wherein an upper part of a region in the second oxide sandwiched between the fifth conductor and the sixth conductor is removed by the wet etching.

15. The method for manufacturing a semiconductor device according to claim 10,
wherein the first insulating film, the second insulating film, the first oxide film, the second oxide film, and the first conductive film are formed without exposure to air with use of a multi-chamber deposition apparatus.

* * * * *